United States Patent
Katayama et al.

(10) Patent No.: US 9,251,898 B2
(45) Date of Patent: Feb. 2, 2016

(54) METHOD FOR PROGRAMMING NONVOLATILE MEMORY ELEMENT, METHOD FOR INITIALIZING NONVOLATILE MEMORY ELEMENT, AND NONVOLATILE MEMORY DEVICE

(75) Inventors: Koji Katayama, Nara (JP); Takeshi Takagi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 171 days.

(21) Appl. No.: 13/983,855

(22) PCT Filed: Feb. 7, 2012

(86) PCT No.: PCT/JP2012/000809
§ 371 (c)(1),
(2), (4) Date: Aug. 6, 2013

(87) PCT Pub. No.: WO2012/108185
PCT Pub. Date: Aug. 16, 2012

(65) Prior Publication Data
US 2013/0314975 A1    Nov. 28, 2013

(30) Foreign Application Priority Data
Feb. 10, 2011    (JP) .................................. 2011-027704

(51) Int. Cl.
*G11C 13/00*    (2006.01)
*H01L 27/10*    (2006.01)
(Continued)

(52) U.S. Cl.
CPC .......... *G11C 13/0069* (2013.01); *G11C 13/004* (2013.01); *G11C 13/0007* (2013.01);
(Continued)

(58) Field of Classification Search
CPC .......... G11C 13/0007; G11C 2213/71; G11C 13/0069; G11C 13/004; G11C 2213/72; H01L 45/1233; H01L 45/04; H01L 27/2481; H01L 45/146; H01L 27/2409; H01L 27/101
USPC .................................... 365/148; 257/4, 14, 2
See application file for complete search history.

(56) References Cited

U.S. PATENT DOCUMENTS 7,602,042 B2    10/2009  Ahn et al.
7,894,239 B2    2/2011   Tamai et al.
(Continued)

FOREIGN PATENT DOCUMENTS

JP    2006-140489    6/2006
JP    2006-203098    8/2006
(Continued)

OTHER PUBLICATIONS

International Search Report issued Mar. 6, 2012 in International Application No. PCT/JP2012/000809.

*Primary Examiner* — Vanthu Nguyen
*Assistant Examiner* — Jerome Leboeuf
(74) *Attorney, Agent, or Firm* — Wenderoth, Lind & Ponack, L.L.P.

(57) ABSTRACT

A method for programming a nonvolatile memory element includes: decreasing a resistance value of a variable resistance element in an initial state, by applying an initialization voltage pulse to a series circuit in which a load resistor having a first resistance value is connected in series with the variable resistance element and a MSM diode; applying, after the decreasing, a write voltage pulse to the series circuit after the resistance value of the variable resistance element is changed to a second resistance value lower than the first resistance value; and applying, after the decreasing, an erase voltage pulse to the series circuit after the resistance value of the variable resistance element is changed to a third resistance value lower than the first resistance value.

17 Claims, 35 Drawing Sheets

(51) Int. Cl.
*H01L 27/102* (2006.01)
*H01L 49/02* (2006.01)
*H01L 45/00* (2006.01)
*H01L 27/24* (2006.01)
*G11C 29/50* (2006.01)

(52) U.S. Cl.
CPC ........ *G11C29/50008* (2013.01); *H01L 27/101* (2013.01); *H01L 27/1021* (2013.01); *H01L 27/2409* (2013.01); *H01L 27/2418* (2013.01); *H01L 28/20* (2013.01); *H01L 45/1233* (2013.01); *H01L 45/146* (2013.01); *G11C 2013/0045* (2013.01); *G11C 2013/0083* (2013.01); *G11C 2213/72* (2013.01)

(56) References Cited

U.S. PATENT DOCUMENTS

| | | | |
|---|---|---|---|
| 7,935,953 | B2 | 5/2011 | Ahn et al. |
| 8,125,817 | B2 | 2/2012 | Takagi et al. |
| 8,345,465 | B2 | 1/2013 | Muraoka et al. |
| 8,445,885 | B2 | 5/2013 | Kanzawa et al. |
| 8,565,004 | B2 * | 10/2013 | Iijima et al. ................ 365/148 |
| 2006/0098472 | A1 | 5/2006 | Ahn et al. |
| 2008/0121865 | A1 | 5/2008 | Ahn et al. |
| 2008/0123393 | A1 | 5/2008 | Kinoshita |
| 2009/0052225 | A1 | 2/2009 | Morimoto |
| 2009/0147558 | A1 | 6/2009 | Tamai et al. |
| 2010/0271860 | A1 | 10/2010 | Muraoka et al. |
| 2010/0321982 | A1 | 12/2010 | Takagi et al. |
| 2011/0110144 | A1 * | 5/2011 | Kawai et al. ................ 365/148 |
| 2011/0128776 | A1 * | 6/2011 | Katoh et al. ................ 365/148 |
| 2011/0233510 | A1 | 9/2011 | Kanzawa et al. |
| 2012/0069632 | A1 * | 3/2012 | Hayakawa et al. .......... 365/148 |
| 2012/0170353 | A1 * | 7/2012 | Iijima et al. ................ 365/148 |
| 2012/0292589 | A1 * | 11/2012 | Yoneda et al. .................. 257/4 |
| 2013/0010530 | A1 * | 1/2013 | Katayama et al. ........... 365/148 |

FOREIGN PATENT DOCUMENTS

| | | |
|---|---|---|
| JP | 2008-210441 | 9/2008 |
| JP | 2009-21524 | 1/2009 |
| JP | 2009-141225 | 6/2009 |
| JP | 2010-21381 | 1/2010 |
| JP | 2011-9344 | 1/2011 |
| WO | 2006/137111 | 12/2006 |
| WO | 2010/038442 | 4/2010 |
| WO | 2010/064410 | 6/2010 |
| WO | 2010/070895 | 6/2010 |

* cited by examiner

Pt / HfOx [400 °C]

Pt / HfOx [100 °C]

Pt: 8 nm [TiAlN / Pt]

Pt: 13 nm [TiAlN / Pt]

Pt: 23 nm [TiAlN / Pt]

Ir (50 nm) / TaOx / TaN [400 °C]

No Rx    VRx ≈ 0 mV

Rx = 100 Ω    VRx = 70 mV

Rx = 200 Ω    VRx = 380 mV (a)  (b)

(a)  (b)

METHOD FOR PROGRAMMING NONVOLATILE MEMORY ELEMENT, METHOD FOR INITIALIZING NONVOLATILE MEMORY ELEMENT, AND NONVOLATILE MEMORY DEVICE

TECHNICAL FIELD

The present invention relates to a method for programming a nonvolatile memory element including a bidirectional diode having bidirectional rectifying characteristics with respect to an applied voltage, a method for initializing the nonvolatile memory element, and a nonvolatile memory device that performs the methods.

BACKGROUND ART

In recent years, with the advancement of digital technology, portable digital apparatuses such as small and flat digital AV players and digital cameras have been developed to provide higher functionality. A demand for large-capacity and high-speed nonvolatile memory devices used as memory devices in these apparatuses is increasing more and more. To meet such a demand, nonvolatile memory devices using a variable resistance element or a ferroelectric capacitor, a type of nonvolatile memory element, have attracted attention.

Variable resistance elements are classified into a write-once type and a rewritable type. The rewritable variable resistance elements are further classified into two types. One of the two types is variable resistance elements having characteristics of changing from a high resistance state to a low resistance state and vice versa with two driving voltages having the same polarity. These variable resistance elements are generally referred to as unipolar (or monopolar) variable resistance elements. The other of the two types is variable resistance elements having characteristics of changing from a high resistance state to a low resistance state and vice versa with two programming voltages having different polarities. These variable resistance elements are generally referred to as bipolar variable resistance element.

In a nonvolatile memory device having variable resistance elements arranged in an array, current steering elements such as transistors and rectifying devices are generally connected in series with the variable resistance elements. With this, write disturb caused by bypass current in the array, cross talk between memory cells adjacent to each other, and so on are prevented, and more reliable memory operation is performed.

The unipolar variable resistance elements are capable of controlling a resistance change operation with two different programming voltages having the same polarity. For this reason, a unidirectional diode which uses only the nonlinear voltage-current characteristics in one of polarities of a voltage can be used for a diode as a current steering element. Thus, there is a possibility of simplifying a structure of a memory cell including a variable resistance element and a current steering element. However, because a reset operation to change the variable resistance element to a high resistance state requires an electric pulse having a wide pulse width, the unipolar variable resistance elements operate slowly.

In contrast, the bipolar variable resistance elements are capable for controlling resistance change with two programming voltages having different polarities. For this reason, a bidirectional diode which uses nonlinear voltage-current characteristics in the both polarities of the voltages is required for a diode as a current steering element. However, because both the reset operation to change a variable resistance element to a high resistance state and a set operation to change the variable resistance element to a low resistance state can be performed using an electric pulse having a narrow pulse width, the bipolar variable resistance elements are capable of operating fast.

The cross point nonvolatile memory devices as described in Patent Literatures (PTLs) 1 and 2 have been proposed so far.

The nonvolatile memory device described in PTL 1 includes memory cells in each of which a unidirectional diode is connected as a current steering element in series with a variable resistance element. Here, the unidirectional diode is a PN junction diode or a Schottky diode, for instance.

The nonvolatile memory device described in PTL 2 includes memory cells in each of which a bidirectional diode is connected as a current steering element in series with a variable resistance element.

For example, a metal-insulator-metal (MIM) diode, a metal-semiconductor-metal (MSM) diode, and a varistor as described in PTL 2 are known as the bidirectional diode.

FIG. 27 is a graph showing voltage-current characteristics of a commonly-known bidirectional diode. Such voltage-current characteristics are observed in the bidirectional diode such as the MIM diode, the MSM diode, and the varistor.

In these bidirectional diodes, by optimizing electrode materials and materials interposed between electrodes, it is possible to make the voltage-current characteristics substantially symmetrical with respect to a polarity of an applied voltage. In other words, it is possible to achieve characteristics that a change of current relative to a positive applied voltage and a change of current relative to a negative applied voltage are made substantially symmetrical about the origin 0.

Moreover, as shown in FIG. 27, electrical resistance of the bidirectional diode is very high when the applied voltage is less than or equal to the first critical voltage $V_{th1}$ and more than or equal to the second critical voltage $V_{th2}$ (range C in FIG. 27), and the electrical resistance of the same rapidly decreases when the applied voltage exceeds the first critical voltage $V_{th1}$ or falls below the second critical voltage $V_{th2}$ (ranges A and B in FIG. 27).

By combining bidirectional diodes having such voltage-current characteristics and bipolar memory elements, that is, using the bidirectional diodes as the current steering elements, it is possible to achieve a cross point nonvolatile memory device using bipolar variable resistance elements.

CITATION LIST

Patent Literature

[PTL 1] Japanese Unexamined Patent Application Publication No. 2006-140489
[PTL 2] Japanese Unexamined Patent Application Publication No. 2006-203098
[PTL 3] International Publication No. 2010/064410

SUMMARY OF INVENTION

Technical Problem

It has been desired to further enhance reproducibility of electrical characteristics and reliability of operation in a conventional variable resistance element. After a great deal of consideration to solve such a problem, the inventors have newly found that in a nonvolatile element including a variable resistance element requiring an initialization step, a bidirectional diode has a risk of being broken during the initialization step.

The present invention is conceived to solve the problem and has an object to provide a method for programming a nonvolatile memory element which reduces a risk that a current steering element is broken when a variable resistance element is initialized, a method for initializing the nonvolatile memory element, and a nonvolatile memory device.

Solution to Problem

In order to solve the above problem, a method for programming a nonvolatile memory element according to an aspect of the present invention is a method for programming a nonvolatile memory element which includes a variable resistance element that is nonvolatile and a bidirectional diode that is connected in series with the variable resistance element, wherein the nonvolatile memory element further includes a load resistor which is connected in series with the variable resistance element and whose resistance value can be changed, and the variable resistance element includes: a first transition metal oxide layer comprising a first transition metal; and a second transition metal oxide layer comprising a second transition metal and having a lower degree of oxygen deficiency than the first transition metal oxide layer, the method including: decreasing a resistance value of the variable resistance element to be lower than a resistance value of the variable resistance element in an initial state, by applying an initialization voltage pulse to a series circuit in which the variable resistance element, the bidirectional diode, and the load resistor are connected in series, the resistance value of the variable resistance element in the initial state being higher than a resistance value of the variable resistance element in a high resistance state, and the load resistor having a first resistance value; causing, after the decreasing, the variable resistance element to change from the high resistance state to a low resistance state in which a resistance value of the variable resistance element is lower than the resistance value of the variable resistance element in the high resistance state, by applying a write voltage pulse to the series circuit after a resistance value of the load resistor is changed to a second resistance value lower than the first resistance value, the write voltage pulse having a first polarity; and causing, after the decreasing, the variable resistance element to change from the low resistance state to the high resistance state by applying an erase voltage pulse to the series circuit after a resistance value of the load resistor is changed to a third resistance value lower than the first resistance value, the erase voltage pulse having a second polarity opposite to the first polarity.

Moreover, a nonvolatile memory device according to another aspect of the present invention is a nonvolatile memory device including a nonvolatile memory element which includes a variable resistance element that is nonvolatile and a bidirectional diode that is connected in series with the variable resistance element, the nonvolatile memory device further including: a load resistor which is connected in series with the variable resistance element and whose resistance value can be changed; and a driving unit, wherein the variable resistance element includes: a first transition metal oxide layer comprising a first transition metal; and a second transition metal oxide layer comprising a second transition metal and having a lower degree of oxygen deficiency than the first transition metal oxide layer, the driving unit is configured to perform the following steps of: decreasing a resistance value of the variable resistance element to be lower than a resistance value of the variable resistance element in an initial state, by applying an initialization voltage pulse to a series circuit in which the variable resistance element, the bidirectional diode, and the load resistor are connected in series, the resistance value of the variable resistance element in the initial state being higher than a resistance value of the variable resistance element in a high resistance state, and the load resistor having a first resistance value; causing, after the decreasing, the variable resistance element to change from the high resistance state to a low resistance state in which a resistance value of the variable resistance element is lower than the resistance value of the variable resistance element in the high resistance state, by applying a write voltage pulse to the series circuit after a resistance value of the load resistor is changed to a second resistance value lower than the first resistance value, the write voltage pulse having a first polarity; and causing, after the decreasing, the variable resistance element to change from the low resistance state to the high resistance state by applying an erase voltage pulse to the series circuit after a resistance value of the load resistor is changed to a third resistance value lower than the first resistance value, the erase voltage pulse having a second polarity opposite to the first polarity.

Furthermore, an initialization method according to a further aspect of the present invention is a method for initializing a nonvolatile memory element which allows, for the nonvolatile memory element including a variable resistance element that is nonvolatile and a bidirectional diode that is connected in series with the variable resistance element, the variable resistance element to reversibly change between a high resistance state and a low resistance state in which a resistance value of the variable resistance element is lower than a resistance value of the variable resistance element in the high resistance state, the variable resistance element being in an initial state in which a resistance value of the variable resistance element is higher than the resistance value of the variable resistance element in the high resistance state, wherein the variable resistance element includes: a first transition metal oxide layer comprising a first transition metal; and a second transition metal oxide layer comprising a second transition metal and having a lower degree of oxygen deficiency than the first transition metal oxide layer, the method including: connecting a load resistor in series with the variable resistance element in the initial state and the bidirectional diode; decreasing a resistance value of the variable resistance element to be lower than the resistance value of the variable resistance element in the initial state by applying an initialization voltage pulse to a series circuit in which the bidirectional diode, the variable resistance element, and the load resistor are connected in series; and removing the load resistor from the bidirectional diode and the variable resistance element after the decreasing.

Advantageous Effects of Invention

The present invention is capable of providing a method for programming a nonvolatile memory element which reduces a risk that a current steering element is broken when a variable resistance element is initialized, a method for initializing the nonvolatile memory element, and a nonvolatile memory device.

DESCRIPTION OF EMBODIMENTS

Figure 1A:
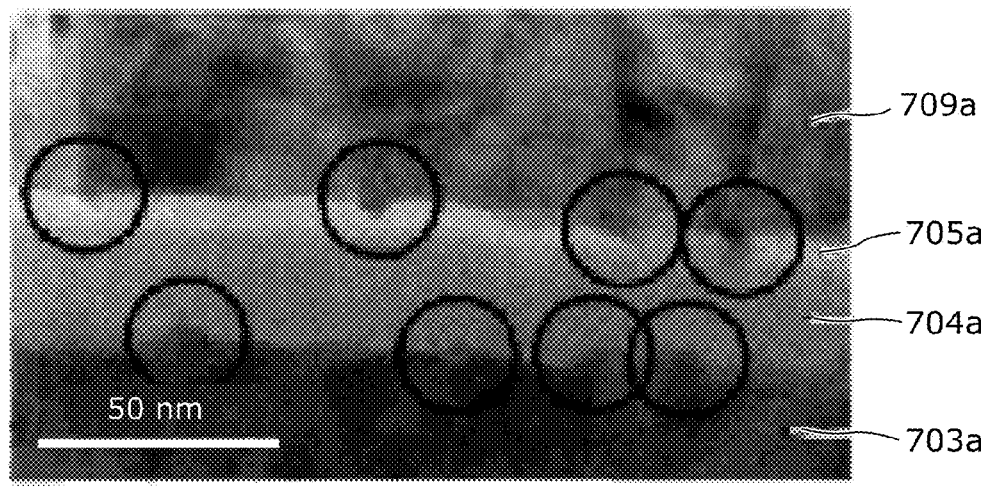
FIG. 1A is a transmission electron microscope (TEM) photograph showing, as basic data of the present invention, a cross-section of a variable resistance element whose variable resistance layer comprises an oxygen-deficient tantalum oxide.

It cannot be said that reproducibility of electrical characteristics (especially an initial resistance value) and reliability (durability) of operation in a conventional variable resistance element are not yet sufficient for practical purposes. For this reason, it has been desired to further enhance reproducibility of electrical characteristics and reliability of operation in a variable resistance element. To solve such a problem, the inventors have proposed a suitable structure of a variable resistance element in a relevant patent application. The variable resistance element having the proposed structure is described in detail later.

However, it has been found that although the variable resistance element makes it possible to enhance reproducibility of electrical characteristics and reliability of operation, a new problem occurs in an initialization step of the variable resistance element.

Many variable resistance elements including the variable resistance element having the proposed structure has, in the initial state, a resistance value (hereinafter, referred to as an initial resistance value) higher than a range of resistance values used for a normal resistance change operation. Here, the initial state is a state where a high voltage pulse that causes a variable resistance layer to change a resistance state has never been applied after manufacturing processing including a heating process is completed. When being in the initial state, the variable resistance elements do not cause the normal resistance change operation. A process of initializing a variable resistance element, that is, a process of decreasing a resistance value of the variable resistance element from an initial resistance value to a range of resistance values that allow the normal resistance change operation is conventionally performed as an initialization step.

This initialization step is performed by applying, to the variable resistance element, a voltage or current higher than a driving voltage or a driving current applied to the variable resistance element so as to cause the normal resistance change operation.

In a cross point nonvolatile memory device, when a voltage for initializing a variable resistance element is applied to a memory cell, the voltage is divided into voltages corresponding to respective resistance values of a variable resistance element and a bidirectional diode included in the memory cell, and the divided voltages are respectively applied to the variable resistance element and the bidirectional diode included in the memory cell.

Though the details are described below, the variable resistance element modified by the proposed structure has a significantly higher initial resistance value than a variable resistance element without such a modification does. For this reason, to pass an amount of current required for initialization, it is necessary to apply an initialization voltage higher than a voltage applied to the conventional variable resistance element to the variable resistance element having the proposed structure.

This means that a risk that the bidirectional diode is broken is increased because the divided voltage of the applied initialization voltage exceeds the rating of the bidirectional diode in the variable resistance element having the proposed structure.

As a result of making a study for reducing the risk that the current steering element is broken when the variable resistance element is initialized, the inventors have conceived a method for programming a nonvolatile memory element and a nonvolatile memory device according to embodiments of the present invention, which are described below.

The following describes the method for programming a nonvolatile memory element and the nonvolatile memory device according to the embodiments of the present invention. Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

A method for programming a nonvolatile memory element according to an aspect of the present invention is a method for programming a nonvolatile memory element which includes a variable resistance element that is nonvolatile and a bidirectional diode that is connected in series with the variable resistance element, wherein the nonvolatile memory element further includes a load resistor which is connected in series with the variable resistance element and whose resistance value can be changed, and the variable resistance element includes: a first transition metal oxide layer comprising a first transition metal; and a second transition metal oxide layer comprising a second transition metal and having a lower degree of oxygen deficiency than the first transition metal oxide layer, the method including: decreasing a resistance value of the variable resistance element to be lower than a resistance value of the variable resistance element in an initial state, by applying an initialization voltage pulse to a series circuit in which the variable resistance element, the bidirectional diode, and the load resistor are connected in series, the resistance value of the variable resistance element in the initial state being higher than a resistance value of the variable resistance element in a high resistance state, and the load resistor having a first resistance value; causing, after the decreasing, the variable resistance element to change from the high resistance state to a low resistance state in which a resistance value of the variable resistance element is lower than the resistance value of the variable resistance element in the high resistance state, by applying a write voltage pulse to the series circuit after a resistance value of the load resistor is changed to a second resistance value lower than the first resistance value, the write voltage pulse having a first polarity; and causing, after the decreasing, the variable resistance element to change from the low resistance state to the high resistance state by applying an erase voltage pulse to the series circuit after a resistance value of the load resistor is changed to a third resistance value lower than the first resistance value, the erase voltage pulse having a second polarity opposite to the first polarity.

With such a method, it is possible to increase, at least in the decreasing, a breakdown current more than in an electric steering element including only a bidirectional diode, thereby reducing a risk that a current steering element is broken.

Moreover, in a nonvolatile memory element to which the method is applied, an interface between an electrode and a variable resistance layer is substantially flat. In other words, the electrode has no projections or protruding irregularities detrimental to reproducibility of electrical characteristics and reliability of operation. Thus, it is possible to increase the reproducibility of the electrical characteristics and the reliability of the operation of the nonvolatile memory element.

In contrast, although it is necessary to use a voltage pulse whose absolute value is high in the decreasing because an initial resistance value of a variable resistance element becomes high, even in such a case, it is possible to increase, at least in the decreasing, the breakdown current more than in a case of using only the bidirectional diode, by connecting a load resistor in series with the bidirectional diode. As above, the method for programming a nonvolatile memory element according to the aspect of the present invention makes it possible to reduce the risk that the current steering element is broken when the variable resistance element is initialized.

Furthermore, with such a method, it is possible to decrease the resistance value of the load resistor in the causing of the variable resistance element to change from the high resistance state and the causing of the variable resistance element to change from the low resistance state. As a result, the method makes it possible to achieve a suitable operation in each of the decreasing, the causing of the variable resistance element to change from the high resistance state, and the causing of the variable resistance element to change from the low resistance state.

Moreover, the bidirectional diode may be a metal-semiconductor-metal (MSM) diode.

With this, it is possible to increase reproducibility of electrical characteristics, reliability of operation, and operating characteristics of the bidirectional diode.

Moreover, the MSM diode may include: a first electrode and a second electrode; and a semiconductor layer which comprises silicon nitride having a composition expressed as $SiN_z$ where $0<z\leq0.7$, is disposed between the first electrode and the second electrode, and forms a Schottky junction with each of the first electrode and the second electrode.

With this, the bidirectional diode shows satisfactory bidirectional rectifying characteristics.

Moreover, when a voltage is applied to both ends of a current steering element to pass a current, a breakdown current of the current steering element may have a current density of 700 $\mu A/\mu m^2$ or more, the current steering element including series connection of the load resistor and the bidirectional diode.

Moreover, when a voltage is applied to both ends of a current steering element to pass a current, the divided voltage applied to the load resistor may be 70 mV or higher, the current steering element including series connection of the load resistor and the bidirectional diode.

Moreover, the load resistor may be 100Ω or more.

Moreover, the first transition metal oxide layer may comprise a tantalum oxide having a composition expressed as $TaO_x$ where $0.8\leq x\leq 1.9$, and the second transition metal oxide layer may comprise a tantalum oxide having a composition expressed as $TaO_y$ where $2.1\leq y$.

With this, the variable resistance element shows a satisfactory resistance change operation.

Moreover, the first transition metal comprised in the first transition metal oxide layer may have a higher standard electrode potential than the second transition metal comprised in the second transition metal oxide layer.

Moreover, the first transition metal and the second transition metal may be different transition metals.

Moreover, the load resistor may be provided for each of a plurality of the nonvolatile memory elements arranged in a matrix.

With this, the load resistor can be placed very near the bidirectional diode. As a result, it is possible to further reduce the risk that the bidirectional diode is broken.

Moreover, the load resistor may be provided for each row or column of a plurality of the nonvolatile memory elements arranged in a matrix.

With this, nonvolatile memory elements are allowed to share the load resistor. Thus, it is possible to reduce an increase in area of a nonvolatile memory device including the nonvolatile memory element, by using the load resistor.

It is to be noted that the present invention can be realized not only as such a method for programming a nonvolatile memory element but also as a nonvolatile memory device which includes, as units, the characteristic steps included in the method.

Furthermore, the present invention can be realized as a semiconductor integrated circuit (LSI) implementing part or all of functions of such a nonvolatile memory device.

Moreover, a nonvolatile memory device according to another aspect of the present invention is a nonvolatile memory device including a nonvolatile memory element which includes a variable resistance element that is nonvolatile and a bidirectional diode that is connected in series with the variable resistance element, the nonvolatile memory device further including: a load resistor which is connected in series with the variable resistance element and whose resistance value can be changed; and a driving unit, wherein the variable resistance element includes: a first transition metal oxide layer comprising a first transition metal; and a second transition metal oxide layer comprising a second transition metal and having a lower degree of oxygen deficiency than the first transition metal oxide layer, the driving unit is configured to perform the following steps of: decreasing a resistance value of the variable resistance element to be lower than a resistance value of the variable resistance element in an initial state, by applying an initialization voltage pulse to a series circuit in which the variable resistance element, the bidirectional diode, and the load resistor are connected in series, the resistance value of the variable resistance element in the initial state being higher than a resistance value of the variable resistance element in a high resistance state, and the load resistor having a first resistance value; causing, after the decreasing, the variable resistance element to change from the high resistance state to a low resistance state in which a resistance value of the variable resistance element is lower than the resistance value of the variable resistance element in the high resistance state, by applying a write voltage pulse to the series circuit after a resistance value of the load resistor is changed to a second resistance value lower than the first resistance value, the write voltage pulse having a first polarity; and causing, after the decreasing, the variable resistance element to change from the low resistance state to the high resistance state by applying an erase voltage pulse to the series circuit after a resistance value of the load resistor is changed to a third resistance value lower than the first resistance value, the erase voltage pulse having a second polarity opposite to the first polarity.

With such a structure, it is possible to increase, at least in the decreasing, a breakdown current more than in an electric steering element including only a bidirectional diode, thereby reducing a risk that a current steering element is broken.

Furthermore, with the structure, it is possible to decrease the resistance value of the load resistor in the causing of the variable resistance element to change from the high resistance state and the causing of the variable resistance element to change from the low resistance state. As a result, the nonvolatile memory device makes it possible to achieve a suitable operation in each of the decreasing, the causing of the variable resistance element to change from the high resistance state, and the causing of the variable resistance element to change from the low resistance state.

Furthermore, an initialization method according to a further aspect of the present invention is a method for initializing a nonvolatile memory element which allows, for the nonvolatile memory element including a variable resistance element that is nonvolatile and a bidirectional diode that is connected in series with the variable resistance element, the variable resistance element to reversibly change between a high resistance state and a low resistance state in which a resistance value of the variable resistance element is lower than a resistance value of the variable resistance element in the high resistance state, the variable resistance element being in an initial state in which a resistance value of the variable resistance element is higher than the resistance value of the variable resistance element in the high resistance state, wherein the variable resistance element includes: a first transition metal oxide layer comprising a first transition metal; and a second transition metal oxide layer comprising a second transition metal and having a lower degree of oxygen deficiency than the first transition metal oxide layer, the method including: connecting a load resistor in series with the variable resistance element in the initial state and the bidirectional diode; decreasing a resistance value of the variable resistance element to be lower than the resistance value of the variable resistance element in the initial state by applying an initialization voltage pulse to a series circuit in which the bidirectional diode, the variable resistance element, and the load resistor are connected in series; and removing the load resistor from the bidirectional diode and the variable resistance element after the decreasing.

With such a method, it is possible to increase, at least in the decreasing, a breakdown current more than in an electric steering element including only a bidirectional diode, thereby reducing a risk that a current steering element is broken.

Furthermore, with such a method, it is possible to decrease the resistance value of the load resistor in causing of the variable resistance element to change from the high resistance state and causing of the variable resistance element to change from the low resistance state after the decreasing. As a result, a nonvolatile memory element initialized by the method makes it possible to achieve a more suitable operation in the causing of the variable resistance element to change from the high resistance state and the causing of the variable resistance element to change from the low resistance state after the decreasing.

The following describes in detail a method for programming a nonvolatile memory element and a nonvolatile memory device according to respective embodiments of the present invention, using specific examples.

First, as preparation, an exemplary nonvolatile memory element to which the method for programming according to the embodiment of the present invention is applied is described in detail, and subsequently the method for programming and the nonvolatile memory device according to the respective embodiments of the present invention are sequentially described.

1. Basic Data Related to Embodiments

The following describes, as basic data related to embodiments, an exemplary structure of a variable resistance element used for a nonvolatile memory element in the embodiments, and advantageous effects of the same.

Briefly speaking, the variable resistance element includes a variable resistance layer comprising an oxygen-deficient oxide of transition metal and interposed between two electrodes. At least one of the two electrodes comprises Pt (platinum). Here, the oxygen-deficient oxide is referred to an oxide having a greater atomic ratio (hereinafter, simply referred to as a degree of oxygen deficiency) that is a ratio of deficient oxygen atoms to a total number of oxygen atoms than an oxide having a stoichiometric composition does. In an example of a tantalum oxide, the tantalum oxide $Ta_2O_5$ having a stoichiometric composition includes the number of oxygen atoms that is 2.5 times greater than the number of tantalum atoms. A tantalum oxide having a higher degree of oxygen deficiency than the tantalum oxide expressed as $Ta_2O_5$, that is, a tantalum oxide which has a nonstoichiometric composition and satisfies $0 \leq x \leq 2.5$ when the tantalum oxide is expressed as TaO$_x$ is referred to as an oxygen-deficient tantalum oxide. For example, the stoichiometric composition of the tantalum oxide is expressed as Ta$_2$O$_5$, and in this case, the degree of oxygen deficiency of the tantalum oxide is 0%. When the oxygen-deficient tantalum oxide is defined as TaO$_x$, a degree of oxygen deficiency is calculated as (2.5−1.5)/2.5=40% in the case of a tantalum oxide having x=1.5. The variable resistance layer may include transition metal oxide layers of two types having different degrees of oxygen deficiency. In addition, the transition metal oxide layers of the two types having the different degrees of oxygen deficiency may comprise the same transition metal or different transition metals.

The inventors have verified that the variable resistance element thus structured is capable of enhancing reproducibility of electrical characteristics and reliability of operation, and have described in detail the structure and the advantageous effects of the variable resistance element in PTL 3, a relevant patent application.

Hereinafter, for the sake of description, the principal part of PTL 3 is excerpted. It is to be noted that the terms in the original text are changed as necessary for consistency.

Moreover, after filing the patent application relating to PTL 3, the inventors have verified through additional experiments that a variable resistance element including an electrode formed of a thin film of Ir (iridium) instead of Pt is also capable of enhancing the reproducibility of the electrical characteristics and the reliability of the operation. The following also reports the result of the experiments.

1.1 Limiting Factor for Enhancing Characteristics of Variable Resistance Element The inventors have prepared a variable resistance element under various conditions, to study reproducibility of electrical characteristics and reliability of operation of the variable resistance element, and have verified characteristics of the variable resistance element.

Figure 1B:
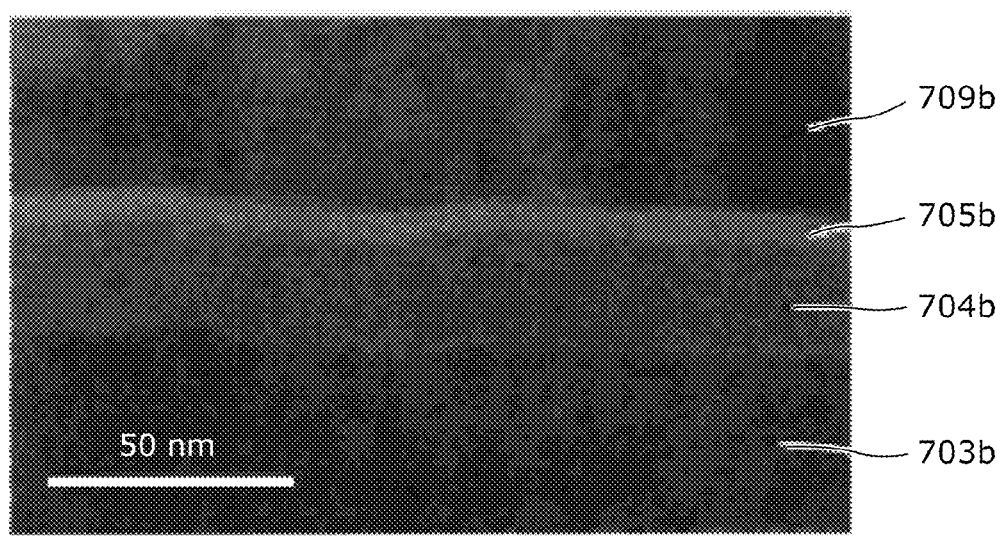
FIG. 1B is a TEM photograph showing, as basic data of the present invention, a cross-section of the variable resistance element whose variable resistance layer comprises the oxygen-deficient tantalum oxide.

Each of FIG. 1A and FIG. 1B is a transmission electron microscope (TEM) photograph showing a cross-section of a variable resistance element whose variable resistance layer comprises an oxygen-deficient tantalum oxide. FIG. 1A shows a case where the highest temperature during processing is 400° C. FIG. 1B shows a case where the highest temperature during processing is 100° C.

The element shown in FIG. 1A is formed by stacking a first tantalum oxide layer 704a, a second oxide layer 705a, and an upper electrode 709a in this order above a lower electrode 703a, the first tantalum oxide layer 704a having a thickness of approximately 23 nm and being oxygen-deficient, the second tantalum oxide layer 705a having a thickness of approximately 8 nm, the upper electrode 709a including a Pt layer having a thickness of approximately 80 nm, and the lower electrode 703a including a Pt layer having a thickness of approximately 50 nm. In this embodiment, the second tantalum oxide layer 705a is oxygen-deficient. The degree of oxygen deficiency of the second tantalum oxide layer 705a is set lower than that of the first tantalum oxide layer 704a. It is to be noted that in regard to the stack structure of these tantalum oxide layers, as long as at least the first tantalum oxide layer 704a is oxygen-deficient, the second tantalum oxide layer 705a may be oxygen-deficient or not.

The element shown in FIG. 1A is formed using process technology related to manufacturing of semiconductor device. The highest temperature in a heating process during processing is approximately 400° C. Here, 400° C. is a temperature for a sintering process, a thermal process required for forming an electrode line including, for instance, copper or aluminum.

It is to be noted that a thickness of each layer is measured based on the TEM photograph.

As is clear from closely examining FIG. 1A, when heating at 400° C. is performed, small projections (parts enclosed by circles in the photograph) including Pt are formed from the lower electrode 703a toward the first tantalum oxide layer 704a in an upper direction of the photograph and from the upper electrode 709a toward the second tantalum oxide layer 705a in a lower direction of the photograph. Most of the projections extend from near grain boundaries of Pt comprised in the upper electrode 709a and the lower electrode 703a. Attention is particularly focused on that the projections extending from the upper electrode 709a reach almost half of the thickness of the second tantalum oxide layer 705a.

Although a method of forming an element shown in FIG. 1B is the same as a method of forming the element shown in FIG. 1A, the highest temperature in a heating process during processing is kept to approximately 100° C. As shown in FIG. 1B, projections extending from the lower electrode 703b toward the first tantalum oxide layer 704b and projections extending from the upper electrode 709b toward the second tantalum oxide layer 705b are not formed at all.

When initial resistance values (a resistance value between the upper electrode 709a and the lower electrode 703a and a resistance value between the upper electrode 709b and the lower electrode 703b immediately after sample preparation processing including the heating process is completed) of respective elements are measured, the initial resistance values are approximately $10^2 \Omega$ in a sample (with the Pt projections) shown in FIG. 1A, and approximately $10^8 \Omega$ in a sample (without the Pt projections) shown in FIG. 1B. In other words, when the projections are formed, the initial value is reduced by six digits.

As will be described later, the second tantalum oxide layers 705a and 705b are provided to adjust an initial resistance value of a variable resistance element, and play an extremely significant role in causing the variable resistance element to perform a resistance change operation stably. The presence of the projections as shown in FIG. 1A in the electrodes makes it impossible to obtain an initial resistance value as designed. To put it another way, the thickness of the second tantalum oxide layer 705a in the projections is substantially reduced, and thus an overall resistance value is reduced in comparison to a case where the projections are not present in the electrodes.

If reproducibility is high although projections are formed in electrodes, it is possible to design a resistance value in consideration of a contribution of the projections. However, it is difficult to control a projection formation density, a projection size, and so on actually with high reproducibility. For this reason, the formation of the projections reduces reproducibility of electrical characteristics of the variable resistance element.

Moreover, when a voltage is applied between the upper electrode 709a and the lower electrode 703a in a state as shown in FIG. 1A, electric fields and currents concentrate in the projections. In such a state, when a voltage is applied repeatedly, there is a possibility that the first tantalum oxide layer 704a or the second tantalum oxide layer 705a is broken around the projections. Consequently, the upper electrode 709a and the lower electrode 703a are short-circuited, and there is a possibility that resistance change does not occur. Stated differently, the projections are likely to reduce reliability (durability) of the variable resistance element.

Conversely, reduction in the formation of the projections reduces a variation in initial resistance value, and thus it is possible to stabilize the electrical characteristics of the variable resistance element. However, the reduction in the formation of the projections requires a voltage higher than a voltage used for normal resistance change, at a time of the initialization step, and thus is likely to break a current steering element.

From the above, if the formation of the projections extending from the electrodes toward the oxygen-deficient tantalum oxide layers is reduced, it is expected that the reproducibility of the electrical characteristics and the reliability of operation of the element be enhanced.

The following proposal is made for a projection formation mechanism. In other words, change of the Pt layers in the heating process of the sample preparation processing is considered as one of factors. If Pt atoms migrate when the Pt layers are heated to a high temperature, projections may be formed. It is considered that the projections grew from grain boundaries of the Pt layers because the migration is likely to occur along the grain boundaries of the Pt layers.

The inventors have further verified whether or not the similar problem is caused when, instead of Ta (tantalum), Hf (hafnium) is used as a transition metal comprised in a variable resistance layer.

Figure 2A:
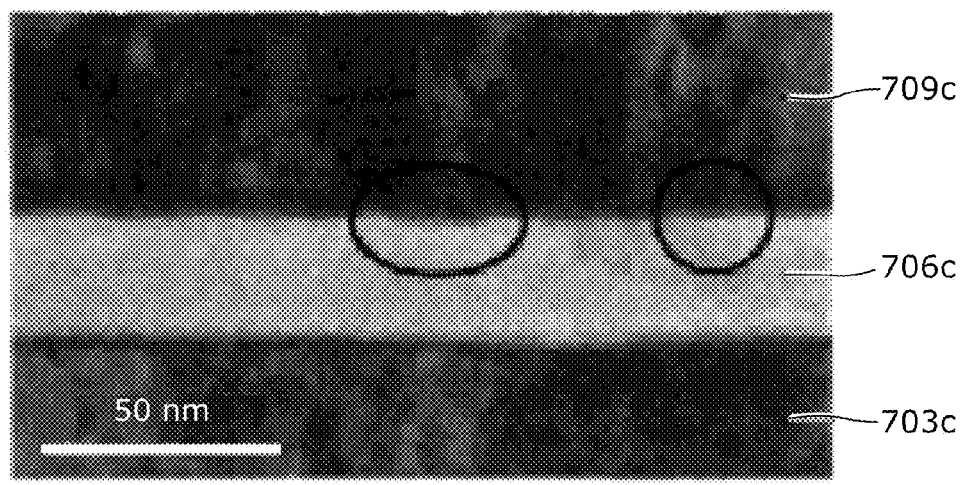
FIG. 2A is a TEM photograph showing, as basic data of the present invention, a cross-section of a variable resistance element whose variable resistance layer comprises an oxygen-deficient hafnium oxide.
Figure 2B:
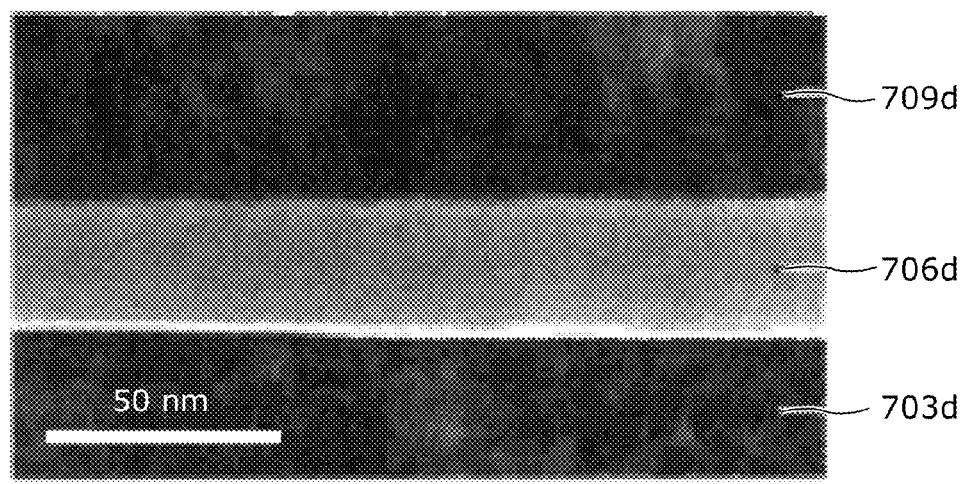
FIG. 2B is a TEM photograph showing, as basic data of the present invention, a cross-section of the variable resistance element whose variable resistance layer comprises the oxygen-deficient hafnium oxide.

Each of FIG. 2A and FIG. 2B is a TEM photograph showing a cross-section of a variable resistance element whose variable resistance layer comprises an oxygen-deficient Hf oxide. FIG. 2A shows a case where the highest temperature during processing is 400° C., and FIG. 2B shows a case where the highest temperature during processing is 100° C.

The element shown in FIG. 2A is formed by stacking, above a lower electrode 703c, an oxygen-deficient hafnium oxide layer 706c and an upper electrode 709c in this order, the lower electrode 703c having a thickness of approximately 150 nm and comprising W (tungsten), the oxygen-deficient hafnium oxide layer 706c having a thickness of approximately 30 nm, and the upper electrode 709c having a thickness of approximately 75 nm and comprising R. The element shown in FIG. 2A is also formed using the process technology related to the manufacturing of semiconductor device. The highest temperature in a heating process during processing is 400° C.

As is clear from closely examining FIG. 2A, when heating at 400° C. is performed, wide projections (parts enclosed by circles in the photograph) including R are formed from the upper electrode 709c toward the oxygen-deficient tantalum oxide layer 706c in a lower direction of the photograph.

In contrast, the element shown in FIG. 2B is formed by stacking, above a lower electrode 703d, an oxygen-deficient hafnium oxide layer 706d and an upper electrode 709d in this order, the lower electrode 703d including a W layer having a thickness of approximately 150 nm, the oxygen-deficient hafnium oxide layer 706d having a thickness of approximately 30 nm, and the upper electrode 709d including a R layer having a thickness of approximately 75 nm. The highest temperature in a heating process during processing is kept to approximately 100° C. for the element shown in FIG. 2B. As shown in FIG. 2B, projections including R are not formed in the upper electrode 709d of the element for which the highest temperature during the processing is kept to approximately 100° C.

From the above results, it is considered that in the variable resistance element including, as structural elements, the R layer having a great thickness as the electrode and the oxygen-deficient transition metal oxide layer, the Pt projections are likely to be formed when exposed to a high temperature regardless of a type of the transition metal.

Moreover, although the electrode comprising Pt alone is described in the above example, it is speculated that even when a material having Pt as a main component (an alloy material still having strong Pt characteristics) is used, the similar projections would be formed. In other words, when Pt is used as the electrode material of the variable resistance element, enhancing the reproducibility of electrical characteristics (especially, the initial resistance value) and the reliability (durability) of operation is thought to become a problem.

Here, if the heating process is omitted at the time of forming an element, it is expected that the formation of the projections can be controlled. However, a heating process using approximately several hundred degrees Celsius is absolutely essential to a common semiconductor process, and it is unrealistic to set, to approximately 100° C., the upper limit of a heating temperature during an element manufacturing process.

1.2 Variable Resistance Element in which Electrode Includes Pt Thin Film

As a result of making an additional study based on the underlying knowledge, the inventors have found that reducing a thickness of an electrode comprising Pt makes it possible to control the formation of projections. The following describes results of an experiment for verifying the finding.

Figure 3A:
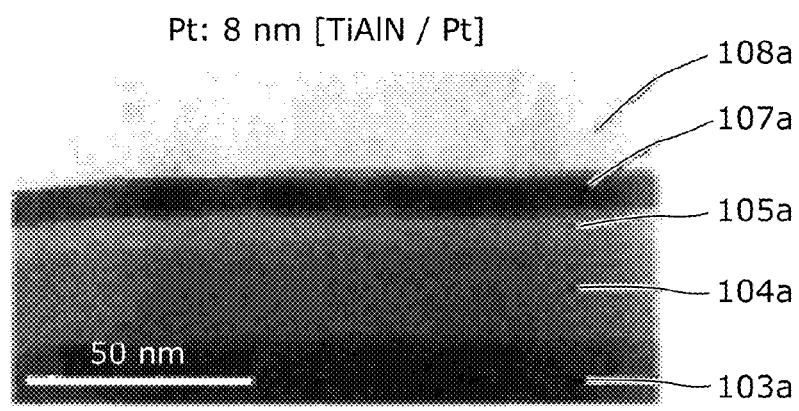
FIG. 3A is a TEM photograph showing, as basic data of the present invention, a cross-section of a variable resistance element whose electrode comprises platinum.
Figure 3B:
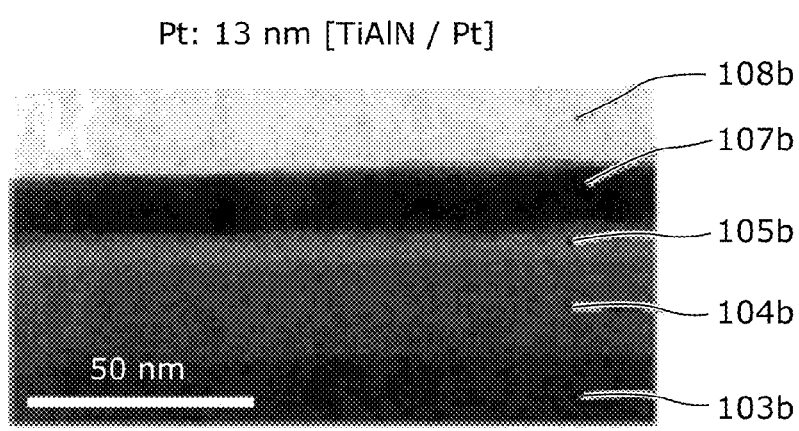
FIG. 3B is a TEM photograph showing, as basic data of the present invention, a cross-section of the variable resistance element whose electrode comprises platinum.
Figure 3C:
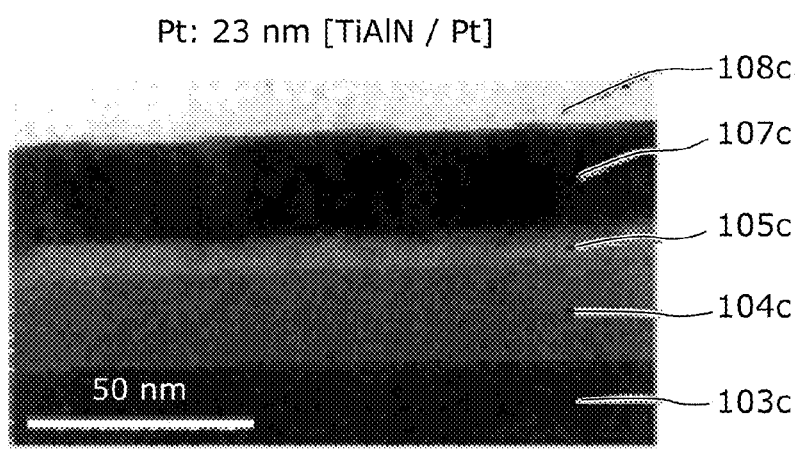
FIG. 3C is a TEM photograph showing, as basic data of the present invention, a cross-section of the variable resistance element whose electrode comprises platinum.

Each of FIG. 3A, FIG. 3B, and FIG. 3C is a TEM photograph showing a cross-section of a variable resistance element formed in this experiment. FIG. 3A, FIG. 3B, and FIG. 3C show cross-sections of an element A, an element B, and an element C, respectively. The element A, the element B, and the element C are respectively formed by stacking, above substrates, lower electrodes 103a, 103b, and 103c comprising TaN (tantalum nitride), first tantalum oxide layers 104a, 104b, and 104c which are oxygen-deficient, second tantalum oxide layers 105a, 105b, and 105c, upper electrodes 107a, 107b, and 107c comprising Pt, and conductor layers 108a, 108b, and 108c comprising TiAlN (titanium aluminum nitride) in this order.

Except for a difference that the element A includes the upper electrode 107a having a thickness of 8 nm, the element B includes the upper electrode 107b having a thickness of 13 nm, and the element c includes the upper electrode 107c having a thickness of 23 nm, each of the elements is formed through the same manufacturing process and has the same structure. The manufacturing process of such a variable resistance element is described using the element A as a representative.

First, the substrate comprising monocrystalline silicon is processed by the thermal oxidation method, to form an oxide layer (with a thickness of 200 nm) above the substrate (not shown). The lower electrode 103a (with a thickness of 40 nm) comprising TaN is formed above the oxide layer, using the sputtering method.

An oxygen-deficient tantalum oxide layer (with a thickness of 30 nm) is formed above the formed lower electrode 103a, using the sputtering method. A method for sputtering Ta targets in argon-oxygen mixed gas atmosphere can be employed as the sputtering method. More specifically, a degree of vacuum (a back pressure) in a sputtering apparatus before start of sputtering is approximately $7 \times 10^{-4}$ Pa, power at a time of sputtering is 250 W, a total gas pressure obtained by summing up pressures of an argon gas and an oxygen gas is 3.3 Pa, a partial pressure ratio of the oxygen gas is 3.8%, a set temperature of the substrate is 30° C., and a deposition time is seven minutes.

The surface of the formed oxygen-deficient tantalum oxide layer is oxidized using a plasma oxidation apparatus. With this, the first tantalum oxide layer 104a which is oxygen-deficient (with a thickness of approximately 23 nm) and the second tantalum oxide layer 105a which is oxygen-deficient (with a thickness of approximately 8 nm) are formed from the homogenous oxygen-deficient tantalum oxide layer.

The first tantalum oxide layer 104a thus formed has a composition expressed as, for instance, $TaO_{1.38}$ (approximately 45 atm % as a degree of oxygen deficiency). Moreover, the second tantalum oxide layer 105a has a composition expressed as, for example, $TaO_{2.47}$ (approximately 1 atm % as a degree of oxygen deficiency). As PTL 3 describes in detail a method for determining thicknesses and compositions of these layers, a description thereof is omitted.

After the oxidation treatment, a Pt layer as the upper electrode 107a is formed above the second tantalum oxide layer 105a, using the sputtering method. The Pt layer has a thickness ranging from 1 to 10 nm, for instance. A suitable film thickness range of the Pt layer is described later. After the upper electrode 107a is formed, the conductor layer 108a comprising TiAlN (with a thickness of 80 nm) is formed above the upper electrode 107a, using the sputtering method. The element A is formed as above. The element B and the element C are formed using the similar manufacturing process.

It is to be noted that each element is heated at 400° C. for 10 minutes in a sintering process.

As is clear from closely examining FIG. 3A, FIG. 3B, and FIG. 3C, no projections are formed from the upper electrode 107a (the Pt layer with the thickness of 8 nm) in the element A. Irregularities having a size of approximately 2 nm are formed in the upper electrode 107b (the Pt layer with the thickness of 13 nm) in the element B, and it is clear that the projections are beginning to be formed.

Projections reaching near the center of the second tantalum oxide layer 105c from the upper electrode 107c (the Pt layer with the thickness of 23 nm) can be recognized in the element C. However, in comparison to the example of the upper electrode 709a (the Pt layer with the thickness of 80 nm) shown in FIG. 1A, the shape of the projections is unclear.

From the above results, it is clear that when the Pt layer is used for the electrode, reducing the thickness of the Pt layer greatly reduces the formation of the projections. In addition, it is clear that the greater the thickness of the Pt layer becomes, the weaker an effect of reducing the formation of the projections becomes.

An experiment is further carried out to determine a relationship between a thickness of an upper electrode (Pt layer) and an initial resistance value of a variable resistance element. In this experiment, five different elements are prepared. Three of them are the element A, the element B, and the element C used for cross-section observation, and two of them are an element O including an upper electrode (Pt layer) having the smallest thickness (5 nm) and an element X including an upper electrode (Pt layer) having the largest thickness (80 nm).

Figure 4:
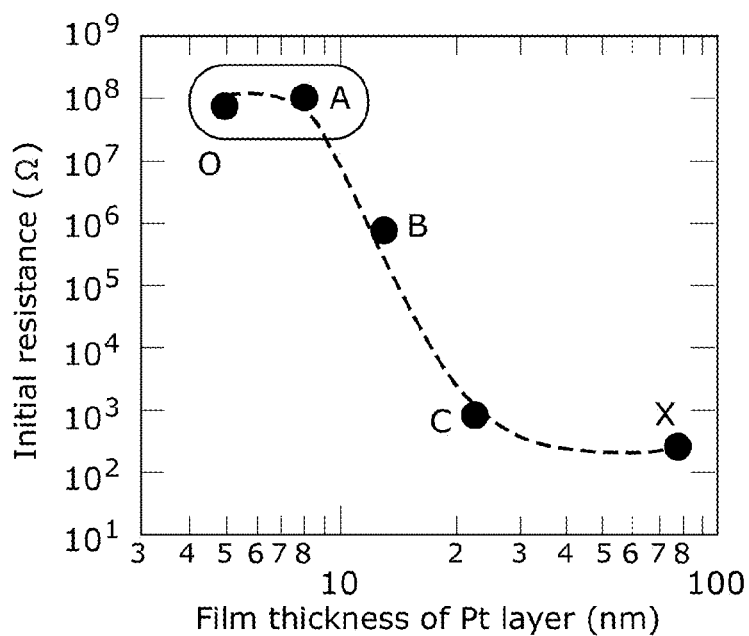
FIG. 4 is a graph showing, as basic data of the present invention, a relationship between a thickness of an electrode of a variable resistance element and an initial resistance value.

FIG. 4 is a graph obtained by plotting the initial resistance values of the element O, the element A, the element B, the element C, and the element X with respect to the thicknesses of the Pt layers.

Measurement of an initial resistance value is performed by measuring a current that flows after a weak voltage such as 50 mV is applied between a lower electrode and an upper electrode. The voltage of 50 mV is a voltage that does not cause the five different elements to change their resistance states.

As shown in FIG. 4, the initial resistance values of the element O (the Pt layer with the thickness of 5 nm) and the element A (the Pt layer with the thickness of 8 nm) are very high, approximately $10^8 \Omega$, and are substantially the same as that of the element (the element formed by the heating process in which the temperature is kept at approximately 100° C. during processing) shown in FIG. 1B. However, the initial resistance value of the element B (the Pt layer with the thickness of 13 nm) decreases to $10^6 \Omega$, and that of the element C (the Pt layer with the thickness of 23 nm) decreases to approximately $800 \Omega$. The initial resistance value of the element X (the Pt layer with the thickness of 80 nm) further decreases to approximately $300 \Omega$, and is about half of that of the element C.

As above, it is considered that there is a strong correlation between the decrease in the resistance value along with the increase in the thickness of the Pt layer as the upper electrode, and the formation of the projections and irregularities in the Pt layer. In other words, when the Pt layer increases in thickness, the Pt projections (irregularities) grow into the second oxygen-deficient tantalum oxide layer. This effectively reduces a thickness of part of the second oxygen-deficient tantalum oxide layer.

The second tantalum oxide layer is higher in resistance than the first tantalum oxide layer. For this reason, when the Pt projections penetrate into the second tantalum oxide layer, the initial resistance value of the variable resistance element significantly decreases. Conversely, a high initial resistance value of the variable resistance element means that the formation of the Pt projections is reduced commensurately.

As is clear from FIG. 4, when the Pt layer has a thickness of 8 nm or less (a range enclosed by a circle in FIG. 4), an initial resistance value is kept high, to approximately $10^8 \Omega$, and when the thickness of the Pt layer exceeds 8 nm, the initial resistance value starts to decrease. From this result, it is considered that the Pt projections which affect the initial resistance value are not formed in the Pt layer having the thickness of 8 nm or less. To put it another way, an interface between the Pt layer having the thickness of 8 nm or less and the variable resistance layer is substantially flat. It is considered that in such a thin Pt layer, crystal grains cannot grow to the extent that grain boundaries at least leading to the formation of the projections can be formed.

Thus, to substantially make the Pt layer flat by reducing the formation of the projections and protruding irregularities, it is suitable to set the thickness of the Pt layer to 8 nm or less.

Moreover, though the details are omitted, a result showing that the smallest thickness necessary for Pt to be a continuous film is 1 nm is obtained from another experiment. Thus, it is considered that a suitable thickness of the Pt layer as the electrode ranges from 1 to 8 nm. In addition, a case where the Pt layer has the thickness ranging from 1 to 8 nm is more suitable.

1.3 Variable Resistance Element in which Electrode Comprises Ir

After a great deal of further consideration, the inventors have found that using an electrode comprising Ir also successfully reduces the formation of projections. The following describes results of an experiment for verifying the finding.

In this experiment, instead of the thin Pt layer, an Ir layer is used as an upper electrode, and the following three different variable resistance elements including Ir layers having different thicknesses are formed: an element D (including an Ir layer with a thickness of 30 nm), an element E (including an Ir layer with a thickness of 50 nm), and an element F (including an Ir layer with a thickness of 70 nm).

Figure 5:
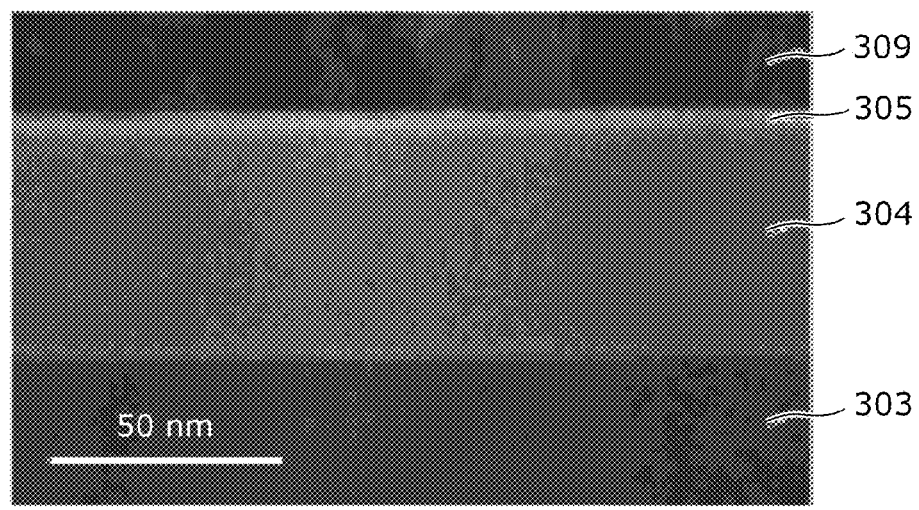
FIG. 5 is a TEM photograph showing, as basic data of the present invention, a cross-section of a variable resistance element whose electrode comprises iridium.

FIG. 5 is a TEM photograph showing a cross-section of a variable resistance element formed in the experiment. The cross-section of the element E is shown as a representative. The element E is formed by stacking, above a substrate not shown, a lower electrode 303 comprising TaN, a first tantalum oxide layer 304, a second tantalum oxide layer 305, and an upper electrode 309 comprising Ir in this order. The thicknesses and compositions of the lower electrode 303, the first tantalum oxide layer 304, and the second tantalum oxide layer 305 are the same as those of the element A described above.

Except for a point that the thickness of the upper electrode 309 of each of the element D and the element F differs from that of the element E, the element D and the element F have the same structure as the element E. It is to be noted that a conductor layer is omitted in the element D, the element E, and the element F.

As is clear from closely examining FIG. 5, no projections are formed from the upper electrode 309 (the Ir layer with the thickness of 50 nm) in the element E. Moreover, results of similar cross-section observations show that no projections are formed from the upper electrodes in the element D (including the Ir layer with the thickness of 30 nm) and the element F (including the Ir layer with the thickness of 70 nm) as well.

Thus, when the Ir layer has the thickness of 70 nm or less in the case where the Ir layer is used for the electrode, it is clear that the formation of the projections is reduced.

Figure 6:
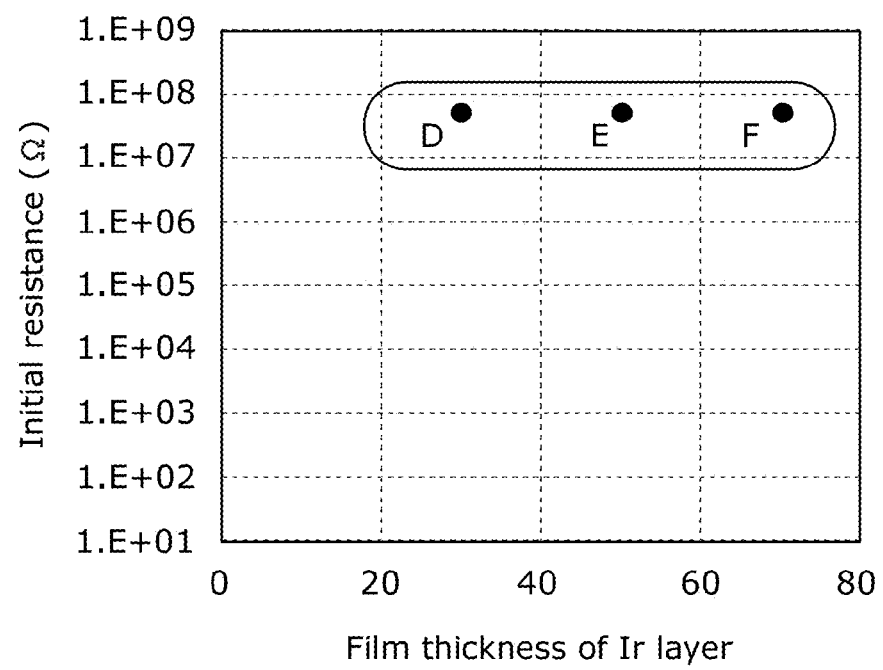
FIG. 6 is a graph showing, as basic data of the present invention, a relationship between a thickness of an electrode of a variable resistance element and an initial resistance value.

FIG. 6 is a graph obtained by plotting the initial resistance values of the element D, the element E, and the element F with respect to the thicknesses of the Ir layers.

As shown in FIG. 6, the initial resistance values of the element D, the element E, and the element F are very high and close to $10^8 \Omega$. These resistance values are substantially equal to the resistance value of the element (the element formed by the heating process in which the temperature is kept to approximately 100° C. during processing) shown in FIG. 1B.

This result matches the finding that no projections are observed in the element D, the element E, and the element F through the cross-section observations. Thus, using the Ir layer as the electrode of the variable resistance element makes it possible to substantially make flat the interface between the electrode and the variable resistance layer.

1.4 Summary of Basic Data

To summarize the above-described basic data, in the DESCRIPTION, an interface between an electrode and a variable resistance layer is defined as substantially being flat when the thickness of the electrode included in a variable resistance element is less than or equal to an upper limit predetermined based on a relationship between the thickness of an electrode of a variable resistance element including the electrode comprising the same material as the electrode, and an initial resistance value.

Such an upper limit is preferably an upper limit of a thickness range (e.g., the ranges enclosed by circles in FIG. 4 and FIG. 6) in which a thickness is small and an initial resistance value is kept high and which is determined based on a relationship between the thickness of an electrode of a variable resistance element and an initial resistance value. In other words, the upper limit is the thickness of the electrode whose initial resistance value starts to decrease when the electrode is increased in thickness.

A specific example of the upper limit is 10 nm when Pt is used for the electrode (FIG. 4). A specific example of the upper limit is not found for the thickness of 70 nm or less when Ir is used for the electrode (FIG. 6). It is to be noted that it is hard to practically imagine forming, as an electrode, an Ir layer having a thickness of more than 70 nm. Thus, when Ir is used for the electrode, because the interface between the electrode and the variable resistance layer is flat, an upper limit of the thickness of the electrode is not particularly specified.

From the above summary, the electrode of the variable resistance element preferably comprises Ir or Pt having a thickness of 10 nm or less. The projections affecting the decrease in initial resistance value are not formed in such an electrode, and the interface between the electrode and the variable resistance layer becomes substantially flat. As a result, it is possible to enhance the reproducibility of electrical characteristics and the reliability of operation of the variable resistance element.

1.5 Problem in Variable Resistance Element Thus Structured

However, in the variable resistance element in which the interface between the electrode and the variable resistance layer is substantially flat, the initial resistance value of the electrode is very high because no projections causing the decrease in initial resistance value are present in the electrode. The high resistance value, approximately $10^8 \Omega$, is measured in the above experiment.

As mentioned at the beginning, in the variable resistance element having the high initial resistance value, it is necessary to apply a high initialization voltage to initialize the variable resistance element. For this reason, when the variable resistance element is initialized which is included in the nonvolatile memory element in which the variable resistance element and the current steering element (e.g., the bidirectional diode) are connected in series, the risk that the current steering element is broken is increased because the divided voltage of the initialization voltage applied to the nonvolatile memory element exceeds a rated current of the current steering element.

After a great deal of consideration about measures for reducing such a risk, the inventors have found a suitable method for programming a nonvolatile memory element and a nonvolatile memory device that performs such a method for programming. It is to be noted that the specific configurations, structures, values, and so on used in the above description are examples. The above description only serves as an aid to understanding of a method for programming a nonvolatile memory element and a nonvolatile memory device according to embodiments described below.

The following describes a method for programming a nonvolatile memory element and a nonvolatile memory device according to Embodiment 1 of the present invention.

2. Characteristics of MSM Diode and Load Resistor

First, a current steering element 10 according to Embodiment 1 of the present invention is described.

The inventors have found that a breakdown current (the maximum current that can be passed at a time of breakdown) of the current steering element is increased by connecting the load resistor in series with the current steering element. The following describes results of an experiment for verifying the finding.

Figure 7A:
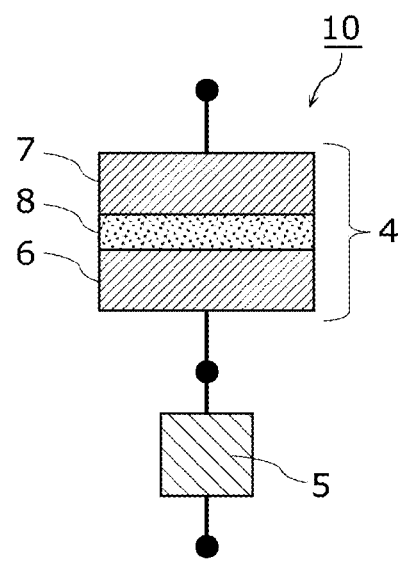
FIG. 7A is a schematic diagram showing a current steering element according to Embodiment 1 of the present invention.
Figure 7B:
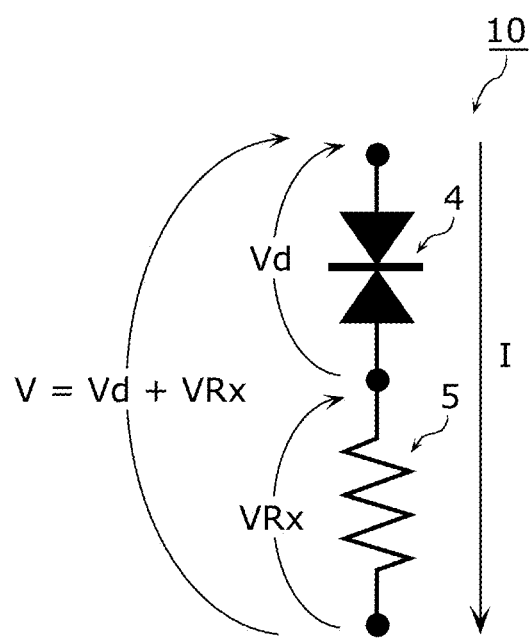
FIG. 7B is an equivalent circuit diagram showing the current steering element according to Embodiment 1 of the present invention.

FIG. 7A is a cross-sectional view schematically showing a structure of the current steering element 10 according to Embodiment 1 of the present invention. FIG. 7B is an equivalent circuit diagram showing the current steering element 10 according to Embodiment 1 of the present invention. The current steering element 10 is an element for steering a current, and includes: a bidirectional diode (here, an MSM diode 4) in which a semiconductor layer 8 comprising a silicon nitride is disposed between a third electrode 6 (a lower electrode) and a fourth electrode 7 (an upper electrode); and a load resistor 5 connected in series with the bidirectional diode (here, the MSM diode 4).

The MSM diode 4 has bidirectional rectifying characteristics for an applied voltage. The MSM diode 4 includes the third electrode 6, the fourth electrode 7, and the semiconductor layer 8 disposed between the third electrode 6 and the fourth electrode 7. Here, the third electrode 6 and the fourth electrode 7 comprise a tantalum nitride including tantalum (Ta) and nitrogen (N). The semiconductor layer 8 comprises a silicon nitride including silicon (Si) and nitrogen (N).

The MSM diode 4 shown in FIG. 7A is formed by: depositing, by reactive sputtering, a tantalum nitride having a film thickness of 50 nm as a conductor layer to be the third electrode 6, above a substrate; depositing, by reactive sputtering, a silicon nitride having a film thickness of 10 nm and to be the semiconductor layer 8, above the conductor layer; depositing, by reactive sputtering, a tantalum nitride having a film thickness of 50 nm as a conductor layer to be the fourth electrode 7, above the semiconductor layer 8, and subsequently applying normal lithography and dry etching. The third electrode 6 and the fourth electrode 7 have an area of 0.5 μm×0.5 μm.

A material including Si and N comprised in the semiconductor layer 8 refers to a so-called nitrogen-deficient silicon nitride. Here, nitrogen-deficient means a nitrogen content being smaller than that of a nitride having a stoichiometric composition (here, $Si_3N_4$). A silicon nitride is comprised in a tetrahedrally bonded amorphous semiconductor forming a tetra coordination bond. The tetrahedrally bonded amorphous semiconductor basically has a structure similar to that of monocrystal silicon or germanium. With this, the silicon nitride has characteristics that a difference in structure caused by introducing a chemical element other than Si is easily influenced by physical properties. For this reason, using the silicon nitride for the semiconductor layer 8 makes it easy to control the physical properties of the semiconductor layer 8 by structure control of the silicon nitride. Thus, this provides an advantage of facilitating control of a potential barrier formed between the third electrode 6 and the fourth electrode 7.

Specifically, using $SiN_x$ as the semiconductor layer 8 makes it possible to continuously vary a band gap by changing a composition of nitrogen in $SiN_x$. With this, it is possible to control a size of a potential barrier formed between the third electrode 6 and the fourth electrode 7, and the semiconductor layer 8 adjacent to these electrodes.

Moreover, the third electrode 6 and the fourth electrode 7 may comprise a metal such as Al, Cu, Ti, W, Pt, Ir, Cr, Ni, and Nb, or a mixture (alloy) of these metals.

Alternatively, the third electrode 6 and the fourth electrode 7 may comprise a compound having conductivity such as TiN, TiW, TaN, $TaSi_2$, TaSiN, TiAlN, NbN, WN, $WSi_2$, WSiN, $RuO_2$, $In_2O_3$, $SnO_2$, and $IrO_2$, or a mixture of these compounds having conductivity. Here, the materials comprised in the third electrode 6 and the fourth electrode 7 are not limited to those materials, and may be any materials as long as the materials cause rectification due to the potential barrier formed between the third electrode 6 and the fourth electrode 7, and the semiconductor layer 8.

The load resistor 5 is a resistance element, and includes not only a single resistance element but also a resistance film having a stack structure to be described later.

As shown in FIG. 7B, the current steering element 10 in Embodiment 1 has a structure in which the load resistor 5 is connected in series with the MSM diode 4.

Here, as shown in FIG. 7B, where a voltage applied to both ends of the MSM diode 4 and the load resistor 5 is V, a voltage applied to the MSM diode 4 is Vd, and a voltage applied to the load resistor 5 is VRx, the following relationship is established.

$$V = Vd + VRx$$

Figure 8A:
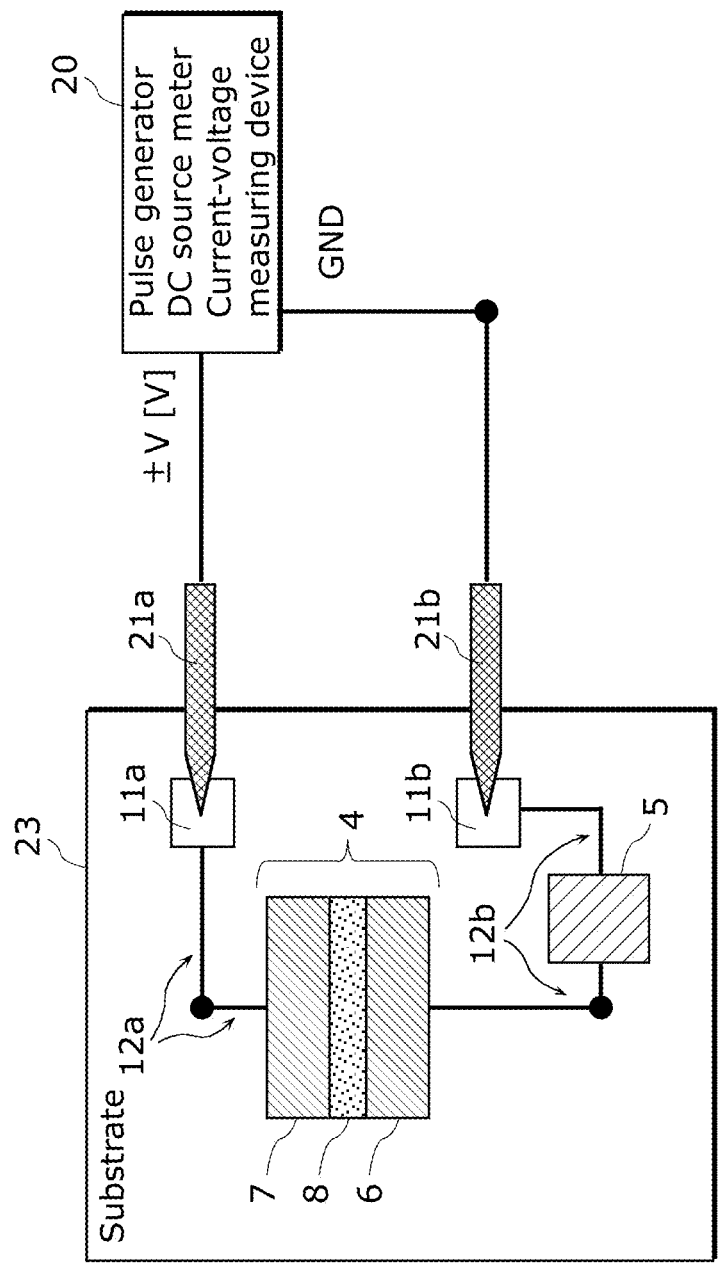
FIG. 8A is a schematic diagram illustrating a measurement system of a current steering element according to Embodiment 1 of the present invention.
Figure 8B:
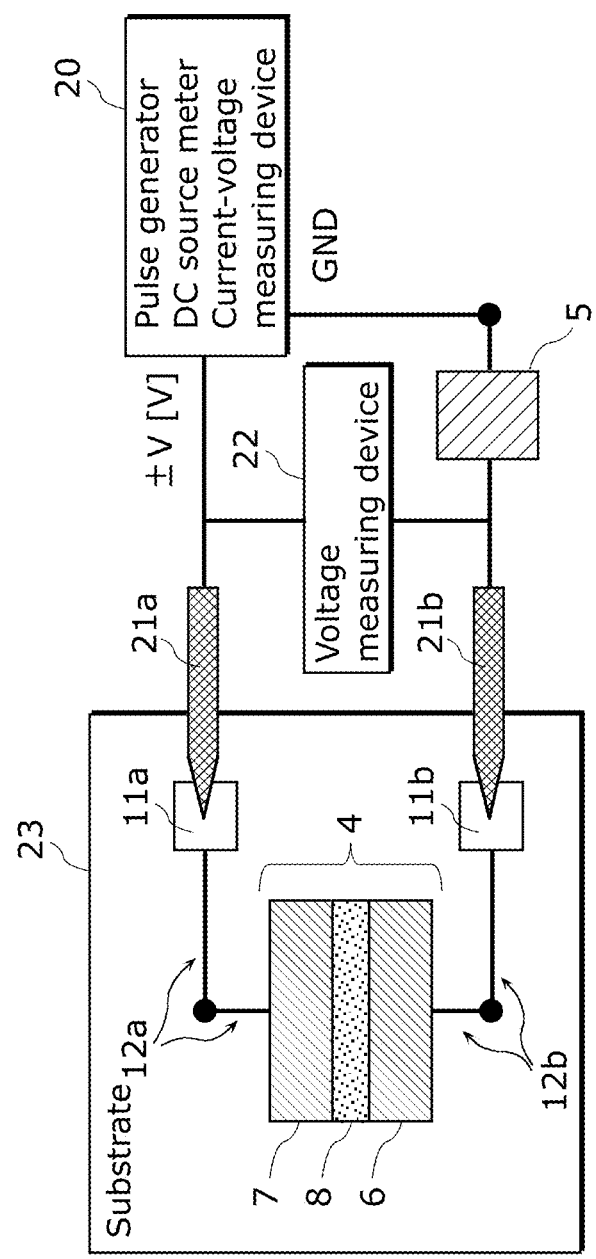
FIG. 8B is a schematic diagram illustrating a measurement system of a current steering element according to Embodiment 1 of the present invention.

FIG. 8A and FIG. 8B show specific measuring systems for these voltages.

In each of the measuring systems, the MSM diode 4 is formed above a substrate 23, and the third electrode 6 and the fourth electrode 7 are connected to metal pads for measuring needles 11a and 11b through metal lines 12a and 12b.

As the measuring system, a pulse generator for generating a voltage pulse, a source meter for supplying a voltage, and a measuring device 20 such as a current-voltage measuring device are connected to probe needles 21a and 21b. The measuring system is configured in such a way that the measuring device 20 measures current-voltage characteristics of the MSM diode 4 through the metal pads for measuring needles 11a and 11b.

In FIG. 8A, the load resistor 5 is formed above the same substrate 23 as the MSM diode 4. In addition, the load resistor 5 is connected to one of the third electrode 6 and the fourth electrode 7 (here, the third electrode 6) of the MSM diode 4 in the substrate 23 through the metal line 12b. In this experiment, a load resistor which is a series connection of contacts connecting between the upper and lower metal lines is prepared as the load resistor 5. A resistance value per contact is 3 to 5Ω.

In FIG. 8B, the load resistor 5 is inserted between the probe needle 21b and the measuring device 20. The load resistor 5 is a common resistor on the market. To determine a relationship between an externally applied voltage V, a voltage Vd actually divided and applied to the MSM diode 4, and a voltage VRx divided and applied to the load resistor 5, a voltage measuring device 22 is disposed as shown in the figure.

Both FIG. 8A and FIG. 8B show the same equivalent circuit of the current steering element 10 as shown in FIG. 7B. In other words, the current steering element 10 has a structure in which the load resistor 5 is connected in series with one of the third electrode 6 and the fourth electrode 7 of the MSM diode 4. In actual current-voltage measurement, the measuring systems shown in FIG. 8A and FIG. 8B show equivalent results.

The following describes current-voltage characteristics that are the characteristics of the current steering element 10 according to Embodiment 10 of the present invention, with reference to FIG. 9A to FIG. 13. It is to be noted that a voltage pulse width is 500 μs, and an application step is 50 mV.

Figure 9A:
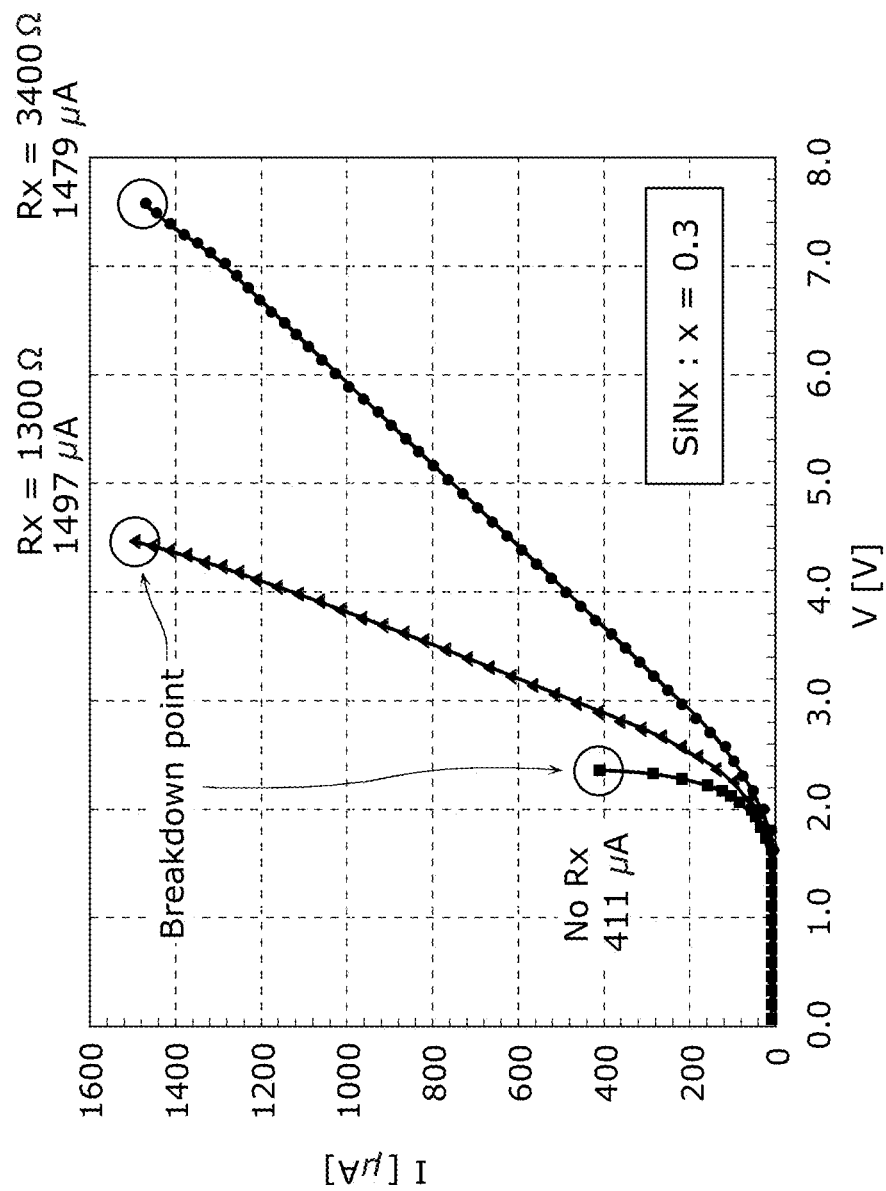
FIG. 9A is a graph showing current-voltage characteristics of a current steering element (including $SiN_x$ (x=0.3)) according to Embodiment 1 of the present invention.
Figure 9B:
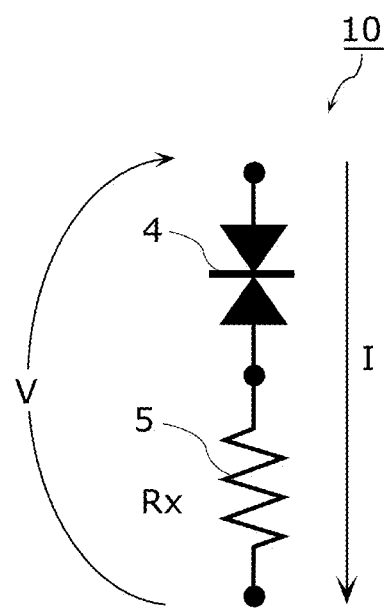
FIG. 9B is a diagram showing directions of voltage and current of a current steering element according to Embodiment 1 of the present invention.
Figure 10:
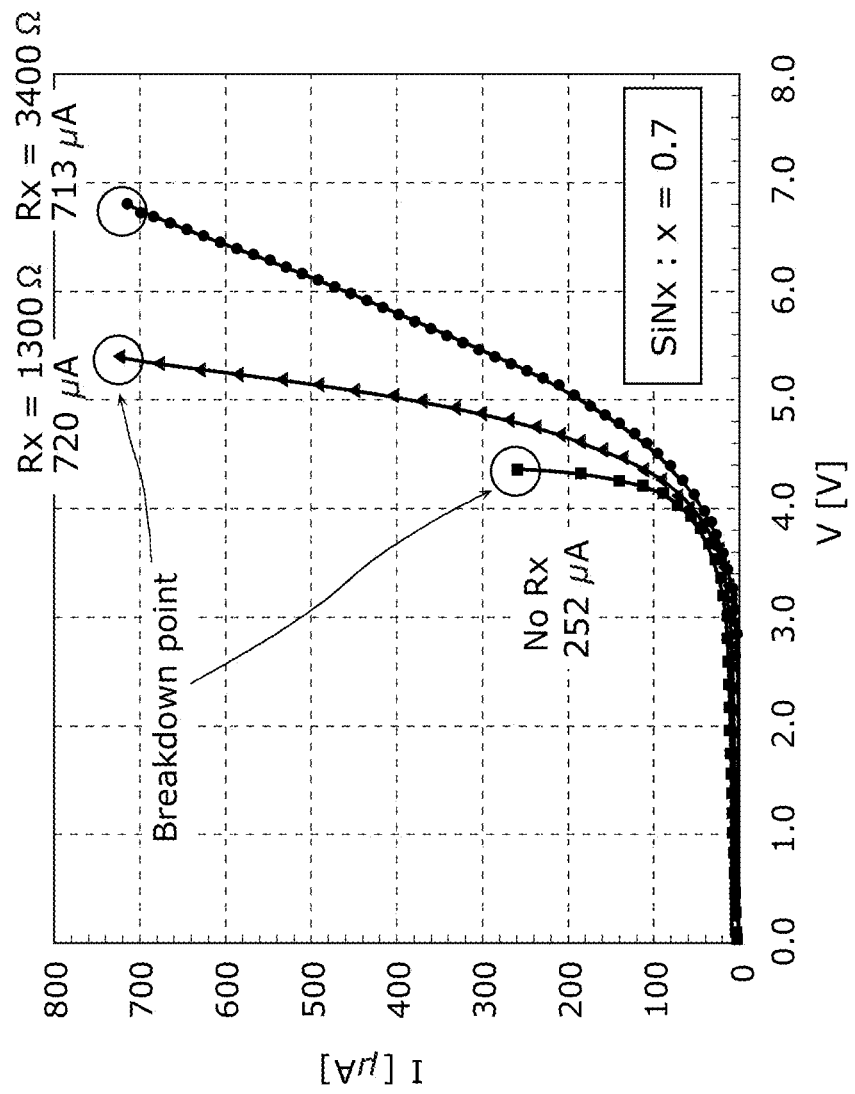
FIG. 10 is a graph showing current-voltage characteristics of a current steering element (including $SiN_x$ (x=0.7)) according to Embodiment 1 of the present invention.

FIG. 9A is a graph showing the current-voltage characteristics of the current steering element 10 in cases where the load resistor 5 is not connected to the MSM diode 4 comprising $SiN_x$ (x=0.3) (hereinafter, "no load resistor"), where the load resistor 5 having Rx=1300Ω is connected to the MSM diode 4, and where the load resistor 5 having Rx=3400Ω is connected to the MSM diode 4. It is to be noted that Rx represents the resistance value of the load resistor 5. FIG. 9B is a diagram showing the directions of a voltage and a current at this time. FIG. 10 is a graph showing the current-voltage characteristics of the current steering element 10 in the case of no load resistor, and in the cases where the load resistor 5 having Rx=1300Ω is connected to the MSM diode 4 comprising $SiN_x$ (x=0.7), and where the load resistor 5 having Rx=3400Ω is connected to the MSM diode 4. It is to be noted that the directions of a voltage and a current are the same as those in FIG. 9B.

Either $SiN_x$ has a film thickness of 10 nm. FIG. 9A and FIG. 10 show curves obtained by plotting current values and voltage values from a time when an applied voltage to the current steering element is gradually increased from 0 V to a time when the current steering element (to be more precise, the MSM diode 4) is broken (a breakdown point).

In either case, it is clear that a breakdown current increases more significantly in the case where the load resistor is present than in the case of no load resistor.

Figure 11:
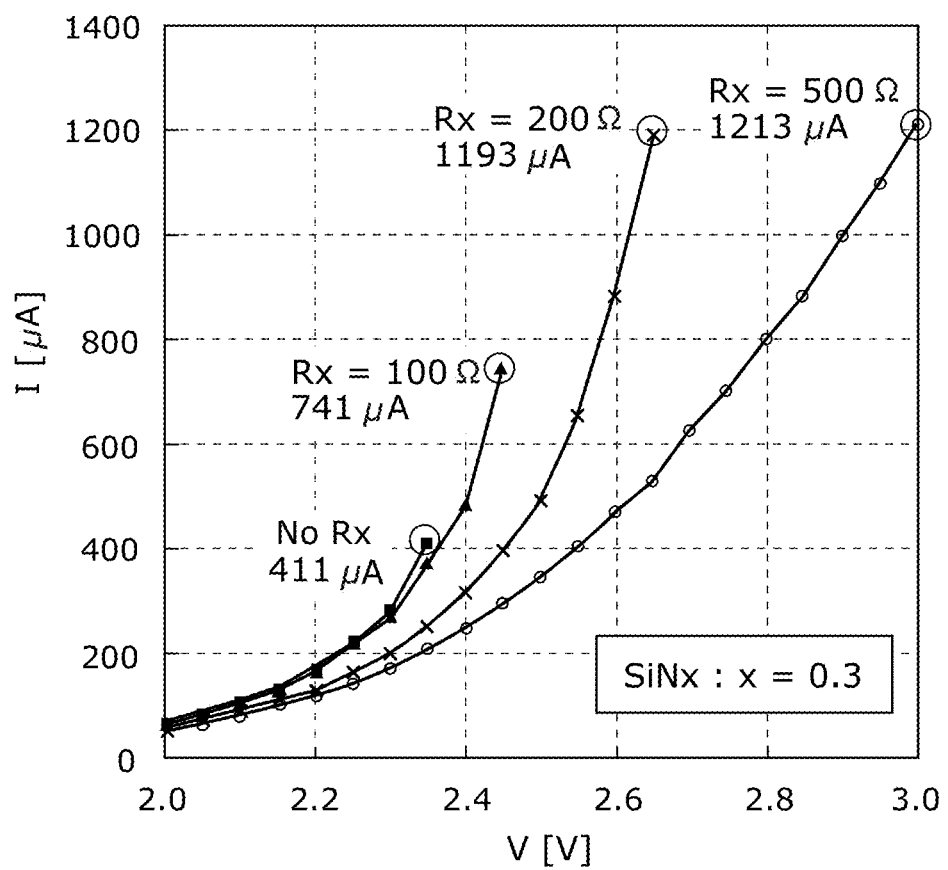
FIG. 11 is a graph showing current-voltage characteristics of a current steering element (including $SiN_x$ (x=0.3)) according to Embodiment 1 of the present invention.

Next, a relationship between the load resistor 5 and the breakdown current is examined in detail. FIG. 11 and FIG. 12A to FIG. 12D show results of the same measurements performed on the current steering element 10 having a structure in which the load resistor 5 having a lower resistance value than the load resistor 5 shown in FIG. 9A is connected to the MSM diode 4 comprising $SiN_x$ (x=0.3). To put it another way, FIG. 11 is a graph showing the current-voltage characteristics of the current steering element 10 (including $SiN_x$ (x=0.3)) in Embodiment 1 of the present invention. It is to be noted that a figure showing the directions of a voltage and a current is the same as FIG. 9A. Moreover, each of FIG. 12A to FIG. 12D is a graph showing the current-voltage characteristics of the current steering element 10 (including $SiN_x$ (x=0.3)) in Embodiment 1 of the present invention. It is to be noted that a figure showing the directions of a voltage and a current is the same as FIG. 7B.

As shown in FIG. 11, an increase in the breakdown current is observed even when Rx=100Ω. In addition, it is clear that the breakdown current increases almost three times compared to the case of no load resistor, when Rx=200Ω.

As above, the breakdown current of the current steering element 10 according to Embodiment 1 of the present invention has a current density of 700 $\mu A/\mu m^2$.

Each of FIG. 12A to FIG. 12D shows a relationship between an applied voltage V (=Vd+VRx) to the current steering element 10 (the MSM diode 4 and the load resistor 5) and a voltage Vd actually applied to the MSM diode 4. Here, the voltage Vd is the measurement value of a voltage actually applied to the both ends of the MSM diode 4. The structure shown in FIG. 8B is used as a measuring system.

Figure 12A:
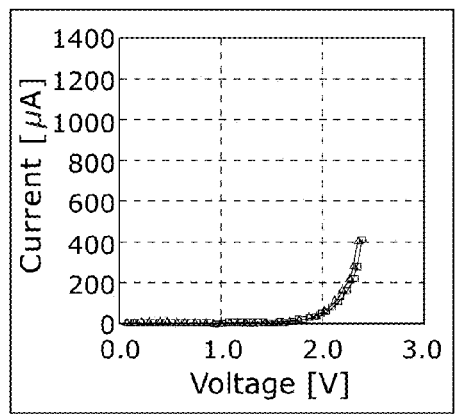
FIG. 12A is a graph showing current-voltage characteristics of a current steering element (including $SiN_x$ (x=0.3)) according to Embodiment 1 of the present invention.
Figure 12B:
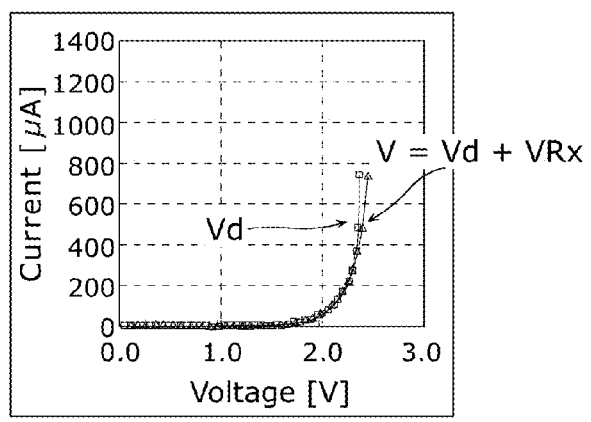
FIG. 12B is a graph showing current-voltage characteristics of the current steering element (including $SiN_x$ (x=0.3)) according to Embodiment 1 of the present invention.
Figure 12C:
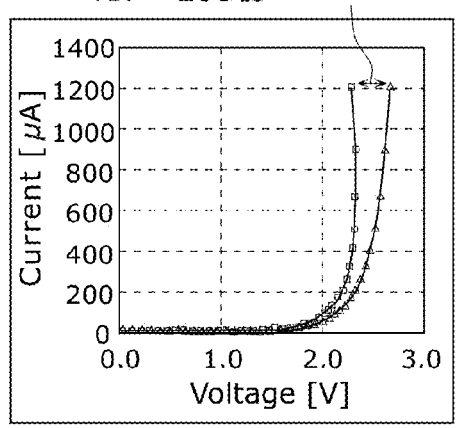
FIG. 12C is a graph showing current-voltage characteristics of the current steering element (including $SiN_x$ (x=0.3)) according to Embodiment 1 of the present invention.
Figure 12D:
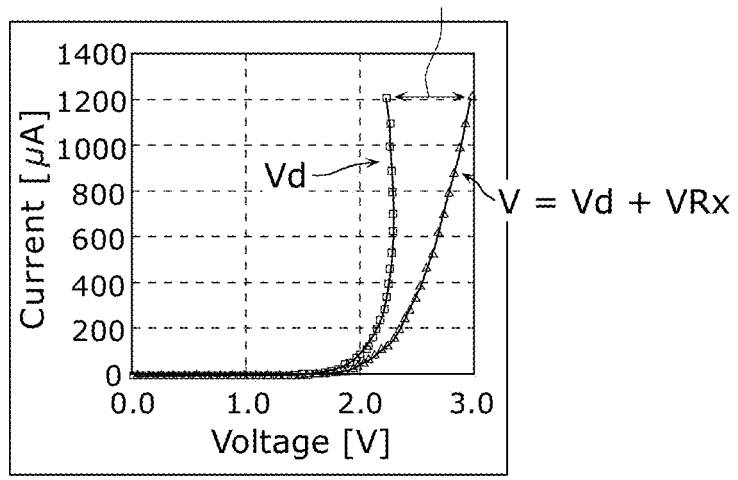
FIG. 12D is a graph showing current-voltage characteristics of the current steering element (including $SiN_x$ (x=0.3)) according to Embodiment 1 of the present invention.

FIG. 12A shows the current-voltage characteristics of the current steering element 10 in the case of no load resistor. FIG. 12B shows the same when Rx=100Ω. FIG. 12C shows the same when Rx=200Ω. FIG. 12D shows the same when Rx=500Ω.

In the case of no load resistor shown in FIG. 12A, curves of V and Vd overlap with each other, and there is no difference between the two. This means that measurement noise of the measuring system shown in FIG. 8B is extremely little.

As the load resistor increases in resistance in order of FIG. 12B, FIG. 12C, and FIG. 12D, tendency of Vd<V becomes stronger. Stated differently, it is clear that as the divided voltage (VRx) to the load resistor 5 increases, the breakdown current increases.

The divided voltages VRx to the load resistor 5 at the breakdown points are 70 my when the load resistor value Rx=100Ω, 380 mV when Rx=200Ω, and 760 mV when Rx=500Ω. This means that as long as the divided voltage to the load resistor 5 is at least approximately 70 mV, the breakdown current of the current steering element 10 increases.

Figure 13:
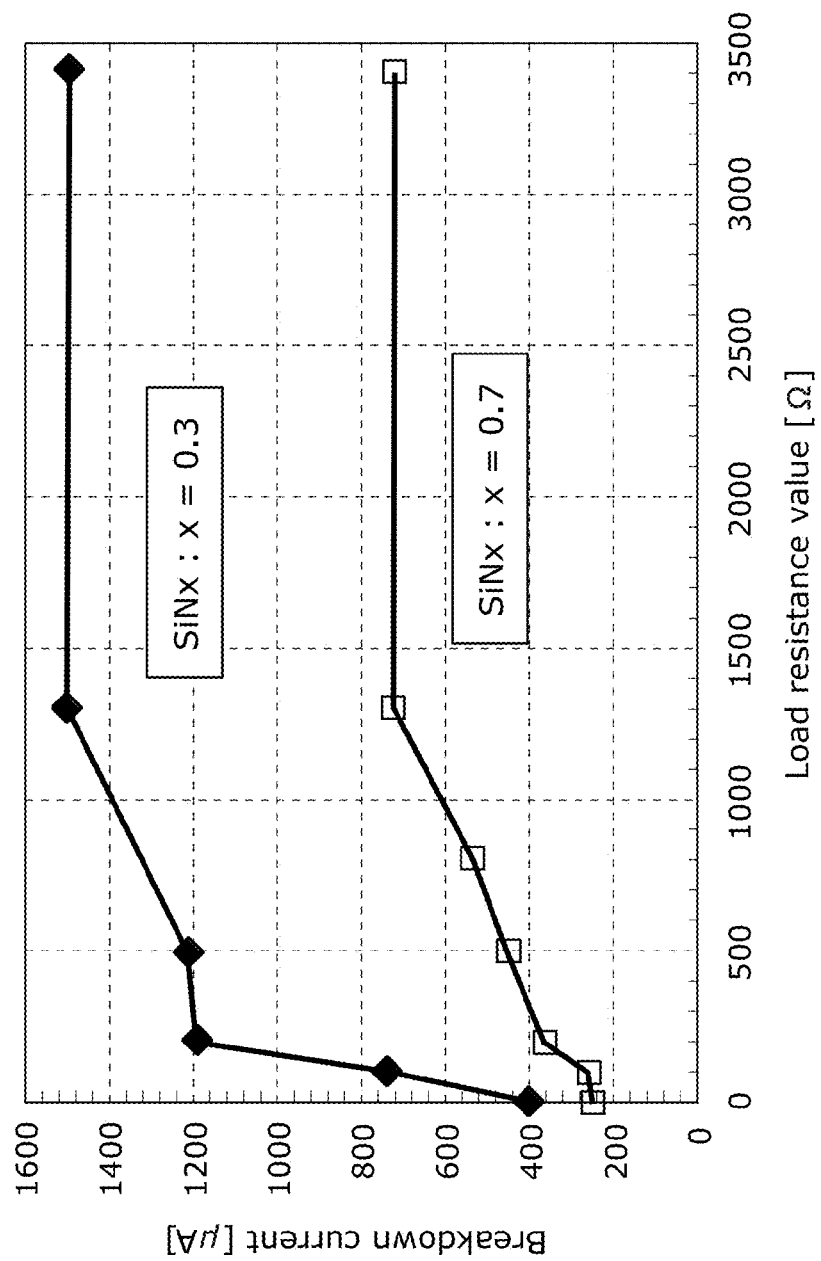
FIG. 13 is a graph showing a relationship between load resistor and breakdown current of a current steering element according to Embodiment 1 of the present invention.

FIG. 13 shows, for each of the MSM diode 4 comprising $SiN_x$ (x=0.3) and the MSM diode 4 comprising $SiN_x$ (x=0.7), a relationship between a resistance value Rx of the load resistor 5 included in the current steering element 10, and a breakdown current.

It is clear that the breakdown current increases when Rx=approximately 100 to 200Ω. In other words, the resistance value of the load resistor 5 included in the current steering element 10 according to this embodiment is preferably 100Ω or more, and more specifically is preferably 200Ω or more. Moreover, there is no difference in breakdown current between 1300Ω and 3400Ω.

On the other hand, when the divided voltage to the load resistor 5 becomes excessively high as a result of the resistance value of the load resistor 5 becoming extremely high, a voltage to be originally applied to the MSM diode 4 becomes insufficient. Consequently, there is a possibility that an ON voltage of the MSM diode 4 becomes excessively high or a voltage for turning ON the MSM diode 4 is not applied to the MSM diode 4. For this reason, an appropriate range of the resistance value Rx of the load resistor 5 is considered to be from approximately 100 to 5000Ω.

Previously, because breakdown of an MSM diode including a semiconductor layer comprising $SiN_x$ is caused by heat generated by a current, it has been considered impossible to pass a current higher than a breakdown current determined by a combination of a nitrogen concentration and a film thickness of $SiN_x$, and an electrode material. In fact, an MSM diode having a current density greatly exceeding 1000 $\mu A/\mu m^2$ has not been released so far.

Moreover, because a current flows less easily through an MSM diode comprising $SiN_x$ in which x is large (similar to an insulating film) than through an MSM diode comprising $SiN_x$ in which x is small, and heat is easily generated by a current, it has been considered difficult to increase the breakdown current in principle.

This time, the inventors have clarified, based on the consideration, that when the current steering element has a structure in which the load resistor is connected to the MSM diode, and voltage division is effectively performed for the load resistor at a time of voltage application to the current steering element, it is possible to increase the breakdown current greatly.

To put it another way, when the load resistor is not connected, a high current flows through the current steering element. With this, it is considered that a rise in temperature of a semiconductor layer and an insulator layer included in the current steering element allows a current to flow more easily, and thus the current steering element is led to breakdown at an accelerating pace. In contrast, when the load resistor is connected, an increase in a current flowing through the current steering element results in an increase in the divided voltage to the load resistor. This reduces the divided voltage to the current steering element, thereby reducing a degree of increase of the current flowing through the current steering element. Consequently, it is considered possible to increase the breakdown current greatly.

It is to be noted that even when the load resistor is absent (the case shown in FIG. 12A), in the MSM diode used for this consideration, a parasitic resistance has approximately 10 to 15Ω which is a sum of a series resistance (TaN having a thickness of 50 nm, that is, two series resistances of 0.2 mΩ×cm) of the upper and lower electrodes, a contact resistance between the upper electrode and the upper metal line, a contact resistance between the lower electrode and the lower metal line, and a wiring resistance of the upper and lower metal lines.

On the other hand, in the normal semiconductor process and design, metal lines made of aluminum or copper are used, and the above parasitic resistance components are designed to be very small.

For this reason, a load resistance of 100Ω or more, for instance, which is greater than the above parasitic resistance by approximately one digit is not connected to the MSM diode in a normal process. Stated differently, to produce the effects shown in FIG. 12A to FIG. 12D, a load resistance (e.g., a load resistance of 100Ω or more) exceeding a range of a normal parasitic resistance is required. In short, it is necessary to prepare a load resistor purposely, and connect the load resistor to the MSM diode.

3. Embodiment 1

The following describes in detail a method for programming a nonvolatile memory element according to Embodiment 1 of the present invention, with reference to the drawings.

This method for programming is a method for programming a nonvolatile memory element in which a current steering element and a variable resistance element in which an interface between an electrode and a variable resistance layer is substantially flat and no projections are present in the electrode are connected in series, and is characterized by using, at least in an initialization step, the current steering element including an MSM diode and a load resistor connected in series with the MSM diode.

3.1 Structure of Nonvolatile Memory Element

First, a structure of a nonvolatile memory element programmed by the method for programming according to Embodiment 1 is described.

Figure 14:
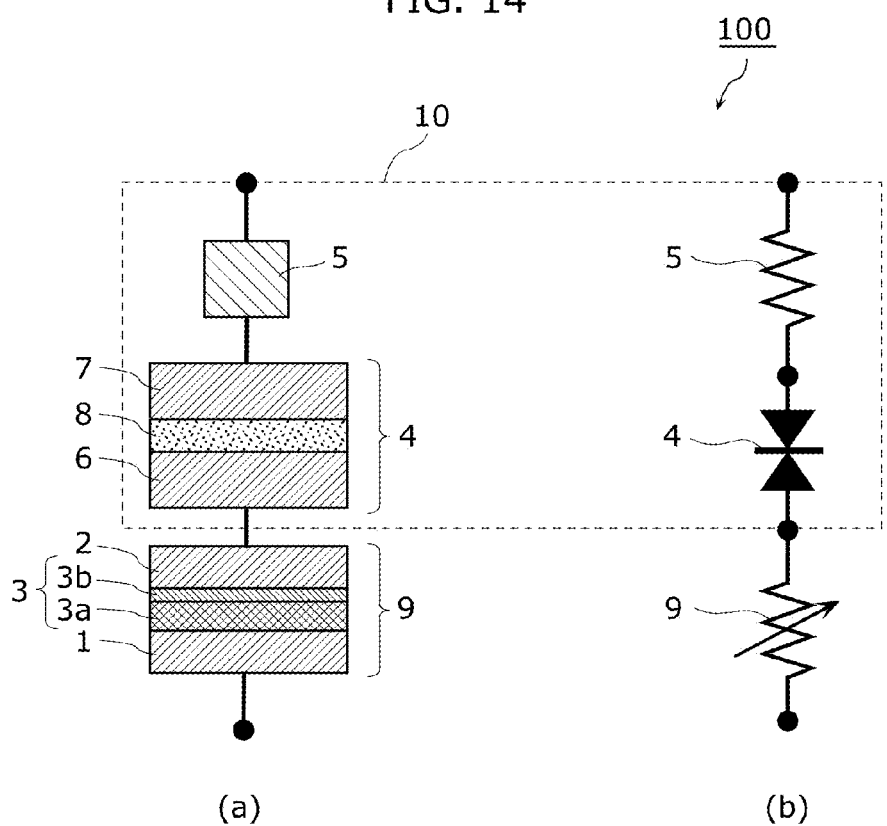
FIG. 14 is a diagram showing an exemplary structure of a nonvolatile memory element and an equivalent circuit of the same according to Embodiment 1 of the present invention.

FIG. 14 is a schematic diagram showing an exemplary structure of a nonvolatile memory element 100 programmed by the method for programming according to Embodiment 1. As shown in FIG. 14, the nonvolatile memory element 100 includes a variable resistance element 9 and a current steering element 10 that are formed above a substrate not shown.

The current steering element 10 mainly includes an MSM diode 4. A load resistor 5 is further connected in series with the MSM diode 4 at least in the initialization step.

3.1.1 Variable Resistance Element

The variable resistance element 9 has nonvolatile resistance change characteristics. The variable resistance element 9 has a structure in which a variable resistance layer 3 is disposed between a first electrode 1 (a lower electrode) and a second electrode 2 (an upper electrode). In other words, the variable resistance layer 3 lies between the first electrode 1 and the second electrode 2, and is in contact with the first electrode 1 and the second electrode 2. In addition, the variable resistance layer 3 is capable of reversibly changing between a high resistance state and a low resistance state when electrical signals having different polarities are applied between the first electrode 1 and the second electrode 2.

In the variable resistance element 9, the first electrode 1 comprises, for instance, one of Cu (copper), TaN, Ta, Ti (titanium), and TiN (titanium nitride), or materials.

The second electrode 2 comprises Ir or Pt having a thickness from 1 to 10 nm. With this structure, as described in detail using the basic data, no projections extending toward the variable resistance layer 3 are formed in the second electrode 2, and an interface between the second electrode 2 and the variable resistance layer 3 is substantially flat.

The variable resistance layer 3 has a stack structure of a first oxide layer 3a comprising a first transition metal oxide and a second oxide layer 3b comprising a second transition metal oxide that are in contact with each other.

The second oxide layer 3b has a degree of oxygen deficiency lower than that of the first oxide layer 3a. The degree of oxygen deficiency is as described at the beginning of the Description of Embodiments section. Moreover, the second oxide layer 3b is in contact with the second electrode 2 and the first oxide layer 3a.

Examples of a material used for the variable resistance layer 3 include an oxygen-deficient tantalum oxide, an oxygen-deficient hafnium oxide, and an oxygen-deficient zirconium oxide.

When an oxygen-deficient tantalum oxide layer is used as the variable resistance layer 3, the first oxide layer 3a preferably has a composition expressed as $TaO_x$ ($0.8 \leq x \leq 1.9$), and the second oxide layer 3b preferably has a composition expressed as $TaO_y$ ($2.1 \leq y \leq 2.5$). The second oxide layer 3b having the composition expressed as $TaO_y$ preferably has a thickness from 1 to 8 nm.

When an oxygen-deficient hafnium oxide layer is used as the variable resistance layer 3, the first oxide layer 3a preferably has a composition expressed as $HfO_x$ ($0.9 \leq x \leq 1.6$), and the second oxide layer 3b preferably has a composition expressed as $HfO_y$ ($1.8 < y < 2.0$). The second oxide layer 3b having the composition expressed as $HfO_y$ preferably has a thickness from 3 to 4 nm.

When an oxygen-deficient zirconium oxide layer is used as the variable resistance layer 3, the first oxide layer 3a preferably has a composition expressed as $ZrO_x$ ($0.9 \leq x \leq 1.4$), and the second oxide layer 3b preferably has a composition expressed as $ZrO_y$ ($1.9 < y < 2.0$). The second oxide layer 3b having the composition expressed as $ZrO_y$ preferably has a thickness from 1 to 5 nm.

Moreover, the stack structure of the first oxide layer 3a comprising the first transition metal and the second oxide layer 3b comprising the second transition metal different from the first transition metal may be used as the variable resistance layer 3. The second oxide layer 3b has a degree of oxygen deficiency lower than that of the first oxide layer 3a. To put it another way, the second oxide layer 3b has a resistance value higher than that of the first oxide layer 3a. With such a structure, a voltage applied between the first electrode 1 and the second electrode 2 at a time of resistance change is distributed more to the second oxide layer 3b. This makes oxidation-reduction reaction more easily occur in the second oxide layer 3b.

Furthermore, when different materials are used for the first transition metal and the second transition metal, the second transition metal preferably has a standard electrode potential lower than that of the first transition metal. The occurrence of oxidation-reduction reaction in a tiny filament (conductive path) formed in the second oxide layer 3b having a high resistance changes the resistance value of the second oxide layer 3b. With this, it is considered that a resistance change phenomenon occurs. For example, it is possible to achieve stable resistance change operation by using the oxygen-deficient tantalum oxide for the first oxide layer 3a and a titanium oxide ($TiO_2$) for the second oxide layer 3b. Titanium (a standard electrode potential=−1.63 eV) has a standard electrode potential lower than tantalum (a standard electrode potential=−0.6 eV). Using, for the second oxide layer 3b, a metal oxide having a standard electrode potential lower than the first oxide layer 3a makes the oxidation-reduction reaction more easily occur in the second oxide layer 3b.

It is considered that the occurrence of the oxidation-reduction reaction in the tiny filament formed in the second oxide layer 3b having the high resistance changes the resistance value of the second oxide layer 3b, and thus the resistance change phenomenon in each of the resistance change films having the stack structures of the materials occurs. Stated differently, oxidation reaction is caused in the tiny filament formed in the second oxide layer 3b, by oxygen ions in the variable resistance layer 3 being pulled toward the second oxide layer 3b when a positive voltage is applied to the second electrode 2 on the side of the second oxide layer 3b with reference to the first electrode 1. With this, it is considered that the resistance of the tiny filament increases. Conversely, reduction reaction is caused in the tiny filament formed in the second oxide layer 3b, by oxygen ions in the second oxide layer 3b being pushed toward the first oxide layer 3a when a negative voltage is applied to the second electrode 2 on the side of the second oxide layer 3b with reference to the first electrode 1. With this, it is considered that the resistance of the tiny filament decreases.

The second electrode 2 connected to the second oxide layer 3b having the lower degree of oxygen deficiency comprises a material such as platinum (Pt) and iridium (Ir) having a standard electrode potential higher than the transition metal comprised in the second oxide layer 3b and the material comprised in the first electrode 1. With this structure, the oxidation-reduction reaction selectively occurs in the second oxide layer 3b near an interface between the second electrode 2 and the second oxide layer 3b, and thus it is possible to achieve the stable resistance change phenomenon.

With the intent of minor adjustment of a resistance value or the like, it is possible to purposely include a small amount of another chemical element in the variable resistance layer 3. Moreover, there is a possibility that when the variable resistance layer 3 is formed, a tiny amount of a chemical element is mixed into the variable resistance layer 3 due to an influence of residual gas of an apparatus, gas release from a vacuum vessel wall, or the like.

Even in such cases, the variable resistance layer 3 may include an oxide layer comprising, as a main metal oxide, tantalum, hafnium, zirconium, or the like.

The variable resistance layer 3 may have a thickness of 1 μm or less, and preferably has a thickness of 200 nm or less. This is because processing can be made easy when lithography is used as a patterning process. It is also because a voltage value of a voltage pulse necessary for changing a resistance value of the variable resistance layer 3 can be decreased. On the other hand, the variable resistance layer 3 preferably has a thickness of at least 5 nm or more.

3.1.2 MSM Diode

The current steering element 10 has a structure in which the MSM diode 4 and the load resistor 5 are connected in series at least in the initialization step. The MSM diode 4 has a structure in which the semiconductor layer 8 is disposed between a third electrode 6 and a fourth electrode 7.

Preferably, a silicon nitride is used for the semiconductor layer 8 of the MSM diode 4, and the semiconductor layer 8 has a composition expressed as $SiN_z$ ($0<z\leq0.85$). In addition, the semiconductor layer 8 preferably has a thickness of 5 nm or more.

The third electrode 6 and the fourth electrode 7 may each comprise a metal such as Al (aluminum), Cu, Ti, W, Pt, Ir, Cr (chrome), Ni (nickel), and Nb (niobium), or a mixture (alloy) of these metals. Alternatively, the third electrode 6 and the fourth electrode 7 may each comprise a compound having conductivity such as TiN, TiW (titanium tungsten), TaN, $TaSi_2$ (tantalum silicide), TaSiN (tantalum nitride silicide), TiAlN, NbN (niobium nitride), WN (tungsten nitride), $WSi_2$ (tungsten silicide), WSiN (tungsten nitride silicide), $RuO_2$ (ruthenium oxide), $In_2O_3$ (indium oxide), $SnO_2$ (tin oxide), and $IrO_2$ (iridium oxide), or a mixture of these compounds having conductivity.

Here, the materials comprised in the third electrode 6 and the fourth electrode 7 are not limited to those materials, and may be any materials as long as the materials cause rectification due to a potential barrier formed between the third electrode 6 and the fourth electrode 7, and the semiconductor layer 8.

3.1.3 Load Resistor

When, in a state where the load resistor 5 and the MSM diode 4 are connected in series, a current is passed by applying a voltage to the both ends of the load resistor 5 and the MSM diode 4, a divided voltage applied to the load resistor 5 is preferably 70 mV or more.

Moreover, the load resistor 5 preferably has a resistance value of 100Ω or more in an area of 0.5 μm×0.5 μm.

Furthermore, the load resistor 5 may be implemented by a fixed resistor such as a contact chain formed outside of the MSM diode 4 as shown in FIG. 14, an ON resistor of a transistor, or the like.

When the ON resistor of the transistor is used as the load resistor 5, its resistance value can be adjusted by controlling a gate voltage of the transistor.

Moreover, the load resistor 5 may be a load resistance layer 5 stacked above the MSM diode 4 or the variable resistance element 9.

Figure 15A:
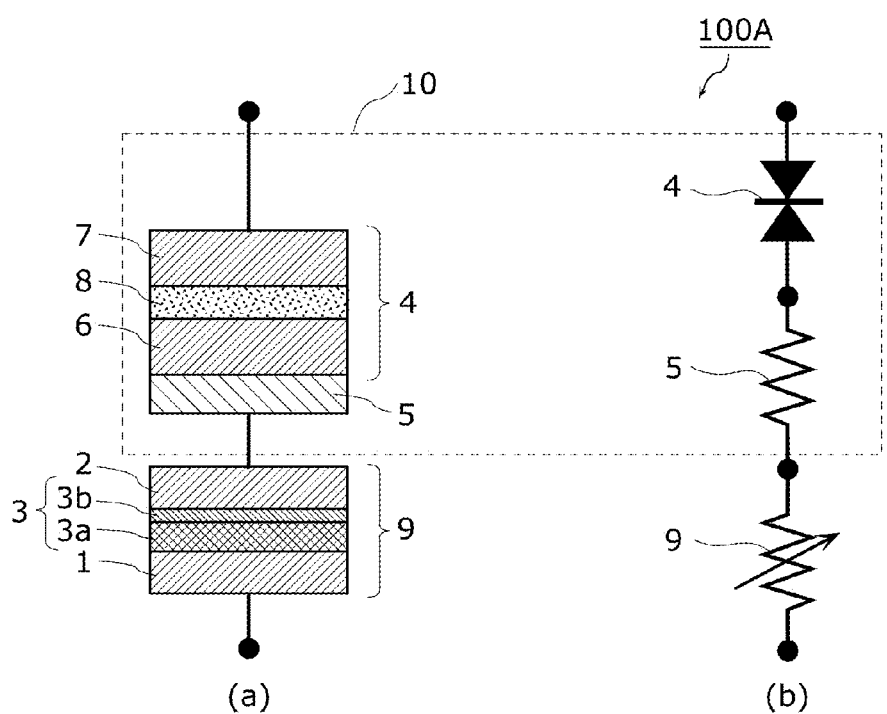
FIG. 15A is a diagram showing an exemplary structure of a nonvolatile memory element and an equivalent circuit of the same according to Embodiment 1 of the present invention.
Figure 15B:
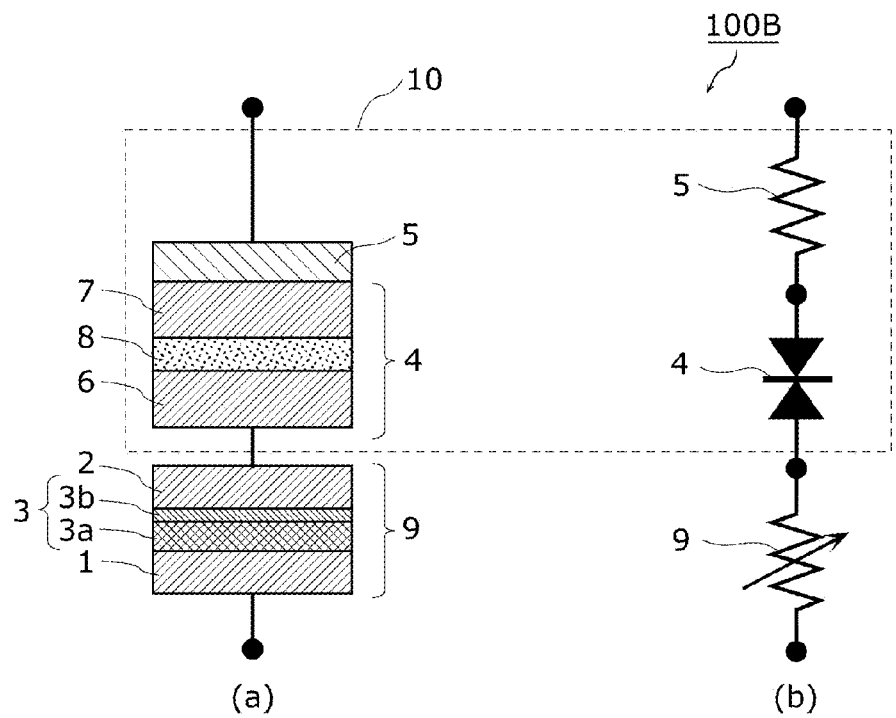
FIG. 15B is a diagram showing an exemplary structure of a nonvolatile memory element and an equivalent circuit of the same according to Embodiment 1 of the present invention.

FIG. 15A is a cross-sectional view and an equivalent circuit diagram showing a nonvolatile memory element 100A including a current steering element 10 having a four-layer structure in which the load resistance layer 5 is placed below an lower electrode of the MSM diode 4. Similarly, FIG. 15B is a cross-sectional view and an equivalent circuit diagram showing a nonvolatile memory element 100B including a current steering element 10 having a four-layer structure in which the load resistance layer 5 is stacked above an upper electrode of the MSM diode 4.

Here, current-voltage characteristics of the MSM diode 4 are determined by a potential barrier formed on a contact face between the semiconductor layer 8 and the fourth electrode 7 or a contact face between the semiconductor layer 8 and the third electrode 6. Thus, the load resistance layer 5 is formed on a side where the load resistance layer 5 is not in contact with the semiconductor layer 8 of the MSM diode 4.

Figure 15C:
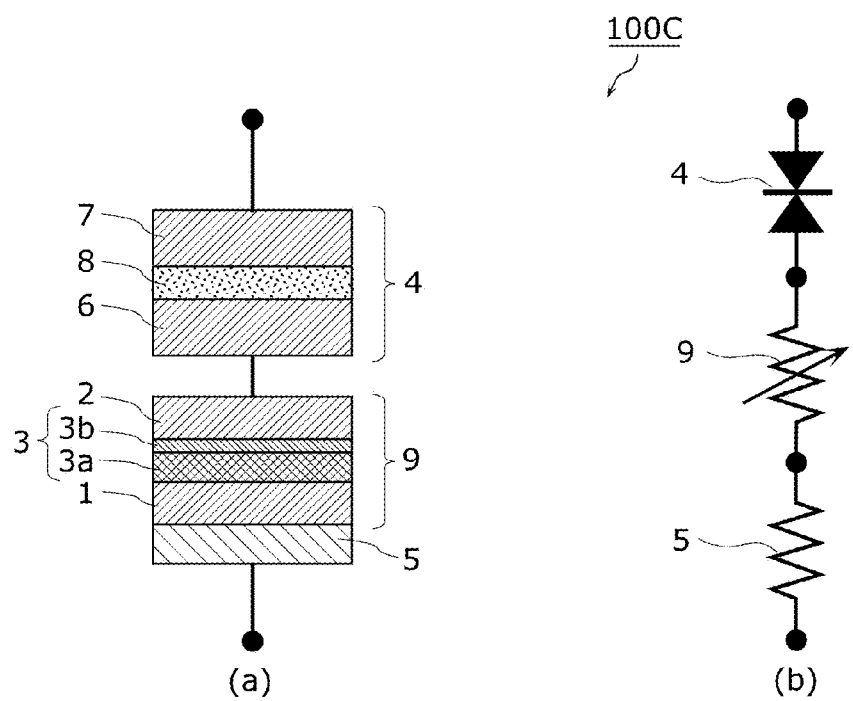
FIG. 15C is a diagram showing an exemplary structure of a nonvolatile memory element and an equivalent circuit of the same according to Embodiment 1 of the present invention.
Figure 15D:
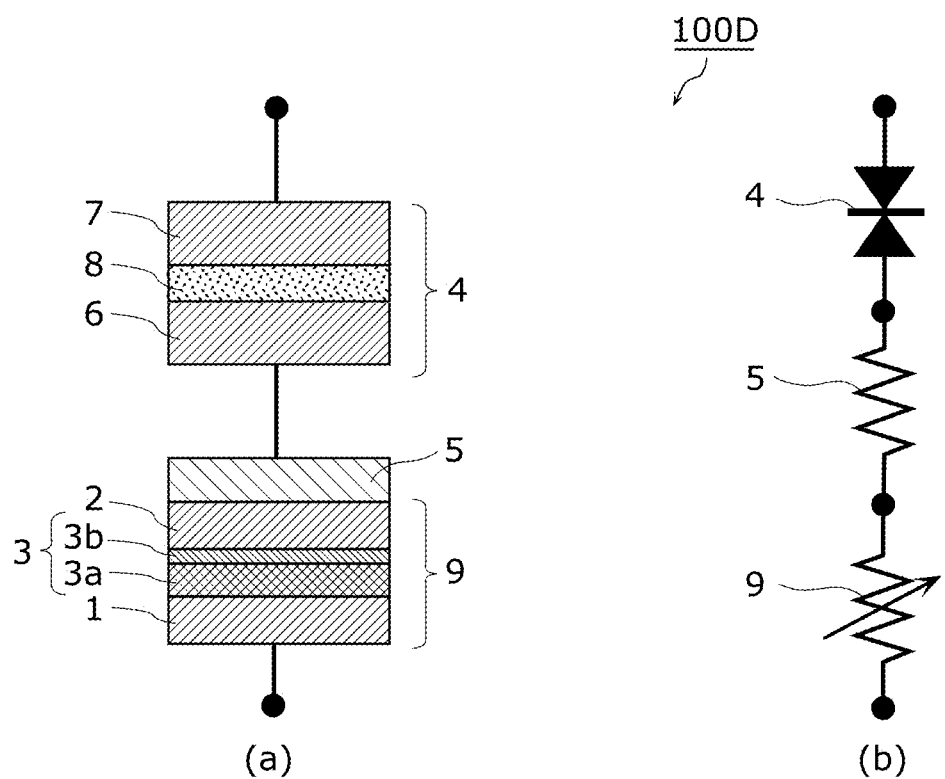
FIG. 15D is a diagram showing an exemplary structure of a nonvolatile memory element and an equivalent circuit of the same according to Embodiment 1 of the present invention.

Moreover, FIG. 15C is a cross-sectional view and an equivalent circuit diagram showing a nonvolatile memory element 100C including a current steering element 10 having a four-layer structure in which the load resistance layer 5 is placed below a lower electrode of the variable resistance element 9. Similarly, FIG. 15D is a cross-sectional view and an equivalent circuit diagram showing a nonvolatile memory element 100D including a current steering element 10 having a four-layer structure in which the load resistance layer 5 is stacked above an upper electrode of the variable resistance element 9.

Here, current-voltage characteristics of the variable resistance element 9 are determined by a work function difference between the variable resistance layer 3 and the second electrode 2 or the first electrode 1, a surface electrode potential, and so on. Thus, the load resistance layer 5 is formed on a side where the load resistance layer 5 is not in contact with the variable resistance layer 3 of the variable resistance element 9.

A material that allows easy composition control and film thickness control and is processable together with the MSM diode 4 by etching is suitable for such a load resistance layer 5. For instance, AlN (aluminum nitride), TiAlN, and so on can be applied as the load resistance layer 5.

The nonvolatile memory element 100, and 100A to 100D are each formed by connecting in series the variable resistance element 9 and the current steering element 10 that are thus structured.

3.2 Method for Manufacturing Nonvolatile Memory Element

The following describes an exemplary method for manufacturing a nonvolatile memory element.

3.2.1 Variable Resistance Element

First, a first electrode 1 having a thickness of 30 nm is formed above a substrate using the sputtering method. Subsequently, a metal oxide layer is formed above the first electrode 1 using the reactive sputtering method in which transition metal target is sputtered in argon gas and oxygen gas.

Here, a degree of oxygen deficiency in the formed metal oxide layer is readily adjusted by varying a flow ratio of oxygen gas to argon gas. It is to be noted that a substrate temperature does not particularly need increasing, and may be a room temperature.

The following describes, as an example, a specific sputtering process when an oxygen-deficient tantalum oxide is used for the variable resistance layer 3.

First, a substrate is placed in a sputtering apparatus, and the inside of the sputtering apparatus is vacuumed up to approximately $7 \times 10^{-4}$ Pa. Then, sputtering is performed while tantalum is used as a target, power is set to 250 W, a total gas pressure obtained by summing up pressures of the argon gas and the oxygen gas is set to 3.3 Pa, and a set temperature of the substrate is set at 30° C. A tantalum oxide layer to be formed preferably has a thickness from 30 to 100 nm. When an oxygen division ratio is changed from 1% to 7%, a degree of oxygen deficiency of tantalum oxide layer is changed from approximately 74% ($TaO_{0.66}$) to approximately 8% ($TaO_{2.3}$).

A composition of the tantalum oxide layer can be measured using the Rutherford back scattering (RBS) method.

Next, a metal oxide layer having a degree of oxygen deficiency lower than the metal oxide layer thus formed is formed above the metal oxide layer by the sputtering method, using the same type of a metal oxide (e.g., $Ta_2O_5$) having a low degree of oxygen deficiency as a target. Alternatively, the surface of the metal oxide layer formed first is modified by oxidizing the topmost surface of the metal oxide layer. With this, a region (a second region) having a low degree of oxygen deficiency is formed on the surface of the metal oxide layer formed first (a first region).

These first and second regions correspond to a first oxide layer 3a and a second oxide layer 3b, respectively. The first oxide layer 3a and the second oxide layer 3b thus formed constitute a variable resistance layer 3.

Next, a second electrode 2 having a thickness of 80 nm is formed above the variable resistance layer 3 thus formed, using the sputtering method, to form a variable resistance element 9.

3.2.2 MSM Diode

Next, a third electrode 6 having a thickness of 50 nm is formed by the sputtering method, to be electrically connected to the second electrode 2.

Subsequently, a silicon nitride that is a semiconductor layer 8 is formed above the third electrode 6 using the reactive sputtering method in which a polycrystal silicon target is sputtered in the argon gas and the nitrogen gas.

Here, a nitrogen content of the silicon nitride, the semiconductor layer 8, can be readily adjusted by varying a flow ratio of the nitrogen gas to the argon gas.

Sputtering is performed while, for instance, power is set to 1300 W, a total gas pressure obtained by summing up pressures of the argon gas and the oxygen gas is set to 0.1 Pa, and a set temperature of the substrate is set at 20° C. When a nitrogen division ratio is changed from 5% to 35%, a nitrogen content of the silicon nitride layer is continuously changed from approximately 9% ($SiN_{0.1}$) to approximately 46% ($SiN_{0.85}$). Moreover, sputtering is performed while, for instance, power is set to 300 W, a total gas pressure obtained by summing up pressures of the argon gas and the oxygen gas is set to 0.4 Pa, and a set temperature of the substrate is set at 20° C. In this case, when a nitrogen division ratio is changed from 10% to 40%, a nitrogen content of the silicon nitride layer is continuously changed from approximately 34% ($SiN_{0.52}$) to approximately 58% ($SiN_{1.38}$). The formed silicon nitride layer preferably has a thickness from 5 to 30 nm.

A composition of the silicon nitride can be measured using the Rutherford back scattering method.

Next, a fourth electrode 7 having a thickness of 50 nm is formed above the semiconductor layer 8 thus formed, using the sputtering method, to form an MSM diode 4 as a current steering element 10. In this way, a nonvolatile memory element 100 is formed in which the current steering element 10 and the variable resistance element 9 are connected in series.

Here, the second electrode 2 and the third electrode 6 may be connected to each other through a contact plug or the like, using a common semiconductor process, or the third electrode 6 may be formed directly above the second electrode 2. The nonvolatile memory element 100 does not limit a structure for electrically connecting the second electrode 2 and the third electrode 6.

Moreover, the current steering element 10 may be formed above the variable resistance element 9, or conversely the variable resistance element 9 may be formed above the current steering element 10. It is satisfactory that the current steering element 10 and the variable resistance element 9 are connected in series, and it is not limited which one of the current steering element 10 and the variable resistance element 9 is above or below with respect to the substrate.

3.2.3 Load Resistor

The common semiconductor process makes it possible to form, as the load resistor 5, a fixed resistor outside the MSM diode 4, using a contact chain or the like.

A method for obtaining desired series resistance by routing an N-type or P-type impurity diffused layer or a metal line having a relatively high resistance such as polysilicon is considered as a similar structure.

On the other hand, when a stack structure of the MSM diode 4 and the variable resistance element 9 is formed as a load resistance layer 5, a resistance value of the load resistor 5 is set by adjusting a film thickness and a composition of the load resistance layer 5.

When AlN is used for the load resistance layer 5, an $N_2/Ar$ flow ratio at a time of reactive sputtering is adjusted. For example, when the $N_2/Ar$ flow ratio=11%, it is possible to form an AlN thin film having a specific resistance of 1000 m$\Omega$×cm. When a load resistance value Rx=1000$\Omega$ is desired, the film thickness may be set to 25 nm.

Similarly, when TiAlN is used for the load resistance layer 5, a TiAlN thin film having a load resistance value Rx=1000$\Omega$ is formed by forming, using the sputtering method, a thin film having a specific resistance of 500 m$\Omega$×cm, and setting a film thickness of the same to 50 nm.

When a load resistance value Rx=500$\Omega$ is desired, each of the film thicknesses may be reduced by ½. When a load resistance value Rx=100$\Omega$ is desired, each film thickness may be reduced by ¹/₁₀.

Moreover, TaN can be used for the load resistance layer 5 in the same manner as the third electrode 6 and the fourth electrode 7 of the MSM diode 4. Normally, the third electrode 6 and the fourth electrode 7 of the MSM diode 4 are formed to have as low resistance as possible, and thus a specific resistance is set to approximately 0.2 m$\Omega$×cm with an $N_2/Ar$ flow ratio=approximately 30%. Here, when a film thickness of TaN is 50 nm, a series resistance of each of the upper and lower electrodes is 0.4$\Omega$.

As with the case of AlN, it is possible to readily form a TaN thin film having a high specific resistance by increasing an $N_2$ flow amount in an $N_2/Ar$ flow ratio at a time of reactive sputtering. For instance, it is possible to form the TaN thin film having a specific resistance 100 m$\Omega$×cm, by setting the $N_2/Ar$ flow ratio=40% or so. When a load resistance value Rx=1000$\Omega$ is desired, a film thickness of each TaN may be set to 250 nm. When Rx=100$\Omega$ is desired, the film thickness may be set to 25 nm.

A stack structure of TaN having the low specific resistance and TaN having the high specific resistance produces an advantage of reducing manufacturing costs because the TaN layers can be continuously formed while changing a flow ratio at a time of sputtering.

Although the load resistance layer 5 is formed to be in contact with a corresponding one of the first to fourth electrodes in a corresponding one of the nonvolatile memory elements 100A to 100D shown in FIG. 15A to FIG. 15D, a plurality of the load resistance layers 5 may be formed as necessary.

Moreover, materials for the load resistance layer 5 are not limited to the above materials. In Embodiment 1 of the present invention, the load resistance layer 5 may be a film having an effective and appropriate resistance value, e.g., a resistance value approximately from 100 to 5000$\Omega$ in an area of 0.5×0.5 μm.

3.3 Method for Programming Nonvolatile Memory Element

Next, a method for programming the nonvolatile memory element 100 thus structured according to Embodiment 1 of the present invention is described.

The following separately describes an initialization step and a normal resistance change operation (hereinafter, referred to as a normal operation). For the sake of convenience, the normal operation is described first, and the initialization step is described subsequently.

3.3.1 Normal Operation

A normal operation of the nonvolatile memory element 100 is described. Hereinafter, a case where a resistance value of the variable resistance layer 3 is a predetermined high value (e.g., a measured voltage is 3.0 V at 200 to 500 k$\Omega$) is referred to as a high resistance state, and a case where a resistance value of the variable resistance layer 3 is a predetermined low value (e.g., a measured voltage is 3.0 V at 100 to 150 k$\Omega$) is referred to as a low resistance state.

The normal operation includes the following three steps: a writing step for changing the variable resistance layer 3 from the high resistance state to the low resistance state; an erasing step for changing the variable resistance layer 3 from the low resistance state to the high resistance state; and a reading step for determining whether the variable resistance layer 3 is in the low resistance state or the high resistance state.

In the writing step, a write voltage pulse having a polarity (having a voltage amplitude greater than or equal to an absolute value of a write threshold voltage) is applied to the nonvolatile memory element 100, the polarity causing the second electrode 2 to be negative with reference to the first electrode 1. Hereinafter, such a polarity is referred to as a negative polarity for the sake of convenience. The voltage applied to the nonvolatile memory element 100 is determined to cause an absolute value of a divided voltage applied to the variable resistance element 9 to be greater than a predetermined write threshold voltage (a low resistance writing start voltage). A resistance value of the variable resistance layer 3 decreases because the application of such a write pulse reduces oxygen ions included in the second oxide layer 3b (to be precise, the filament in the second oxide layer 3b), and the variable resistance layer 3 changes from the high resistance state to the low resistance state.

In the erasing step, an erase voltage pulse having a polarity (having a voltage amplitude greater than or equal to an absolute value of an erase threshold voltage) is applied to the nonvolatile memory element 100, the polarity causing the second electrode 2 to be positive with reference to the first electrode 1. Hereinafter, such a polarity is referred to as a positive polarity for the sake of convenience. The voltage applied to the nonvolatile memory element 100 is determined to cause an absolute value of a divided voltage applied to the variable resistance element 9 to be greater than a predetermined erase threshold voltage (a high resistance writing start voltage). The application of such an erase pulse increases a resistance value of the variable resistance layer 3, and thus the variable resistance layer 3 changes from the low resistance state to the high resistance state.

It is to be noted that in the case where the variable resistance layer 3 is in the low resistance state, even when a voltage pulse having the same negative polarity as the polarity of the write voltage pulse is applied between the first electrode 1 and the second electrode 2, the variable resistance layer 3 remains in the low resistance state. Likewise, in the case where the variable resistance layer 3 is in the high resistance state, even when a voltage pulse having the same positive polarity as the polarity of the erase voltage pulse is applied between the first electrode 1 and the second electrode 2, the variable resistance layer 3 remains in the high resistance state.

In the reading step, a read voltage pulse having an absolute value smaller than those of the write threshold voltage and the erase threshold voltage is applied between the first electrode 1 and the second electrode 2, and a read current resulting from the application is compared to a reference current. This determines whether the resistance state of the variable resistance element 9 is the high resistance state or the low resistance state.

3.3.2 Initialization Step

As stated above, the initialization step is a process of applying, to the variable resistance element 9, a voltage pulse having an absolute value greater than that of a voltage pulse used for normal operation, to decrease a resistance value of the variable resistance element 9 to be within a resistance value range which allows the normal operation with an initial resistance value.

The method for programming according to Embodiment 1 of the present invention is characterized in that when such an initialization step is executed, the MSM diode 4 and the load resistor 5 are connected in series.

Moreover, the method for programming according to Embodiment 1 of the present invention is applied to the variable resistance element 9 that has a high initial resistance value because the interface between the second electrode 2 and the second oxide layer 3b is made substantially flat. Therefore, an assumption is that an initialization voltage pulse especially having a large absolute value is used in the initialization step.

In the initialization step, when the resistance value is decreased to be within the resistance value range for the normal operation in a state where the initialization voltage pulse having the large absolute value is applied to the nonvolatile memory element 100, there is a high risk that a divided voltage of the applied voltage pulse which is applied to the current steering element 10, a current flowing through the current steering element 10, or both exceed the rating of the current steering element 10.

As stated above, when the current steering element 10 includes the MSM diode 4 and the load resistor 5 that are connected in series, it is possible to significantly reduce the breakdown current of the MSM diode. In other words, in Embodiment 1 of the present invention, it is characterized that in the initialization step, the initialization voltage pulse is applied to the series circuit in which the load resistor 5 is connected in series with the MSM diode 4 and the variable resistance element 9.

As a result, the method for programming according to Embodiment 1 of the present invention makes it possible to reduce the risk that the current steering element 10 is broken in the initialization step.

3.4 Examples

The following describes in detail the nonvolatile memory element 100 and the method for programming the same according to this embodiment, using examples. However, the present invention is not limited to these examples.

In this example, the nonvolatile memory element 100 is formed under the following conditions, and its electrical characteristics are actually measured.

In the nonvolatile memory element 100, the second electrode 2 and the variable resistance layer 3 each have a size of 0.5 μm×0.5 μm (an area of 0.25 μm$^2$), and a part at which the first electrode 1 and the variable resistance layer 3 are in contact with each other also has a size of 0.5 μm×0.5 μm (an area of 0.25 μm$^2$). In addition, the fourth electrode 7 and the semiconductor layer 8 each have a size of 0.5 μm×0.5 μm (an area of 0.25 μm$^2$), and a part at which the third electrode 6 and the semiconductor layer 8 are in contact with each other also has a size of 0.5 μm×0.5 μm (an area of 0.25 μm$^2$).

The first electrode 1 comprises TaN and has a thickness of 30 nm. The second electrode 2 comprises Ir and has a thickness of 80 nm. The first oxide layer 3a has a composition expressed as TaO$_x$ (x=1.54), and the second oxide layer 3b has a composition expressed as TaO$_y$ (y=2.47). Moreover, the variable resistance layer 3 has a thickness of 50 nm, the first oxide layer 3a has a thickness of 46 nm, and the second oxide layer 3b has a thickness of 4 nm.

The third electrode 6 and the fourth electrode 7 each comprise TaN and have a thickness of 50 nm. The semiconductor layer 8 comprises silicon nitride, and has a composition expressed as SiN$_z$ (z=0.3) and a thickness of 20 nm.

The load resistor 5 is a commercially-available resistor of 5 kΩ. The load resistor 5 is placed outside of the substrate 23, and is connected in series with the MSM diode 4 and the variable resistance element 9.

Figure 16:
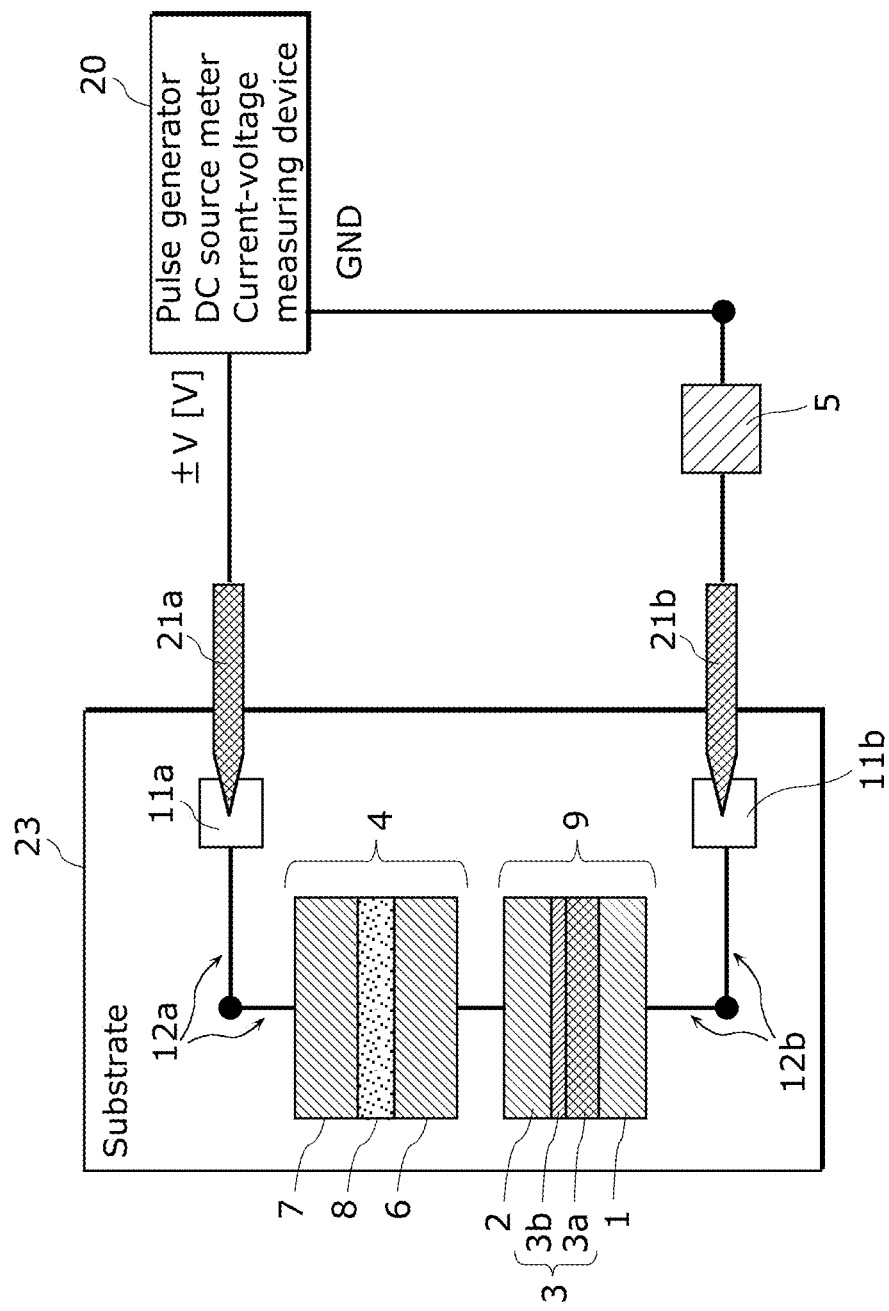
FIG. 16 is a schematic diagram illustrating a measurement system of a current steering element according to Embodiment 1 of the present invention.

FIG. 16 shows a specific measuring system.

In the measuring system shown in FIG. 16, the variable resistance element 9 and the MSM diode 4 are connected in series on the substrate 23. The fourth electrode 7 of the MSM diode 4 and the first electrode 1 of the variable resistance element 9 are connected to the metal pads for measuring needles 11a and 11b through the metal lines 12a and 12b.

As the measuring system, a pulse generator for generating a voltage pulse, a source meter for supplying a voltage, and the measuring device 20 such as a current-voltage measuring device are connected to the probe needles 21a and 21b. The probe needles 21a and 21b are connected to the variable resistance element 9 and the MSM diode 4 through the metal pads for measuring needles 11a and 11b.

Moreover, the load resistor 5 is inserted between the probe needle 21b and the measuring device 20. The load resistor 5 is a common resistor on the market, and has a resistance value of 5 kΩ.

In this manner, the nonvolatile memory element 100 is formed in which the MSM diode 4, the variable resistance element 9, and the load resistor 5 are connected in series. The current-voltage characteristics of the nonvolatile memory element 100 can be measured using the measuring system.

3.4.1 Initialization Step

Negative Break Start

To observe behavior of the nonvolatile memory element 100 in the initialization step, voltage pulses having the negative polarity are applied to the nonvolatile memory element 100 while being increased from 0.1 V to 7.0 V by 0.1 V step and subsequently decreased to 0.1 V, the negative polarity causing the second electrode 2 to be negative with reference to the first electrode 1. Then, a current that flows through the nonvolatile memory element 100 during the application of each of the voltage pulses and a resistance value of the nonvolatile memory element 100 after the application of each voltage pulse are measured every time the application is performed. It is to be noted that the resistance values are measured at 3.0 V.

Figure 17A:
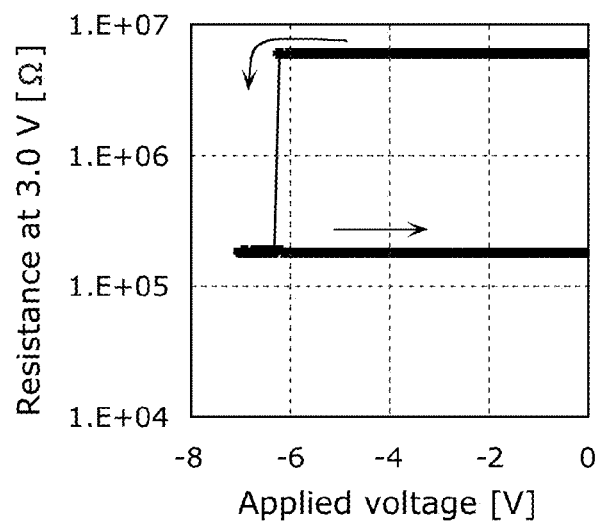
FIG. 17A is a graph showing a resistance value of a nonvolatile memory element in response to application of a voltage pulse in an initialization step according to Embodiment 1 of the present invention.
Figure 17B:
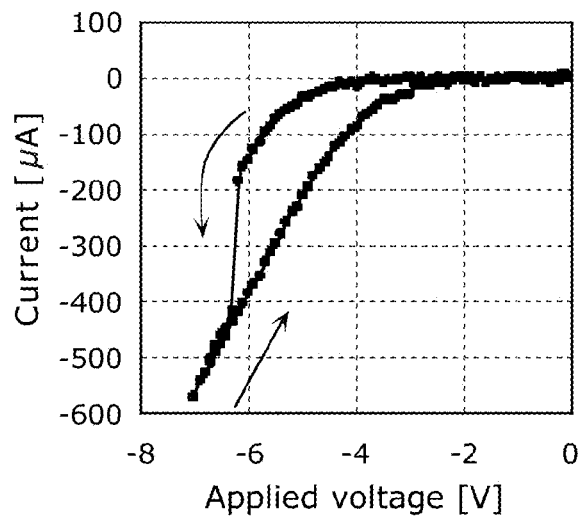
FIG. 17B is a graph showing current of a nonvolatile memory element in response to application of a voltage pulse in an initialization step according to Embodiment 1 of the present invention.

FIG. 17A is a graph showing a resistance value of the nonvolatile memory element 100 which is measured in response to the application of each voltage pulse. FIG. 17B is a graph showing a current of the nonvolatile memory element 100 which is measured in response to the application of each voltage pulse. Each voltage pulse has a pulse width of 500 ns.

As shown in FIG. 17A, it is clear that the applications of the voltage pulses having amplitudes of 0.1 V to 6.2 V fail to vary the resistance value of the nonvolatile memory element 100 from an initial resistance value of approximately 6.1 MΩ, and the application of the voltage pulse having the amplitude of 6.3 V rapidly decreases the resistance value.

Here, the resistance value of the nonvolatile memory element 100 is approximately 180 kΩ with a measured voltage of 3.0 V. Thus, it is possible to recognize that the nonvolatile memory element 100 has changed to the low resistance state based on the initial resistance value.

It is clear from FIG. 17B that an initialization current, a current necessary for initializing the variable resistance element 9, is greater than 185 µA, the largest value of a current with which a resistance change is not caused. Immediately after the variable resistance element 9 is initialized, a current of 414 µA flows through the nonvolatile memory element 100, and a current of 570 µA finally flows through the same when an amplitude is 7.0 V.

Next, voltage pulses having the positive polarity are applied to the nonvolatile memory element 100 while an amplitude of each of the voltage pulses is increased from 0.1 V to 7.5 V by 0.1 V step and subsequently decreased to 0.1 V, the positive polarity causing the second electrode 2 to be positive with reference to the first electrode 1. Then, a current that flows through the nonvolatile memory element 100 during the application of each of the voltage pulses and a resistance value of the nonvolatile memory element 100 after the application of each voltage pulse are measured every time the application is performed. It is to be noted that the resistance values are measured at 3.0 V.

Figure 17C:
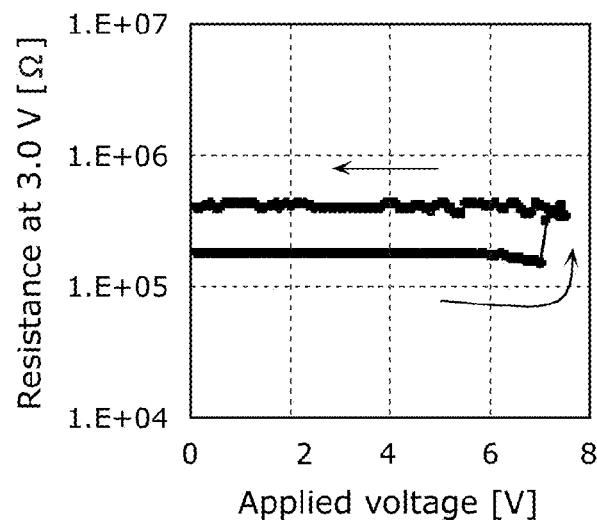
FIG. 17C is a graph showing a resistance value of a nonvolatile memory element in response to application of a voltage pulse in an initialization step according to Embodiment 1 of the present invention.
Figure 17D:
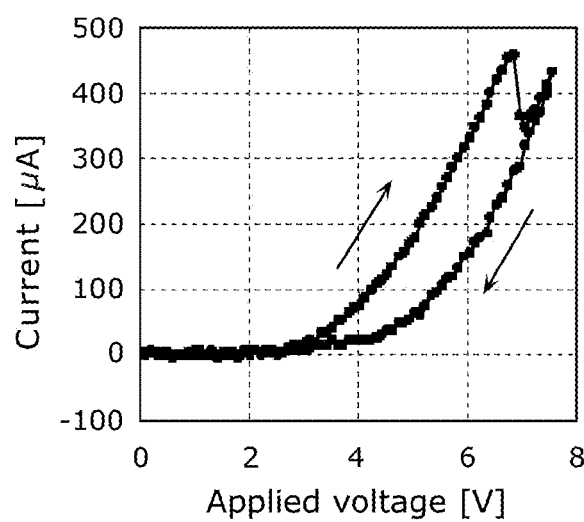
FIG. 17D is a graph showing current of a nonvolatile memory element in response to application of a voltage pulse in an initialization step according to Embodiment 1 of the present invention.

FIG. 17C is a graph showing a resistance value of the nonvolatile memory element 100 which is measured in response to the application of each voltage pulse. FIG. 17D is a graph showing a current of the nonvolatile memory element 100 which is measured in response to the application of each voltage pulse. Each voltage pulse has a pulse width of 500 ns.

As shown in FIG. 17C, it is clear that the applications of the voltage pulses having the amplitudes of 0.1 V to 7.0 V gradually decrease the resistance value of the nonvolatile memory element 100 from approximately 180 kΩ to approximately 150 kΩ, and the application of the voltage pulse having the amplitude of 7.1 V rapidly increases the resistance value to approximately 400 kΩ. Thus, it is possible to recognize that the nonvolatile memory element 100 has changed from the low resistance state to the high resistance state, based on the resistance value.

At this time, it is possible to find that the largest value of the current flowing through the nonvolatile memory element 100 is approximately 460 µA.

The initialization step is described as above, and it is possible to cause the nonvolatile memory element 100 to operate with 200 µA or less after the initialization step.

3.4.2 Writing Step and Erasing Step

Here, the current steering element 10 includes only the MSM diode 4 by removing the load resistor 5 from the same.

Next, voltage pulses having the negative polarity are applied to the nonvolatile memory element 100 while an amplitude of each of the voltage pulses is increased from 0.1 V to 4.0 V by 0.1 V step and subsequently decreased to 0.1 V, the negative polarity causing the second electrode 2 to be negative with reference to the first electrode 1. Then, a current that flows through the nonvolatile memory element 100 during the application of each of the voltage pulses and a resistance value of the nonvolatile memory element 100 after the application of each voltage pulse are measured every time the application is performed.

Figure 18A:
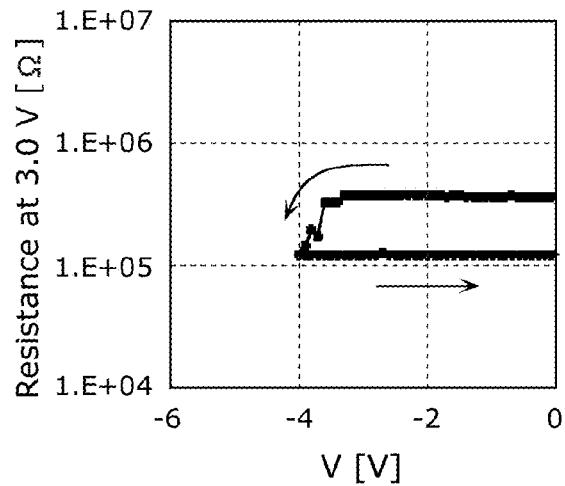
FIG. 18A is a graph showing a resistance value of a nonvolatile memory element in response to application of a voltage pulse in a writing step according to Embodiment 1 of the present invention.
Figure 18B:
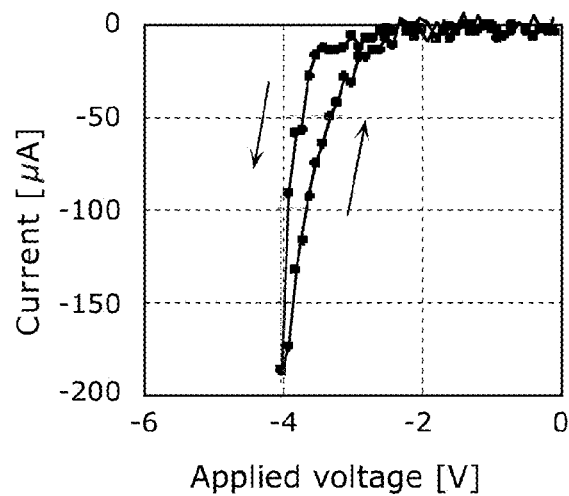
FIG. 18B is a graph showing current of a nonvolatile memory element in response to application of a voltage pulse in a writing step according to Embodiment 1 of the present invention.

FIG. 18A is a graph showing a resistance value of the nonvolatile memory element 100 which is measured in response to every application of each voltage pulse, and FIG. 18B is a graph showing a current of the nonvolatile memory element 100 which is measured in response to every application of each voltage pulse. Each voltage pulse has a pulse width of 500 ns.

The applications of the voltage pulses having the amplitudes 0.1 V to 3.3 V hardly vary the resistance value of the nonvolatile memory element 100. The resistance value remains at approximately 400 kΩ (the high resistance state). Subsequently, the application of the voltage pulse having the amplitude 3.4 V or more gradually decreases the resistance value, and the application of the voltage pulse having the amplitude of 4.0 V decreases the resistance value to approximately 120 kΩ (the low resistance state). Then, even when a voltage pulse having a small amplitude is applied, the low resistance state is kept. This step is the writing step.

It is clear from FIG. 18B that the largest value of the current flowing then is approximately 190 µA.

Next, voltage pulses having the positive polarity are applied to the nonvolatile memory element 100 while an amplitude of each of the voltage pulses is increased from 0.1 V to 5.0 V by 0.1 V step and subsequently decreased to 0.1 V, the positive polarity causing the second electrode 2 to be positive with reference to the first electrode 1. Then, a current that flows through the nonvolatile memory element 100 during the application of each of the voltage pulses and a resistance value of the nonvolatile memory element 100 after the application of each voltage pulse are measured every time the application is performed.

Figure 18C:
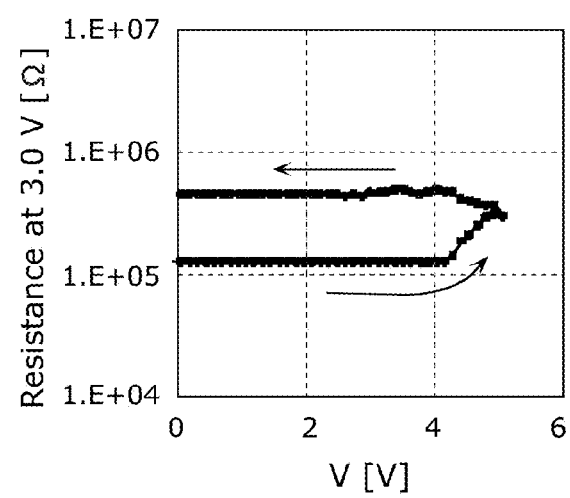
FIG. 18C is a graph showing a resistance value of a nonvolatile memory element in response to application of a voltage pulse in an erasing step according to Embodiment 1 of the present invention.
Figure 18D:
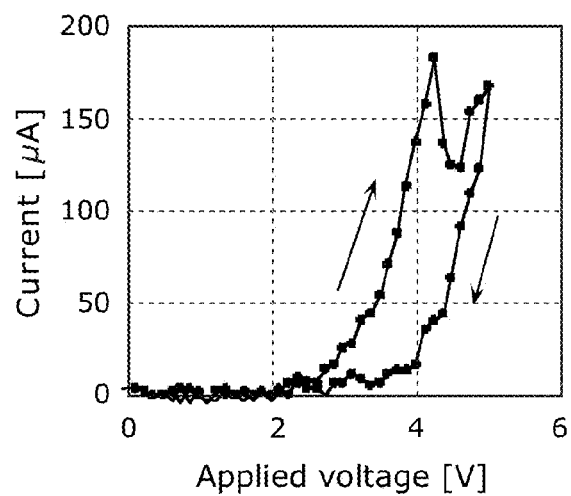
FIG. 18D is a graph showing current of a nonvolatile memory element in response to application of a voltage pulse in an erasing step according to Embodiment 1 of the present invention.

FIG. 18C is a graph showing a resistance value of the nonvolatile memory element 100 which is measured in response to every application of each voltage pulse, and FIG. 18D is a graph showing a current of the nonvolatile memory element 100 which is measured in response to every application of each voltage pulse. Each voltage pulse has a pulse width of 500 ns.

The applications of the voltage pulses having the amplitudes 0.1 V to 4.1 V hardly vary the resistance value of the nonvolatile memory element 100. The resistance value remains at approximately 120 kΩ (the low resistance state). Subsequently, the application of the voltage pulse having the amplitude of 4.2 V or more increases the resistance value, and further application of up to the voltage pulse having the amplitude of 5.0 V increases the resistance value to approximately 300 kΩ (the high resistance state). Then, when a voltage pulse having a small amplitude is applied, the resistance value reaches approximately 450 kΩ, and the high resistance state is kept. This step is the erasing step.

It is clear from FIG. 18D that the largest value of the current flowing then is approximately 180 µA.

Figure 19:
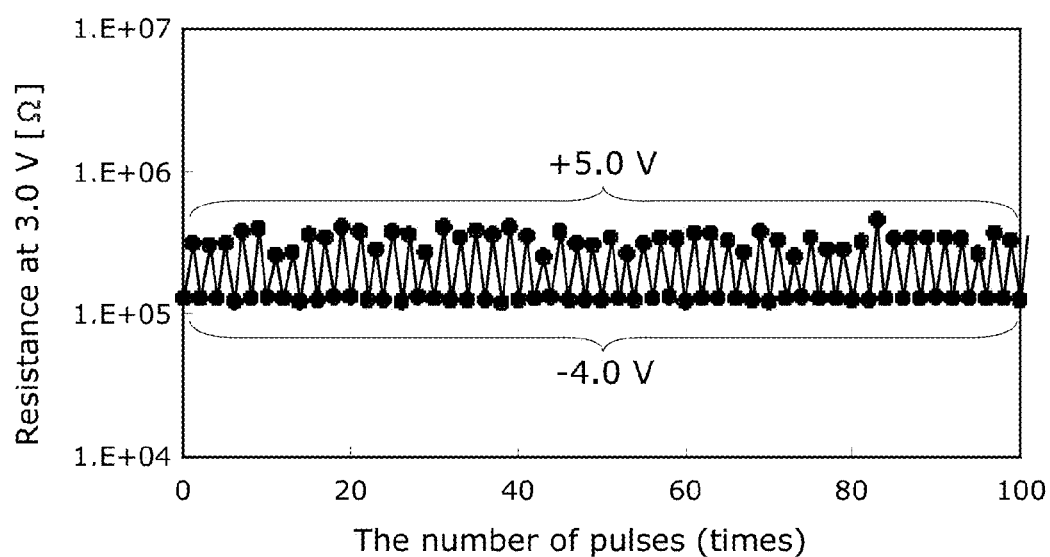
FIG. 19 is a graph showing resistance change characteristics when a nonvolatile memory element is repeatedly operated according to Embodiment 1 of the present invention.

FIG. 19 is a graph showing a situation of a resistance change when an operation is repeated with a write voltage of −4.0 V and an erase voltage of 5.0 V. Each voltage pulse has a pulse width of 500 ns.

It is clear that the operation is stable between the low resistance state (approximately 120 kΩ) and the high resistance state (240 kΩ to 430 kΩ), based on the resistance values.

3.5 Modifications of Examples

Although the initialization step is started by applying the voltage pulses having the negative polarity in the examples, the initialization step can be started by applying voltage pulses having the positive polarity.

The following describes such a method. It is to be noted that the nonvolatile memory element 100 is structured in the same manner as in the examples, and the load resistor 5 is placed outside of the substrate 23 and connected in series with the MSM diode 4 and the variable resistance element 9 as shown in FIG. 8B. Moreover, the load resistor 5 is a commercially-available resistor of 5 kΩ.

3.5.1 Initialization Step

Positive Break Start

To observe behavior of the nonvolatile memory element 100 in the initialization step, voltage pulses having the positive polarity are applied to the nonvolatile memory element 100 while being increased from 0.1 V to 7.5 V by 0.1 V step and subsequently decreased to 0.1 V, the positive polarity causing the second electrode 2 to be positive with reference to the first electrode 1. Then, a current that flows through the nonvolatile memory element 100 during the application of each of the voltage pulses and a resistance value of the nonvolatile memory element 100 after the application of each voltage pulse are measured every time the application is performed. It is to be noted that the resistance values are measured at 3.0 V.

Figure 20A:
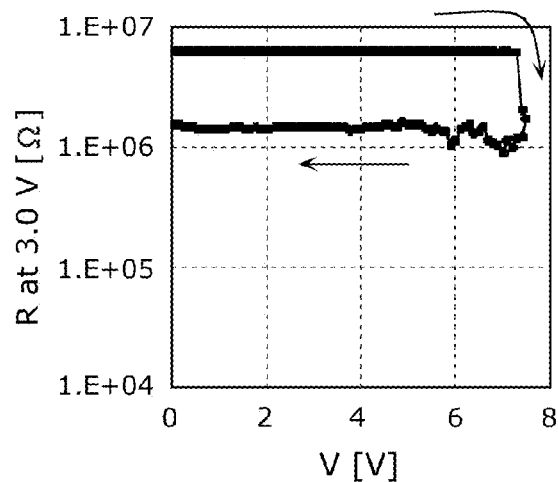
FIG. 20A is a graph showing a resistance value of a nonvolatile memory element in response to application of a voltage pulse in an initialization step according to Embodiment 1 of the present invention.
Figure 20B:
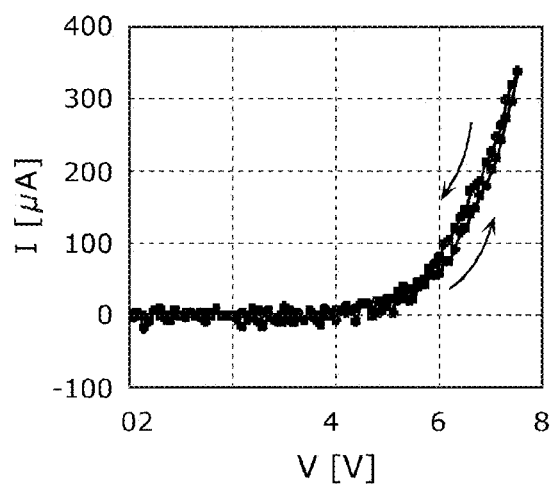
FIG. 20B is a graph showing current of a nonvolatile memory element in response to application of a voltage pulse in an initialization step according to Embodiment 1 of the present invention.

FIG. 20A is a graph showing a resistance value of the nonvolatile memory element 100 which is measured in response to the application of each voltage pulse. FIG. 20B is a graph showing a current of the nonvolatile memory element 100 which is measured in response to the application of each voltage pulse. Each voltage pulse has a pulse width of 500 ns.

As shown in FIG. 20A, it is clear that the applications of the voltage pulses having amplitudes of 0.1 V to 7.3 V fail to vary the resistance value of the nonvolatile memory element 100 from an initial resistance value of approximately 6.4 MΩ, and the application of the voltage pulse having the amplitude of 7.4 V rapidly decreases the resistance value.

Here, the resistance value of the nonvolatile memory element 100 is approximately 2.1 MΩ with a measured voltage of 3.0 V. Thus, it is clear that the resistance value has varied from the initial resistance value to a resistance value higher than that in the high resistance state.

It is clear from FIG. 20B that an initialization current, a current necessary for initializing the variable resistance element 9, is greater than 270 μA, the largest value of a current with which a resistance change is not caused. Immediately after the variable resistance element 9 is initialized, a current of 293 μA flows through the nonvolatile memory element 100, and a current of 334 μA finally flows through the same when an amplitude is 7.0 V.

Next, voltage pulses having the negative polarity are applied to the nonvolatile memory element 100 while an amplitude of each of the voltage pulses is increased from 0.1 V to 5.0 V by 0.1 V step and subsequently decreased to 0.1 V, the negative polarity causing the second electrode 2 to be negative with reference to the first electrode 1. Then, a current that flows through the nonvolatile memory element 100 during the application of each of the voltage pulses and a resistance value of the nonvolatile memory element 100 after the application of each voltage pulse are measured every time the application is performed. It is to be noted that the resistance values are measured at 3.0 V.

Figure 20C:
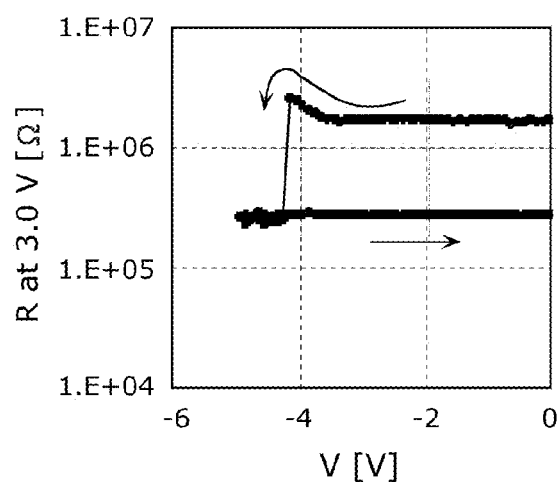
FIG. 20C is a graph showing a resistance value of a nonvolatile memory element in response to application of a voltage pulse in an initialization step according to Embodiment 1 of the present invention.
Figure 20D:
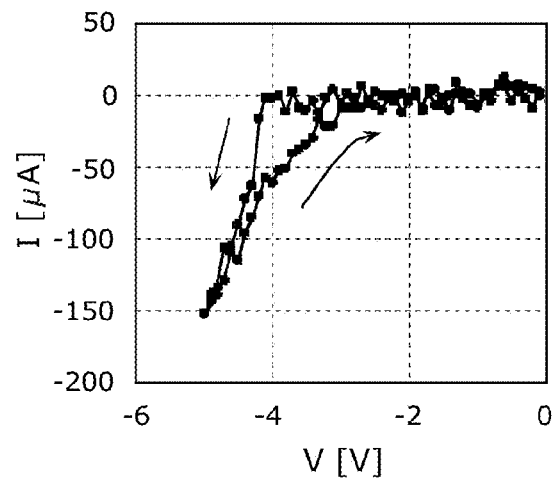
FIG. 20D is a graph showing current of a nonvolatile memory element in response to application of a voltage pulse in an initialization step according to Embodiment 1 of the present invention.

FIG. 20C is a graph showing a resistance value of the nonvolatile memory element 100 which is measured in response to the application of each voltage pulse. FIG. 20D is a graph showing a current of the nonvolatile memory element 100 which is measured in response to the application of each voltage pulse. Each voltage pulse has a pulse width of 500 ns.

As shown in FIG. 20C, it is clear that the applications of the voltage pulses having the amplitudes of 0.1 V to 4.2 V gradually increase the resistance value of the nonvolatile memory element 100 from approximately 1.7 MΩ to approximately 2.5 MΩ, and the application of the voltage pulse having the amplitude of 4.3 V rapidly increases the resistance value to approximately 270 kΩ. Thus, it is clear that the resistance value of the nonvolatile memory element 100 has varied from a level higher than that in the high resistance state to a level slightly higher than that in the low resistance state, and falls into the resistance range for the normal operation.

At this time, it is possible to find that the largest value of the current flowing through the nonvolatile memory element 100 is approximately 150 μA.

The initialization step is described as above, and it is possible to cause the nonvolatile memory element 100 to operate with 150 μA or less after the initialization step.

3.5.2 Writing Step and Erasing Step

Reference Example

Here, as a reference example, an operation is performed while the current steering element 10 includes the load resistor 5 at the time of normal operation.

After the initialization step, voltage pulses having the positive polarity are applied to the nonvolatile memory element 100 while an amplitude of each of the voltage pulses is increased from 0.1 V to 5.5 V by 0.1 V step and subsequently decreased to 0.1 V, the positive polarity causing the second electrode 2 to be positive with reference to the first electrode 1. Then, a current that flows through the nonvolatile memory element 100 during the application of each of the voltage pulses and a resistance value of the nonvolatile memory element 100 after the application of each voltage pulse are measured every time the application is performed.

Figure 21A:
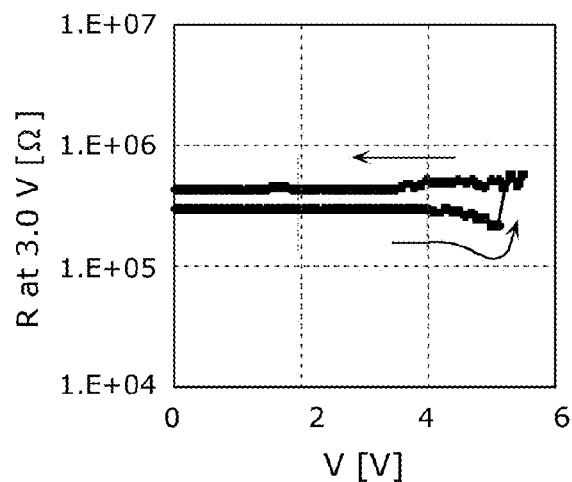
FIG. 21A is a graph showing a resistance value of a nonvolatile memory element in response to application of a voltage pulse in a writing step according to Embodiment 1 of the present invention.
Figure 21B:
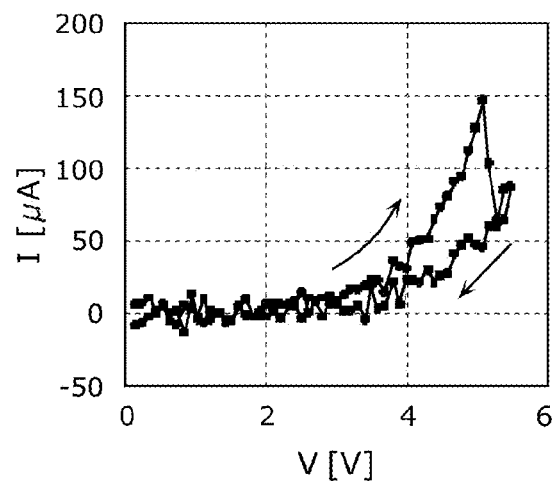
FIG. 21B is a graph showing current of a nonvolatile memory element in response to application of a voltage pulse in a writing step according to Embodiment 1 of the present invention.

FIG. 21A is a graph showing a resistance value of the nonvolatile memory element 100 which is measured in response to every application of each voltage pulse, and FIG. 21B is a graph showing a current of the nonvolatile memory element 100 which is measured in response to every application of each voltage pulse. Each voltage pulse has a pulse width of 500 ns.

The applications of the voltage pulses having the amplitudes of 0.1 V to 5.1 V gradually decrease the resistance value of the nonvolatile memory element 100 from approximately 290 kΩ (a level slightly higher than that in the low resistance state) to approximately 210 kΩ. Subsequently, the application of the voltage pulse having the amplitude of 5.2 V or more rapidly increases the resistance value, and the resistance value reaches approximately 410 kΩ (the high resistance state). Then, even when a voltage pulse having a small amplitude is applied, the high resistance state is kept. This step is the erasing step.

It is clear from FIG. 21B that the largest value of the current flowing then is approximately 150 μA.

Next, voltage pulses having the negative polarity are applied to the nonvolatile memory element 100 while an amplitude of each of the voltage pulses is increased from 0.1 V to 4.5 V by 0.1 V step and subsequently decreased to 0.1 V, the negative polarity causing the second electrode 2 to be negative with reference to the first electrode 1. Then, a current that flows through the nonvolatile memory element 100 during the application of each of the voltage pulses and a resistance value of the nonvolatile memory element 100 after the application of each voltage pulse are measured every time the application is performed.

Figure 21C:
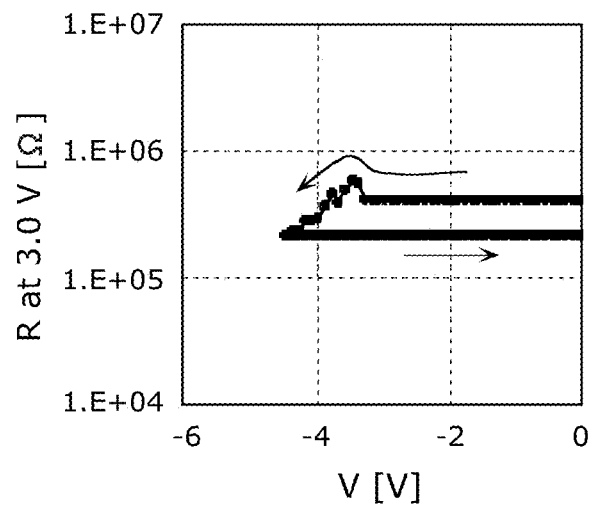
FIG. 21C is a graph showing a resistance value of a nonvolatile memory element in response to application of a voltage pulse in an erasing step according to Embodiment 1 of the present invention.
Figure 21D:
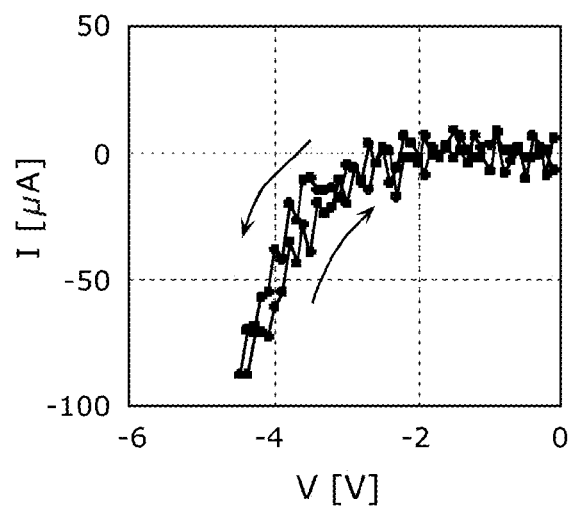
FIG. 21D is a graph showing current of a nonvolatile memory element in response to application of a voltage pulse in an erasing step according to Embodiment 1 of the present invention.

FIG. 21C is a graph showing a resistance value of the nonvolatile memory element 100 which is measured in response to every application of each voltage pulse, and FIG. 21D is a graph showing a current of the nonvolatile memory element 100 which is measured in response to every application of each voltage pulse. Each voltage pulse has a pulse width of 500 ns.

The applications of the voltage pulses having the amplitudes 0.1 V to 3.3 V hardly vary the resistance value of the nonvolatile memory element 100. The resistance value remains at approximately 410 kΩ (the high resistance state). Subsequently, the application of the voltage pulse having the amplitude of 3.5 V or more increases the resistance value, and further application of a voltage pulse having an amplitude from 3.6 to 4.5 V decreases the resistance value to approximately 220 kΩ (the low resistance state). Then, even when a voltage pulse having a small amplitude is applied, the low resistance state is kept. This step is the writing step.

It is clear from FIG. 21D that the largest value of the current flowing then is approximately 86 μA.

Figure 22:
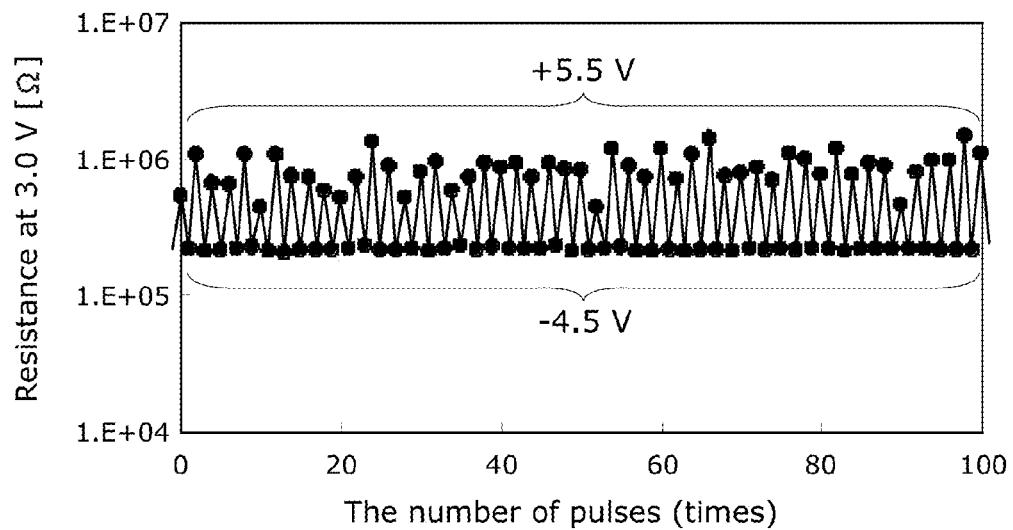
FIG. 22 is a graph showing resistance change characteristics when a nonvolatile memory element is repeatedly operated according to Embodiment 1 of the present invention.

FIG. 22 is a graph showing a situation of a resistance change when an operation is repeated with a write voltage of −4.5 V and an erase voltage of 5.5 V. Each voltage pulse has a pulse width of 500 ns.

It is clear that the operation is stable between the low resistance state (approximately 220 kΩ) and the high resistance state (460 kΩ to 1.5 MΩ), based on the resistance values.

3.5.3 Comparative Example

The following describes, as a comparative example, an operation in the initialization step when the current steering element 10 includes only the MSM diode 4.

Detailed conditions for the nonvolatile memory element 100 and the MSM diode 4 are the same as those in the examples.

To observe behavior of the nonvolatile memory element 100 in the initialization step, voltage pulses having the positive polarity are applied to the nonvolatile memory element 100 while being increased from 0.1 V to 6.0 V by 0.1 V step, the positive polarity causing the second electrode 2 to be positive with reference to the first electrode 1. Then, a current that flows through the nonvolatile memory element 100 during the application of each of the voltage pulses and a resistance value of the nonvolatile memory element 100 after the application of each voltage pulse are measured every time the application is performed. It is to be noted that the resistance values are measured at 3.0 V.

Figure 23A:
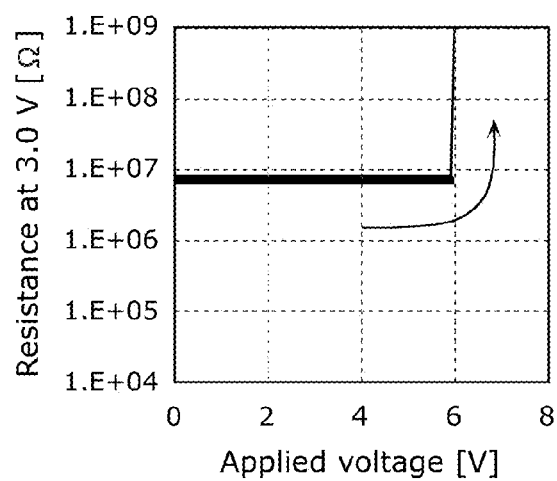
FIG. 23A is a graph showing a resistance value of a nonvolatile memory element in response to application of a voltage pulse in an initialization step according to Embodiment 1 of the present invention.
Figure 23B:
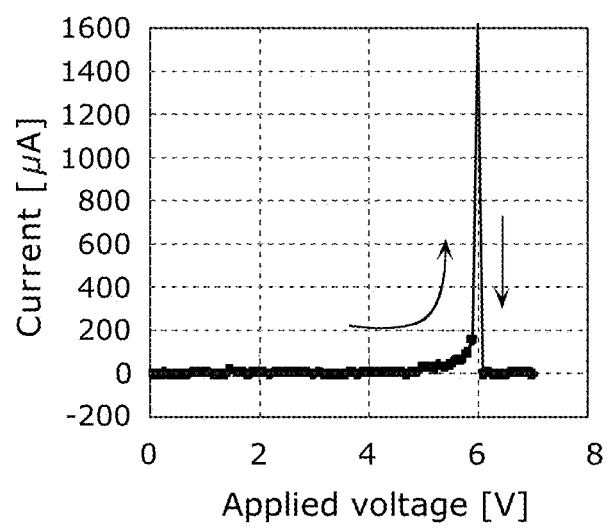
FIG. 23B is a graph showing current of a nonvolatile memory element in response to application of a voltage pulse in an initialization step according to Embodiment 1 of the present invention.

FIG. 23A is a graph showing a resistance value of the nonvolatile memory element 100 which is measured in response to the application of each voltage pulse. FIG. 23B is a graph showing a current of the nonvolatile memory element 100 which is measured in response to the application of each voltage pulse. Each voltage pulse has a pulse width of 500 ns.

As shown in FIG. 23A, it is clear that the applications of the voltage pulses having amplitudes of 0.1 V to 5.9 V fail to vary the resistance value of the nonvolatile memory element 100 from an initial resistance value of approximately 6.7 MΩ, and the application of the voltage pulse having the amplitude of 6.0 V rapidly increases the resistance value by the measurement limit (1 GΩ) or more.

In addition, it is clear from FIG. 23B that a current reaches the measurement limit of 1.6 mA or more when the voltage pulse having the amplitude 6.0 V is applied, and a current is almost 0 when an applied voltage pulse has an amplitude of 6.1 V or more.

It is considered that the resistance value of the variable resistance element 9 starts to decrease with approximately 160 μA or more, the largest value of the current with which the resistance change is not caused, and thus a high voltage exceeding a rated current is rapidly applied to the MSM diode 4, which breaks the MSM diode 4.

It is clear from the above result that the current steering element 10 needs to include the MSM diode 4 and the load resistor 5 connected in series at least when the initialization step in which the high current flows is performed.

4. Embodiment 2

The following describes in detail a nonvolatile memory device according to Embodiment 2 of the present invention, with reference to the drawings.

This nonvolatile memory device includes: a memory cell array in which memory cells each using the nonvolatile memory element 100 described in Embodiment 1 are placed in an array; and a driving unit which drives each of the memory cells according to the method for programming described in Embodiment 1.

4.1 Structure of Nonvolatile Memory Device

Figure 24A:
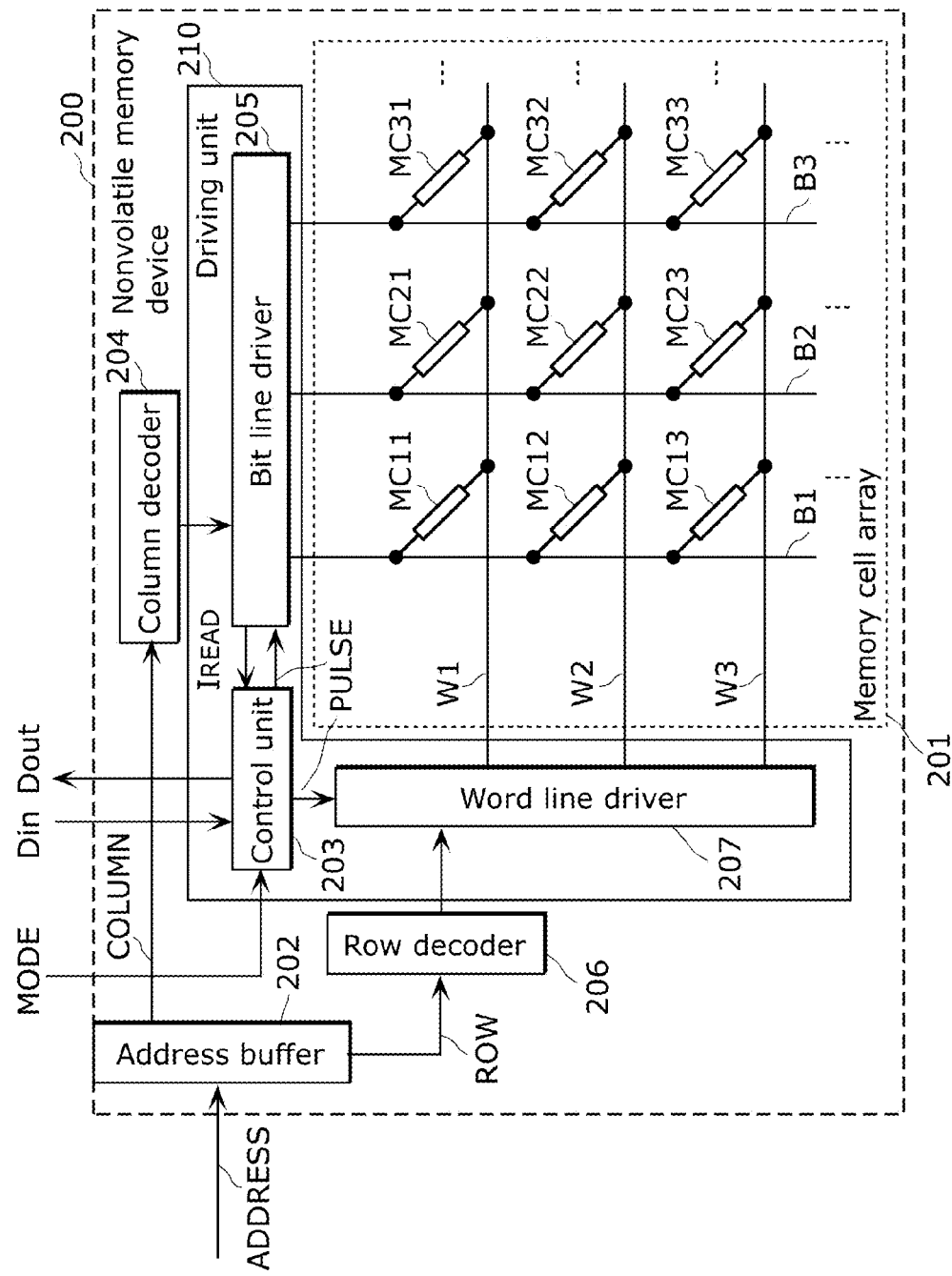
FIG. 24A is a block diagram showing an exemplary structure of a nonvolatile memory device according to Embodiment 2 of the present invention.

FIG. 24A is a block diagram showing a functional structure of a nonvolatile memory device 200 according to Embodiment 2 of the present invention.

As shown in FIG. 24A, the nonvolatile memory device 200 includes a memory cell array 201, an address buffer 202, a control unit 203, a row decoder 206, a word line driver 207, a column decoder 204, and a bit line driver 205. In addition, the nonvolatile memory device 200 normally has, between the column decoder 204 and the memory cell array 201, a sense amplifier (not shown) for measuring a resistance value of a memory cell. Here, the control unit 203, the word line driver 207, and the bit line driver 205 are collectively referred to as a driving unit 210.

As shown in FIG. 24A, the memory cell array 201 includes: word lines WL1, WL2, WL3, . . . which are parallel to each other and formed to extend laterally; and bit lines BL1, BL2, BL3, . . . which cross the word lines WL1, WL2, WL3, . . . , are parallel to each other, and are formed to extend vertically. It is to be noted when these word lines are not specifically distinguished, the word lines are each indicated as a word line WL. When those bit lines are not specifically distinguished, the bit lines are each indicated as a bit line BL.

Here, the word lines WL are formed in a first plane parallel to a main plane of a substrate (not shown). The bit lines BL are formed in a second plane which is above or below the first plane and substantially parallel to the first plane.

For this reason, the word lines WL and the bit lines BL cross each other three-dimensionally. Memory cells MC11, MC12, MC13, MC21, MC22, MC23, MC31, MC32, MC33, . . . are provided for the three-dimensional cross points. It is to be noted that when the memory cells are not specifically distinguished, the memory cells are each indicated as a memory cell MC.

Each of the memory cells MC is the nonvolatile memory element 100 described in Embodiment 1. Specifically, each memory cell MC includes the variable resistance element 9, and the current steering element 10 including the MSM diode 4 and the load resistor 5.

4.1.1 Reference Example

The following describes, as a reference example, an example where an operation is performed while the load resistor 5 remains connected to the variable resistance element 9 and the MSM diode 4 even at a time of a normal operation.

Figure 24B:
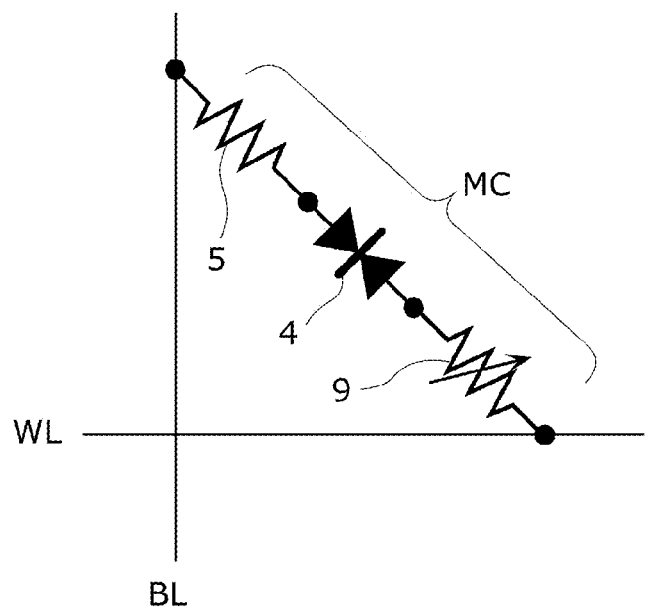
FIG. 24B is a circuit diagram showing a memory cell according to Embodiment 2 of the present invention.
Figure 24C:
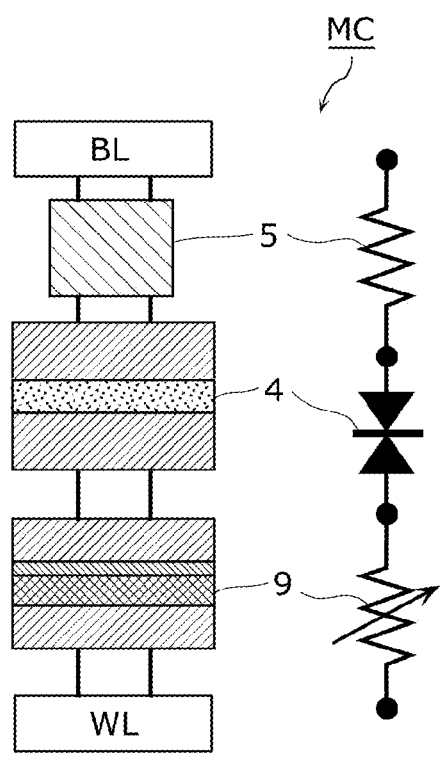
FIG. 24C is a cross-sectional view showing a memory cell according to Embodiment 2 of the present invention.

FIG. 24B is an equivalent circuit diagram of the memory cell MC shown in FIG. 24A. FIG. 24C is a schematic diagram showing a structure of the memory cell MC. Although FIG. 24C shows again the cross section structure of the nonvolatile memory element 100 shown in FIG. 14, the memory cell MC may be any one of the nonvolatile memory elements 100A to 100D shown in FIG. 15A to FIG. 15D.

In Embodiment 2 of the present invention, the low resistance state and the high resistance state of the variable resistance element 9 included in each memory cell MC represent "1" and "0" of 1-bit data, respectively.

The address buffer 202 receives an address signal ADDRESS from an external circuit (not shown), and provides, based on the address signal ADDRESS, a row address signal ROW to the row decoder 206 and a column address signal COLUMN to the column decoder 204. Here, the address signal ADDRESS is a signal indicating an address of a memory cell MC to be selected from among the memory cells MC. Moreover, the row address ROW is a signal indicating a row address out of the address indicated by the address signal ADDRESS. Similarly, the column address COLUMN is a signal indicating a column address.

The control unit 203 receives a mode selection signal MODE and input data Din from the external circuit, and selects one of an initialization mode, a writing mode, and a reading mode according to the mode selection signal MODE. Furthermore, in the writing mode, the control unit 203 selects one of a low resistance writing mode (a "1" writing mode) and a high resistance writing mode (a "0" writing mode) according to the input data Din.

Here, the initialization mode, the low resistance writing mode, and the high resistance writing mode respectively correspond to the initialization step, the writing step, and the erasing step described in Embodiment 1. The control unit 203 determines an appropriate polarity and magnitude of a voltage to be applied to the memory cell MC according to the selected mode, to allow execution of the method for programming described in Embodiment 1. Here, the magnitude of the voltage is determined to be greater or equal to a sum of a voltage to be applied to the variable resistance element 9 and a voltage drop amount occurring in the current steering element 10.

The control unit 203 provides a voltage pulse PULSE to one or both of the word line driver 207 and the bit line driver 205, to apply the voltage pulse having the determined polarity and magnitude to the memory cell MC.

The column decoder 204 receives the column address signal COLUMN from the address buffer 202, and indicates a bit line BL to be selected from among the bit lines BL to the bit line driver 205 according to the column address signal COLUMN.

The row decoder 206 receives the row address signal ROW from the address buffer 202, and indicates a word line WL to be selected from among the word lines WL to the word line driver 207 according to the row address signal ROW.

The word line driver 207 and the bit line driver 205 apply the voltage pulse PULSE provided by the control unit 203, between the indicated word line WL and bit line BL. With this, the voltage pulse having the desired polarity and magnitude is applied to the selected memory cell MC.

The bit line driver 205 includes a sense circuit, and measures a current flowing in the bit line BL in response to the application of the voltage pulse, or a voltage generated in the memory cell MC.

In the reading mode, for instance, the bit line driver 205 measures a current flowing in a bit line in response to application of a read voltage pulse PULSE, generates a signal IREAD representing the measured current value, and provides the generated signal IREAD to the control unit 203. The control unit 203 outputs to the external circuit output data Dout indicating a bit value corresponding to the received signal IREAD.

It is to be noted that although the nonvolatile memory device 200 is described as a single-layer cross point storage device including a one-layer memory cell array in Embodiment 2, the nonvolatile memory device 200 may be a multi-layer cross point storage device including stacked memory cell arrays.

Moreover, the variable resistance element 9, the MSM diode 4, and the load resistor 5 may be switched in terms of a positional relationship.

In addition, between the MSM diode 4 and the load resistor 5 included in the current steering element 10, one load resistor 5 may be provided for each of the bit lines BL or each of the word lines WL, and the load resistor 5 may be commonly used for each bit line BL or each word line WL.

Furthermore, in such a case, when the load resistor 5 includes an ON resistor of a transistor, it is possible to cause the nonvolatile memory device 200 to operate at a lower voltage, by increasing the load resistor 5 in resistance at a time of the initialization step and decreasing the load resistor 5 in resistance at a time of the normal operation.

Figure 25A:
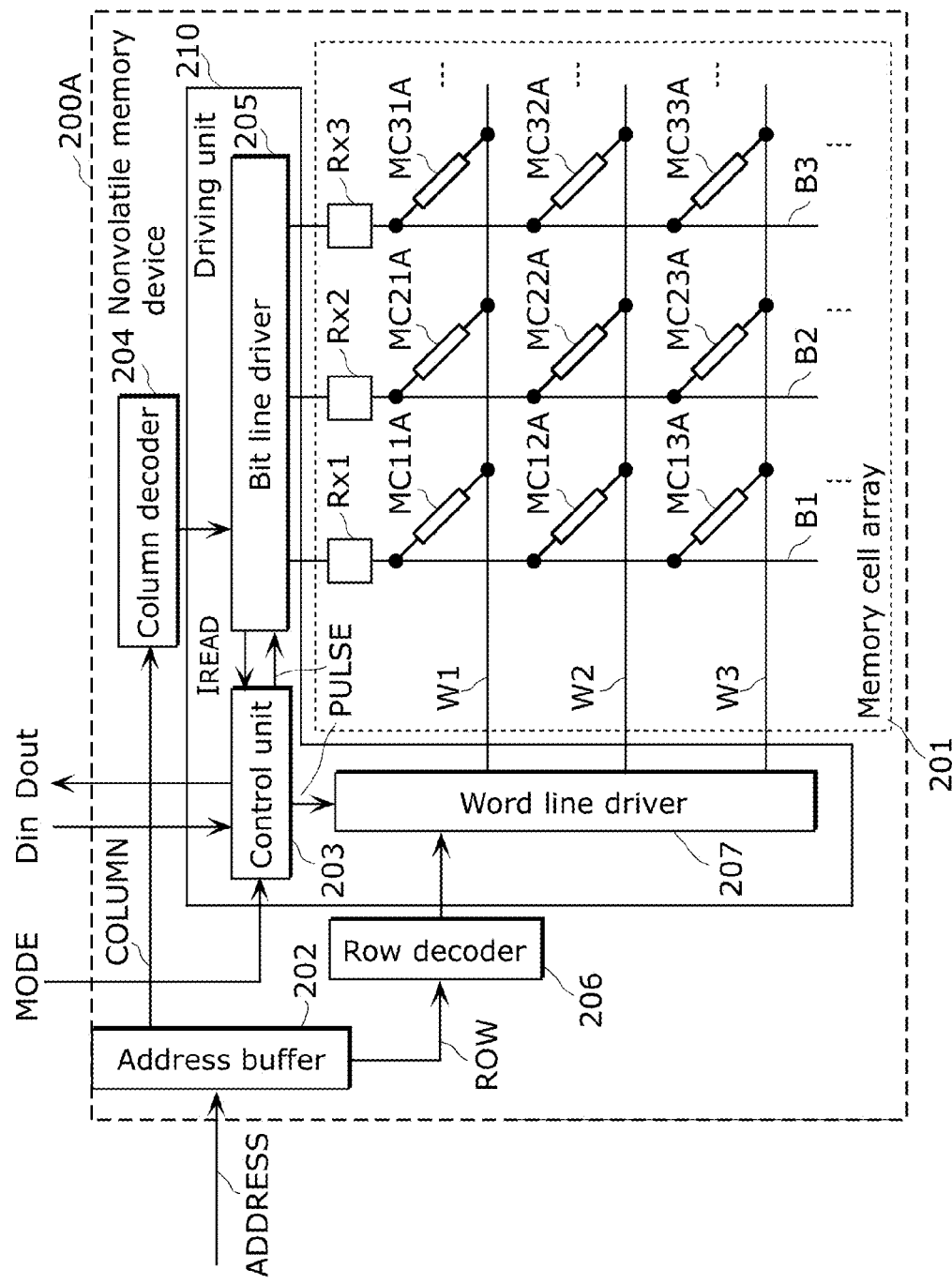
FIG. 25A is a block diagram showing an exemplary structure of a nonvolatile memory device according to Embodiment 2 of the present invention.
Figure 25B:
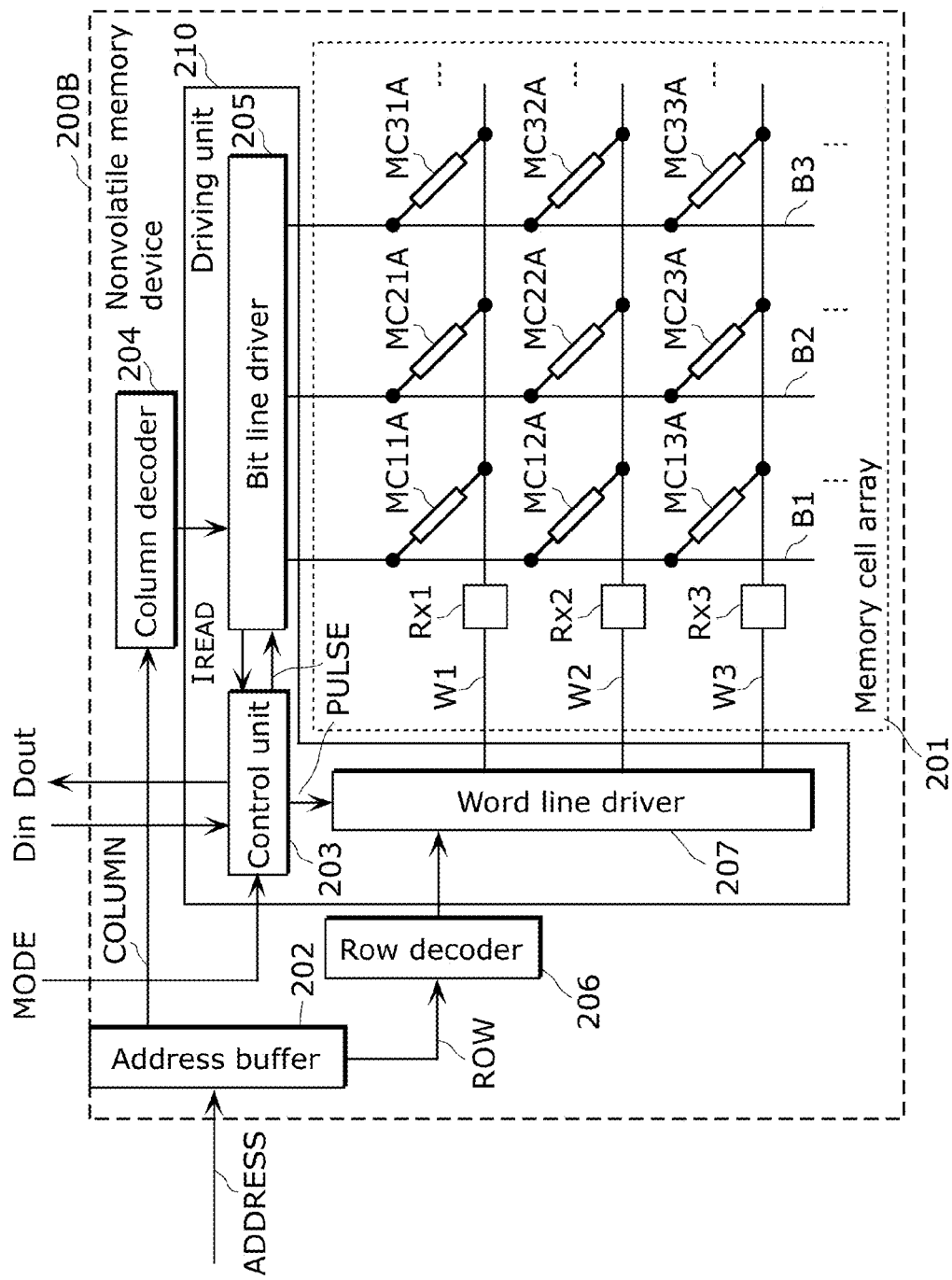
FIG. 25B is a block diagram showing an exemplary structure of a nonvolatile memory device according to Embodiment 2 of the present invention.

FIG. 25A is a diagram showing a structure of a nonvolatile memory device 200A when load resistors Rx1, Rx2, Rx3, . . . are provided on respective bit lines. FIG. 25B is a diagram showing a structure of a nonvolatile memory device 200B when load resistors Rx1, Rx2, Rx3, . . . are provided on respective word lines.

Moreover, the nonvolatile memory devices 200A and 200B each include memory cells MC11A, MC12A, MC13A, MC21A, MC22A, MC23A, MC31A, MC32A, MC33A, . . . instead of the memory cells MC11, MC12, MC13, MC21, MC22, MC23, MC31, MC32, MC33, . . . . It is to be noted that when these memory cells are not specifically distinguished, the memory cells are each indicated as a memory cell MCA.

Figure 25C:
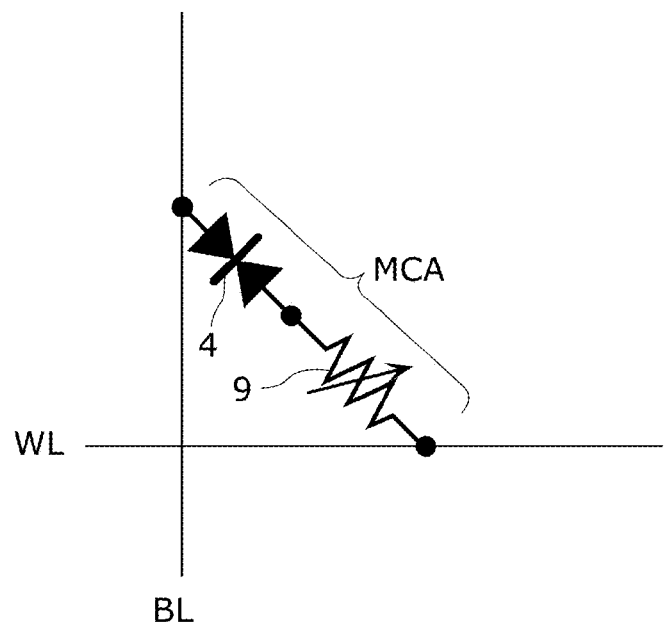
FIG. 25C is a circuit diagram showing a memory cell according to Embodiment 2 of the present invention.
Figure 25D:
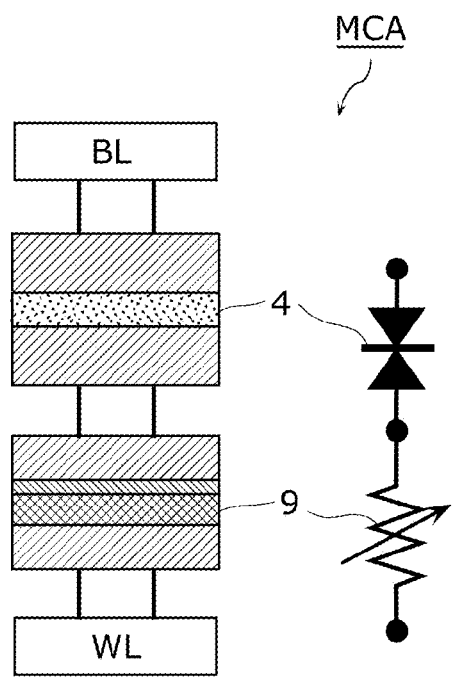
FIG. 25D is a cross-sectional view showing a memory cell according to Embodiment 2 of the present invention.

FIG. 25C is an equivalent circuit diagram of the memory cell MCA shown in FIG. 25A or FIG. 25B. FIG. 25D is a schematic diagram showing a structure of the memory cell MCA.

In this case, each of the memory cells MCA includes the variable resistance element 9 and the MSM diode 4 as shown in FIG. 25C and FIG. 25D.

Moreover, the variable resistance element 9 and the MSM diode 4 may be switched in terms of a positional relationship.

As above, it is possible to reduce an increase in area of the nonvolatile memory device 200 by providing the nonvolatile memory device 5 for each row or each column.

On the other hand, as shown in FIG. 24A to FIG. 24C, it is possible to place the load resistor 5 right near the MSM diode 4 by providing the load resistor 5 for each of the nonvolatile memory elements 100. With this, it is possible to reduce the risk that the MSM diode 4 is broken.

4.1.2 Configuration for Changing Resistance Value of Load Resistor

In the above description, the operation is performed under the conditions that the write voltage is −4.5 V and the erase voltage is 5.5 V, while the load resistor 5 remains connected to the variable resistance element 9 and the MSM diode 4 at the time of the normal operation. On the other hand, in <3.4 Example>, the operation is performed under the conditions that the write voltage is −4.0 V and the erase voltage is 5.0 V, after the load resistor 5 is removed at the time of the normal operation.

When the load resistor 5 is absent at the time of the normal operation, it is possible to reduce an applied voltage proportionally. Thus, it is possible to reduce power consumption. In contrast, when the normal operation is performed while the load resistor 5 remains connected, an applied voltage is slightly increased, but it is possible to sufficiently prevent the diode from being broken at the time of the normal operation.

Figure 26A:
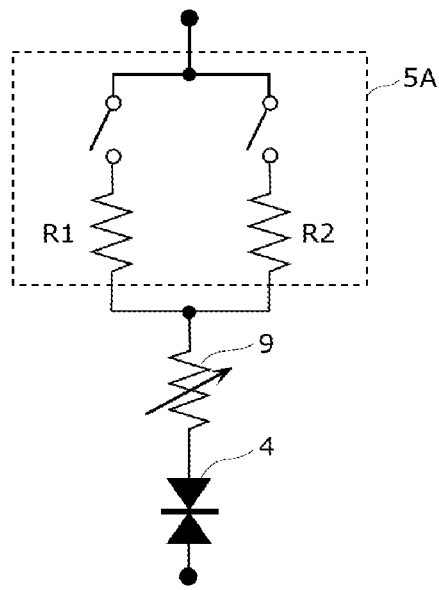
FIG. 26A is a circuit diagram showing variable load resistor according to Embodiment 2 of the present invention.
Figure 26B:
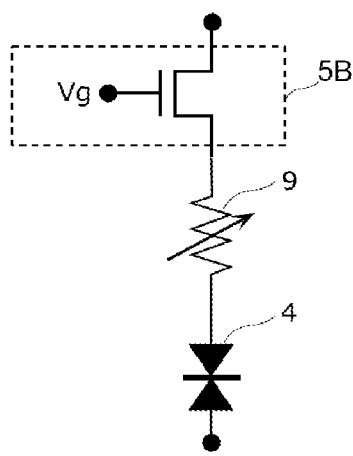
FIG. 26B is a circuit diagram showing variable load resistor according to Embodiment 2 of the present invention.
Figure 27:
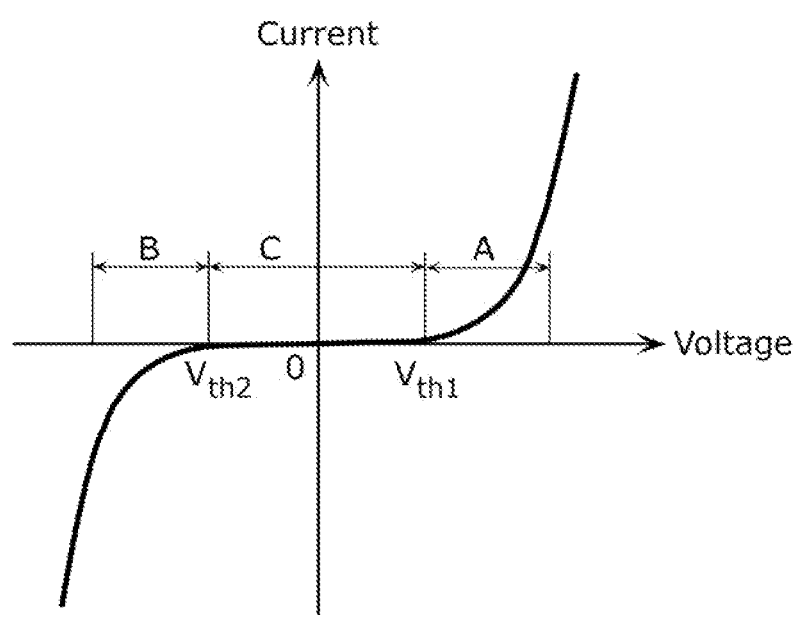
FIG. 27 is a graph showing current-voltage characteristics of a bidirectional diode.

Furthermore, by using a variable load resistor 5A shown in FIGS. 26A and 5B shown in FIG. 26B as the load resistor 5, it is possible to sufficiently prevent the diode from being broken and decrease an applied voltage to some degree.

As shown in FIG. 26A, the variable load resistor 5A includes resistors R1 and R2, and a switch connected in series with each of the resistors R1 and R2. Moreover, the series circuit of the resistor R1 and the switch and the series circuit of the resistor R2 and the switch are connected in parallel. Furthermore, the resistor R1 has a larger resistance value than the resistor R2.

In this case, the driving unit 210 connects the resistor R1 having the larger resistance value, in series with the variable resistance element 9 and the MSM diode 4 in the initialization step. In addition, the driving unit 210 connects the resistor R2 having the smaller resistance value, in series with the variable resistance element 9 and the MSM diode 4 at the time of the normal operation (the writing step, the erasing step, and the reading step).

For example, when the resistor R1 has a resistance value 5 kΩ and the resistor R2 has a resistance value of 1 kΩ, it is possible to prevent the diode from being broken at the time of the initialization step and cause the diode to operate with a write voltage of approximately −4.1 V and an erase voltage of 5.1 V at the time of the normal operation.

It is to be noted that the structure of the variable load resistor 5A is not limited to the above, and the variable resistance element may have a structure which allows a resistance value to be varied using resistance elements. Moreover, the driving unit 210 may substantially reduce the resistance value of the variable load resistor 5A to zero at the time of the normal operation.

Furthermore, the variable load resistor 5B may use an ON resistor of a transistor as shown in FIG. 26B. In this case, it is possible to adjust the resistance value of the variable load resistor 5A by varying a magnitude of a gate voltage of the transistor.

Specifically, the driving unit 210 increases the resistance value of the variable load resistor 5B by decreasing the gate voltage Vg in the initialization step. Moreover, at the time of the normal operation, the driving unit 210 decreases the resistance value of the variable load resistor 5B more than at the time of the initialization step by increasing the gate voltage Vg more than at the time of the initialization step.

It is to be noted that the resistance value of the variable load resistor 5A and 5B may be the same in each of the writing step, the erasing step, and the reading step, or may differ in one or more of the steps.

Moreover, not a variable load resistor formed in an integrated circuit (a nonvolatile memory device) but the load resistor 5 outside of the integrated circuit may be used as shown in FIG. 16. In other words, an external device of the nonvolatile memory device may perform the initialization step, and apply an initialization voltage pulse to the series circuit in which the variable resistance element 9, the MSM diode 4, and the load resistor 5 are connected in series.

In this case, an initialization method according to this embodiment includes: connecting the variable resistance element 9 in an initial state and the MSM diode 4 in series with the load resistor 5; decreasing a resistance value of the variable resistance element by applying an initialization voltage pulse to a series circuit in which the MSM diode 4, the variable resistance element 9, and the load resistor 5 are connected in series; and removing the load resistor 5 from the variable resistance element 9 and the MSM diode 4 after the decreasing.

4.2 Operation of Nonvolatile Memory Device

The following separately describes an exemplary operation of the nonvolatile memory device 200 thus structured for each of the initialization mode, the writing mode, and the reading mode. It is to be noted that well-known methods can be used as a method for selecting a bit line BL and a word line WL and a method for applying a voltage pulse, and thus a detailed description thereof is omitted.

Hereinafter, a case where initialization, data writing, and data reading are performed on the memory cell MC22 is described as an example. Moreover, for the sake of brevity, positive and negative and a magnitude of a voltage are represented with reference to a voltage of the word line WL2, that is, a voltage of the first electrode 1 of the variable resistance element 9 of the memory cell MC22.

4.2.1 Initialization Step

In the initialization mode, the initialization step is executed either by applying a first initialization voltage pulse V0 and a second initialization voltage pulse V1 to the memory cells MC at once or by applying, to all the memory cells MC, the first initialization voltage pulse V0 and the second initialization voltage pulse V1 one after another in a sequential order.

In the initialization step, for instance, the word line driver 207 grounds each word line WL, and the bit line driver 205 electrically connects each bit line BL and the control unit 203. Then, the control unit 203 applies the first initialization voltage pulse V0 to each bit line BL. Here, the first initialization voltage pulse V0 applied to the memory cells MC has a voltage value of −7.0 V and a pulse width of 500 ns, for example.

Through the above operation, the first initialization voltage pulse V0 having the negative polarity is applied to all the memory cells MC at once or sequentially, and the resistance values of all the memory cells MC decrease from an initial resistance value R0 to a low resistance state value RL.

Next, for instance, the bit line driver 205 grounds each bit line BL, and the word line driver 207 electrically connects each word line WL and the control unit 203. Then, the control unit 203 applies the second initialization voltage pulse V1 to each word line BL. Here, the second initialization voltage pulse V1 applied to the memory cells MC has a voltage value of +7.5 V and a pulse width of 500 ns, for example.

Through the above operation, the second initialization voltage pulse V1 having the positive polarity is applied to all the memory cells MC at once or sequentially, and the resistance values of all the memory cells MC increase from the low resistance state value RL to a high resistance state value RH.

Although an initialization current higher than a breakdown current when the MSM diode 4 is stand-alone is required in the initialization step, it is possible to increase greatly the breakdown current by connecting the load resistor 5 to the MSM diode 4 to form the current steering element 10. With this, the initialization can be performed without breaking the MSM diode 4.

4.2.2 Writing Step

In the low resistance writing mode (the "1" writing mode), the writing step is executed.

In the writing step, for instance, the word line driver 207 grounds the word line WL2, and the bit line driver 205 electrically connects the bit line BL2 and the control unit 203. Then, the control unit 203 applies a write voltage pulse Vw to the bit line BL2. Here, the write voltage pulse Vw applied to the memory cell M22 has a voltage value of −4.5 V and a pulse width of 500 ns, for example.

Through the above operation, the write voltage pulse Vw having the negative polarity is applied to the memory cell MC22, and thus the memory cell MC22 changes to a low resistance state RL corresponding to the data "1."

4.2.3 Erasing Step

In the high resistance writing mode (the "0" writing mode), the erasing step is executed.

In the erasing step, for instance, the bit line driver 205 grounds the bit line BL2, and the word line driver 207 electrically connects the word line WL2 and the control unit 203. Then, the control unit 203 applies an erase voltage pulse Ve to the word line WL2. Here, the erase voltage pulse Ve applied to the memory cell MC22 has a voltage value of +5.5 V and a pulse width of 500 ns, for example.

Through the above operation, the erase voltage pulse Ve having the positive polarity is applied to the memory cell MC22, and thus the memory cell MC22 changes to a high resistance state RH corresponding to "0."

4.2.4 Reading Mode

In the reading mode, for instance, the bit line driver 205 grounds the bit line BL2, and the word line driver 207 electrically connects the word line WL2 and the control unit 203. Then, the control unit 203 applies a read voltage Vr to the word line WL2. Here, the read voltage Vr applied to the memory cell MC22 has a voltage value of +3.0 V.

When the read voltage Vr is applied to the memory cell MC22, a current having a magnitude corresponding to a resistance value of the memory cell MC22 flows between the bit line BL2 and the word line WL2. The bit line driver 205 measures this current, and provides a signal IRED representing the measured current value to the control unit 203.

The control unit 203 calculates a resistance state of the memory cell MC22 from the current value represented by the signal IREAD and the voltage value of the read voltage Vr. When the memory cell MC22 is in the low resistance state, it is clear that data written to the memory cell MC22 is "1." In contrast, when the memory cell MC22 is in the high resistance state, it is clear that data written to the memory cell MC22 is "0."

As stated, in the nonvolatile memory device 200, the current steering element 10 includes the MSM diode 4 and the load resistor 5 that are connected in series in the initialization step in the initialization mode. With this, the nonvolatile memory device 200 is capable of greatly decreasing the breakdown current of the MSM diode 4, thereby reducing the risk that the MSM diode 4 is broken.

It is to be noted that although the configuration in which the one of the bit line BL and the word line WL is grounded, and the predetermined voltage pulse is applied to the other of the bit line BL and the word line WL is described above, different voltage pulses may be applied to the bit line BL and the word WL, to cause the potential difference to be a predetermined voltage.

In addition, although the exemplary operation in each mode and circuit configuration are described above, the present invention is not limited to such an operation and circuit configuration.

Although the method for programming a nonvolatile memory element, the method for initializing the nonvolatile memory element, and the nonvolatile memory device according to this embodiment of the present invention are described, the present invention is not limited to the embodiment.

For instance, although the example where the MSM diode is used as the bidirectional diode is described above, another element may be used. For example, an MIM diode or a varistor may be used as the bidirectional diode. However, the MSM diode is suitable from the point of view the reproducibility of electrical characteristics, reliability of operation, and operating characteristics.

Moreover, each processing unit included in the nonvolatile memory device according to this embodiment is typically implemented as an LSI, an integrated circuit. These LSIs may be integrated into individual chips, or into a single chip so as to include part or all of the LSIs.

Moreover, ways to achieve integration is not limited to the LSI, and a special circuit or a general purpose processor can achieve the integration. Field Programmable Gate Array (FPGA) that can be programmed after manufacturing LSIs or a reconfigurable processor that allows re-configuration of the connection or configuration of an LSI can be used for the same purpose.

Moreover, although the corners and sides of each structural element are linearly illustrated in the cross-sectional views or the like, structural elements having round corners and sides due to manufacturing reasons are included in the present invention.

Moreover, at least part of the functions of the method for programming a nonvolatile memory element and the nonvolatile memory device according to Embodiments 1 and 2 and the modifications thereof may be combined.

Moreover, all the numbers used above are exemplified for specifically describing the embodiments of the present invention, and the present invention is not limited to the exemplified numbers. Furthermore, logic levels represented by high/low or switching states represented by On/Off are exemplified for specifically describing the embodiments of the present invention, and it is also possible to obtain the same result with a different combination of the exemplified logic levels or switching states. Moreover, the n-type, the p-type, or the like of the transistors and so on are exemplified for specifically describing the embodiments of the present invention, and it is also possible to obtain the same result by reversing these. Moreover, all the materials of the above structural elements are exemplified for specifically describing the embodiments of the present invention, and the present invention is not limited to the exemplified materials. Moreover, the connection relationships between the structural elements are exemplified for specifically describing the embodiments of the present invention, and connection relationships which achieve the functions of the present invention are not limited to those.

Furthermore, those skilled in the art will readily appreciate that many modifications are possible in the exemplary embodiments without materially departing from the spirit of the present invention. Accordingly, all such modifications are intended to be included within the scope of the present invention.

INDUSTRIAL APPLICABILITY

The present invention is applicable to a method for programming a nonvolatile memory element, and a nonvolatile memory device. In addition, the present invention can be used for any electronic device using the method for programming a nonvolatile memory element or the nonvolatile memory device, such as personal computers and cellular phones.

REFERENCE SIGNS LIST

1 First electrode
2 Second electrode
3 Variable resistance layer
3a First oxide layer
3b Second oxide layer
4 MSM diode
5, Rx1, Rx2, Rx3 Load resistor (load resistance layer)
5A Variable load resistor
6 Third electrode
7 Fourth electrode
8 Semiconductor layer
9 Variable resistance element
10 Current steering element
11a, 11b Metal pad
12a, 12b Metal line
20 Measuring device
21a, 21b Probe needle
22 Voltage measuring device
23 Substrate
100, 100A, 1006, 100C, 100D Nonvolatile memory element
103a, 103b, 103c, 303, 703a, 703b, 703c, 703d Lower electrode
104a, 104b, 104c, 304, 704a, 704b First tantalum oxide layer
105a, 105b, 105c, 305, 705a, 705b Second tantalum oxide layer
107a, 107b, 107c, 309, 709a, 709b, 709c, 709d Upper electrode
108a, 108b, 108c Conductor layer
200, 200A, 200B Nonvolatile memory device
201 Memory cell array
202 Address buffer
203 Control unit
204 Column decoder
205 Bit line driver
206 Row decoder
207 Word line driver
210 Driving unit
706c, 706d Oxygen-deficient hafnium oxide layer
WL, WL1, WL2, WL3 Word line
BL, BL1, BL2, BL3 Bit line
MC, MC11, MC12, MC13, MC21, MC22, MC23, MC31, MC32, MC33, MCA, MC11A, MC12A, MC13A, MC21A, MC22A, MC23A, MC31A, MC32A, MC33A Memory cell

The invention claimed is:

1. A method for programming a nonvolatile memory element which includes a variable resistance element that is nonvolatile and a bidirectional diode that is connected in series with the variable resistance element,
wherein the nonvolatile memory element further includes a load resistor which is connected in series with the variable resistance element and whose resistance value can be changed, and
the variable resistance element includes: a first transition metal oxide layer comprising a first transition metal; and a second transition metal oxide layer comprising a second transition metal and having a lower degree of oxygen deficiency than the first transition metal oxide layer,
the method comprising:
decreasing a resistance value of the variable resistance element to be lower than a resistance value of the variable resistance element in an initial state, by applying an initialization voltage pulse to a series circuit in which the variable resistance element, the bidirectional diode, and the load resistor are connected in series, the resistance value of the variable resistance element in the initial state being higher than a resistance value of the variable resistance element in a high resistance state, and the load resistor having a first resistance value;
causing, after the decreasing, the variable resistance element to change from the high resistance state to a low resistance state in which the resistance value of the variable resistance element is lower than the resistance value of the variable resistance element in the high resistance state, by applying a write voltage pulse to the series circuit after a resistance value of the load resistor is changed to a second resistance value lower than the first resistance value, the write voltage pulse having a first polarity; and
causing, after the decreasing, the variable resistance element to change from the low resistance state to the high resistance state by applying an erase voltage pulse to the series circuit after a resistance value of the load resistor is changed to a third resistance value lower than the first resistance value, the erase voltage pulse having a second polarity opposite to the first polarity,
wherein in the decreasing, a divided voltage applied to the load resistor varies according to a current flowing through the bidirectional diode.

2. The method for programming a nonvolatile memory element according to claim 1,
wherein the bidirectional diode is a metal-semiconductor-metal (MSM) diode.

3. The method for programming a nonvolatile memory element according to claim 2,
wherein the MSM diode includes:
a first electrode and a second electrode; and
a semiconductor layer which comprises silicon nitride having a composition expressed as $SiN_z$ where $0<z\leq 0.7$, is disposed between the first electrode and the second electrode, and forms a Schottky junction with each of the first electrode and the second electrode.

4. The method for programming a nonvolatile memory element according to claim 1,
wherein when a voltage is applied to both ends of a current steering element to pass the current, a breakdown current of the current steering element has a current density of 700 $\mu A/\mu m^2$ or more, the current steering element including series connection of the load resistor and the bidirectional diode.

5. The method for programming a nonvolatile memory element according to claim 1,
wherein when a voltage is applied to both ends of a current steering element to pass the current, the divided voltage applied to the load resistor is 70 mV or higher, the current steering element including series connection of the load resistor and the bidirectional diode.

6. The method for programming a nonvolatile memory element according to claim 1,
wherein the load resistor is 100Ω or more.

7. The method for programming a nonvolatile memory element according to claim 1,
wherein the first transition metal oxide layer comprises a tantalum oxide having a composition expressed as $TaO_x$ where $0.8\leq x\leq 1.9$, and the second transition metal oxide layer comprises a tantalum oxide having a composition expressed as $TaO_y$, where $2.1 \leq y$.

8. The method for programming a nonvolatile memory element according to claim 1,
wherein the first transition metal comprised in the first transition metal oxide layer has a higher standard electrode potential than the second transition metal comprised in the second transition metal oxide layer.

9. The method for programming a nonvolatile memory element according to claim 1,
wherein the first transition metal and the second transition metal are different transition metals.

10. The method for programming a nonvolatile memory element according to claim 1,
wherein the load resistor is provided for each of a plurality of the nonvolatile memory elements arranged in a matrix.

11. The method for programming a nonvolatile memory element according to claim 1,
wherein the load resistor is provided for each row or column of a plurality of the nonvolatile memory elements arranged in a matrix.

12. The method for programming a nonvolatile memory element according to claim 1,
wherein the bidirectional diode has a breakdown current which varies according to the resistance value of the load resistor.

13. The method for programming a nonvolatile memory element according to claim 1,
wherein the series connection of the load resistor with the variable resistance element reduces a breakdown current of the bidirectional diode in the initial state.

14. The method for programming a nonvolatile memory element according to claim 1,
wherein use of the load resistor prevents the bidirectional diode from being broken in the initial state.

15. The method for programming a nonvolatile memory element according to claim 1,
wherein initialization of the nonvolatile memory element in the initial state can be performed without breaking the bidirectional diode.

16. A method for initializing a nonvolatile memory element which allows, for the nonvolatile memory element including a variable resistance element that is nonvolatile and a bidirectional diode that is connected in series with the variable resistance element, the variable resistance element to reversibly change between a high resistance state and a low resistance state in which a resistance value of the variable resistance element is lower than a resistance value of the variable resistance element in the high resistance state, the variable resistance element being in an initial state in which a resistance value of the variable resistance element is higher than the resistance value of the variable resistance element in the high resistance state,
wherein the variable resistance element includes: a first transition metal oxide layer comprising a first transition metal; and a second transition metal oxide layer comprising a second transition metal and having a lower degree of oxygen deficiency than the first transition metal oxide layer,
the method comprising:
connecting a load resistor in series with the variable resistance element in the initial state and the bidirectional diode;
decreasing a resistance value of the variable resistance element to be lower than the resistance value of the variable resistance element in the initial state by applying an initialization voltage pulse to a series circuit in which the bidirectional diode, the variable resistance element, and the load resistor are connected in series; and
removing the load resistor from the bidirectional diode and the variable resistance element after the decreasing,
wherein in the decreasing, a divided voltage applied to the load resistor varies according to a current flowing through the bidirectional diode.

17. The nonvolatile memory device according to claim 16,
wherein the bidirectional diode has a breakdown current which varies according to the resistance value of the load resistor.

* * * * *